US011315838B2

(12) United States Patent
Lin et al.

(10) Patent No.: US 11,315,838 B2
(45) Date of Patent: Apr. 26, 2022

(54) FINFET DEVICE AND METHOD OF FORMING SAME

(71) Applicant: Taiwan Semiconductor Manufacturing Company, Ltd., Hsinchu (TW)

(72) Inventors: Chien Lin, Hsinchu (TW); Kun-Yu Lee, Tianan (TW); Shahaji B. More, Hsinchu (TW); Cheng-Han Lee, New Taipei (TW); Shih-Chieh Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/429,262

(22) Filed: Jun. 3, 2019

(65) Prior Publication Data
US 2020/0105619 A1 Apr. 2, 2020

Related U.S. Application Data

(60) Provisional application No. 62/738,851, filed on Sep. 28, 2018.

(51) Int. Cl.
*H01L 21/8238* (2006.01)
*H01L 29/78* (2006.01)
(Continued)

(52) U.S. Cl.
CPC .. *H01L 21/823821* (2013.01); *H01L 21/3065* (2013.01); *H01L 21/3086* (2013.01);
(Continued)

(58) Field of Classification Search
CPC ............. H01L 29/66795; H01L 29/785; H01L 29/66545; H01L 29/045; H01L 29/0649;
(Continued)

(56) References Cited

U.S. PATENT DOCUMENTS

| 2007/0004123 A1 | 1/2007 | Bohr et al. | |
| 2012/0012932 A1* | 1/2012 | Perng | ..................... H01L 29/165 |
| | | | 257/347 |

(Continued)

FOREIGN PATENT DOCUMENTS

| KR | 20160035650 A | 4/2016 |
| KR | 20170043900 A | 4/2017 |
| TW | 201820540 A | 6/2018 |

*Primary Examiner* — Vongsavanh Sengdara
(74) *Attorney, Agent, or Firm* — Slater Matsil, LLP

(57) ABSTRACT

A method for forming a semiconductor device includes patterning a substrate to form a strip including a first semiconductor material, forming an isolation region along a sidewall of the strip, an upper portion of the strip extending above the isolation region, forming a dummy structure along sidewalls and a top surface of the upper portion of the strip, performing a first etching process on an exposed portion of the upper portion of the strip to form a first recess, the exposed portion of the strip being exposed by the dummy structure, after performing the first etching process, reshaping the first recess to have a V-shaped bottom surface using a second etching process, wherein the second etching process is selective to first crystalline planes having a first orientation relative to second crystalline planes having a second orientation, and epitaxially growing a source/drain region in the reshaped first recess.

20 Claims, 48 Drawing Sheets

(51) Int. Cl.
*H01L 29/06* (2006.01)
*H01L 29/66* (2006.01)
*H01L 27/092* (2006.01)
*H01L 21/3065* (2006.01)
*H01L 21/308* (2006.01)
*H01L 29/04* (2006.01)

(52) U.S. Cl.
CPC .............. *H01L 21/823828* (2013.01); *H01L 21/823878* (2013.01); *H01L 27/0924* (2013.01); *H01L 29/045* (2013.01); *H01L 29/0649* (2013.01); *H01L 29/66545* (2013.01); *H01L 29/66795* (2013.01); *H01L 29/785* (2013.01)

(58) Field of Classification Search
CPC ......... H01L 29/7848; H01L 21/823828; H01L 21/3065; H01L 21/823878; H01L 21/823821; H01L 21/3068; H01L 21/823814; H01L 27/0924
See application file for complete search history.

(56) References Cited

U.S. PATENT DOCUMENTS

| | | | |
|---|---|---|---|
| 2012/0241815 A1* | 9/2012 | Kim | H01L 29/165 257/190 |
| 2013/0248948 A1* | 9/2013 | Ma | H01L 29/66795 257/288 |
| 2016/0079062 A1* | 3/2016 | Zheng | H01L 21/02057 438/498 |
| 2016/0087104 A1 | 3/2016 | Lee et al. | |
| 2017/0069755 A1 | 3/2017 | Choi et al. | |
| 2017/0110327 A1 | 4/2017 | Kim et al. | |
| 2017/0256754 A1* | 9/2017 | DeFranco | H01L 51/5203 |

* cited by examiner

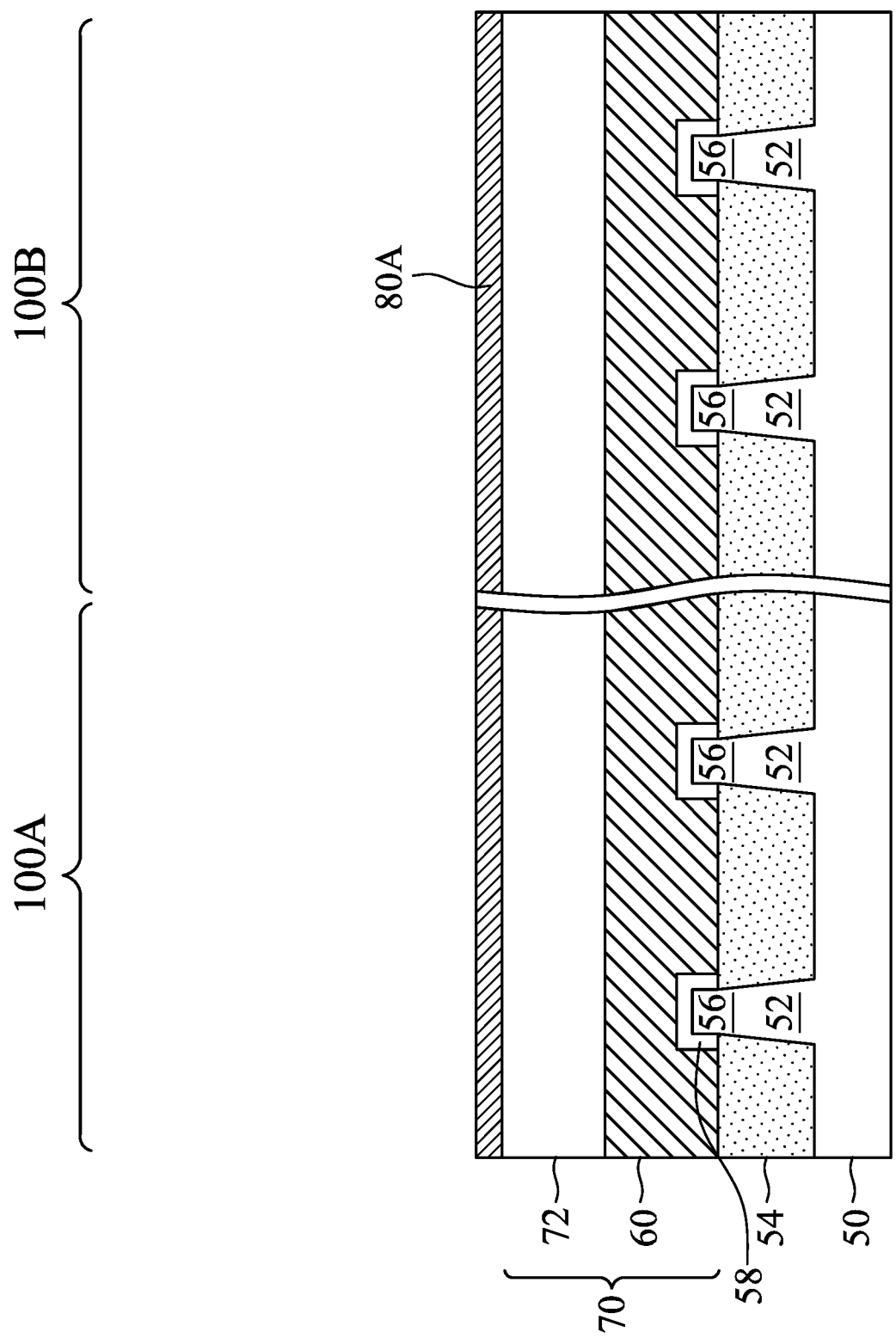

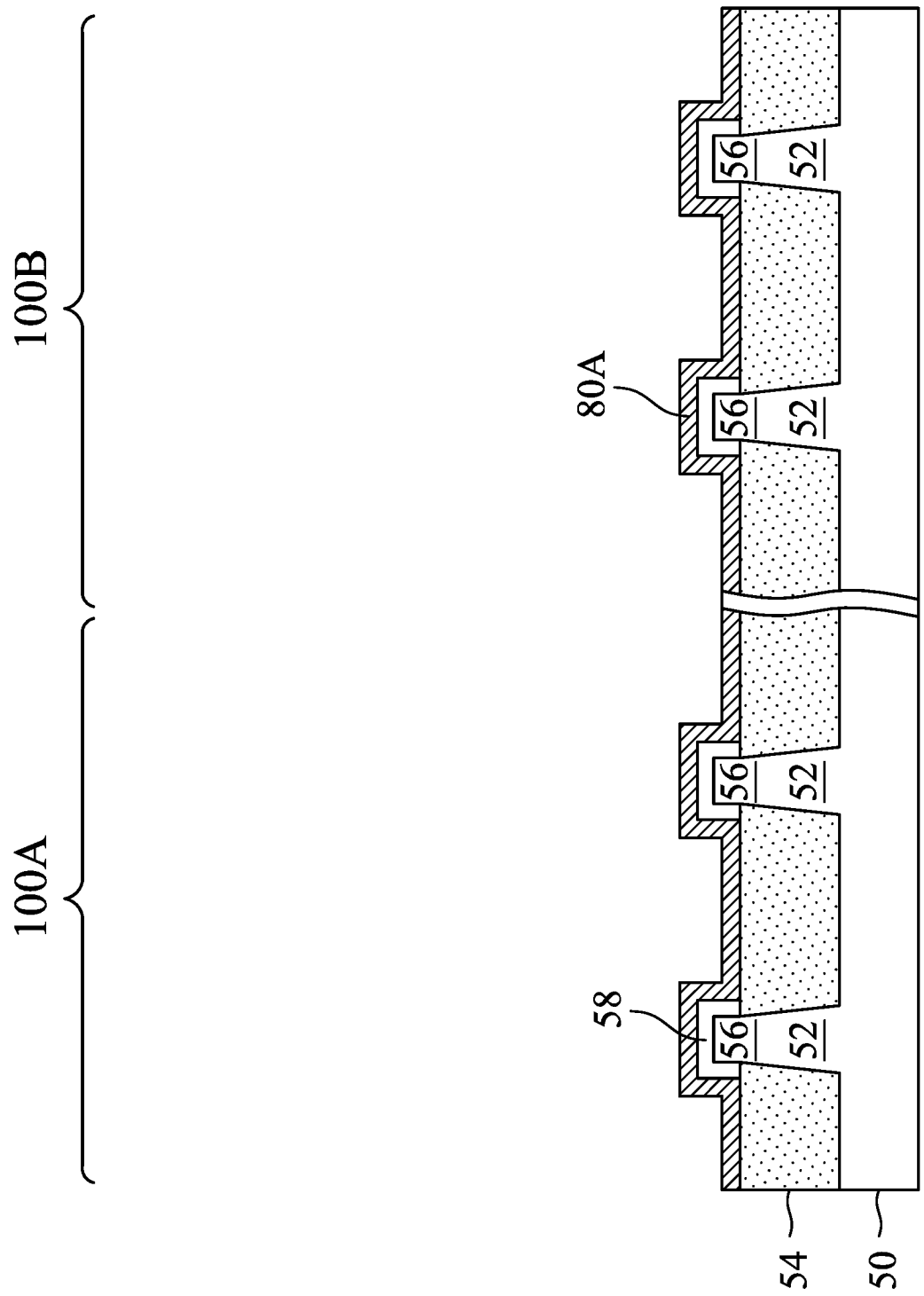

FINFET DEVICE AND METHOD OF FORMING SAME

PRIORITY

This application claims priority to U.S. Provisional Patent Application No. 62/738,851 filed Sep. 28, 2018, and entitled "FinFET Device and Method of Forming Same," which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A-8C are cross-sectional views of intermediate stages in the manufacture of a FinFET device in accordance with some embodiments.

DETAILED DESCRIPTION

Figure 1:
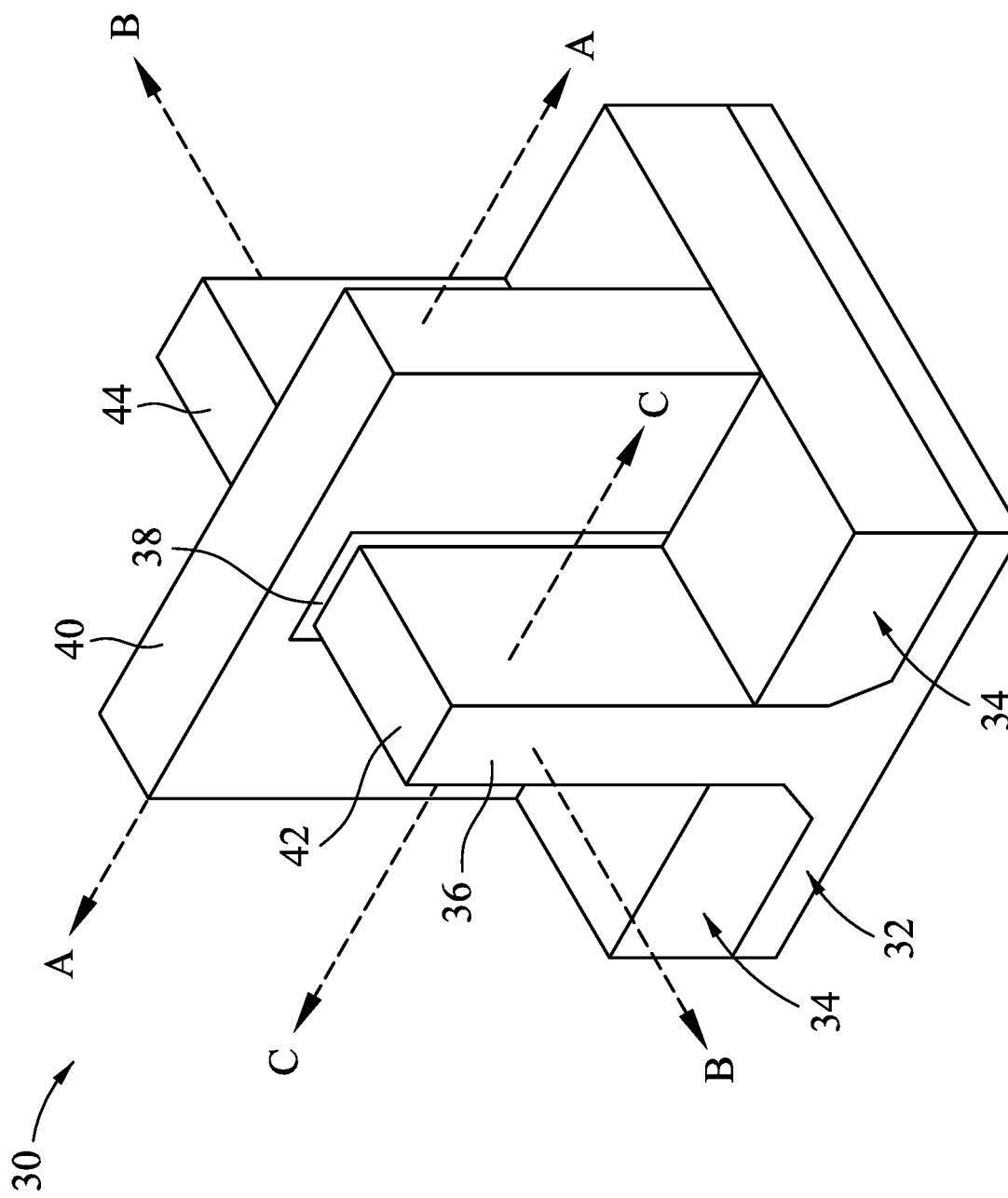
FIG. 1 is a perspective view of a fin field-effect transistor ("FinFET") device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a FinFET device and a method of forming the same. Various embodiments discussed herein allow for controlling the shape of the epitaxial source/drain region of a FinFET device, such that the bottom of the epitaxial source/drain region has a pointed shape defined by crystalline planes. By controlling the shape of the epitaxial source/drain region of a FinFET in this manner, the performance of the FinFET device may be improved. Various embodiments presented herein are discussed in the context of FinFETs formed using a gate-last process. In other embodiments, a gate-first process may be used. Some embodiments contemplate aspects used in planar devices, such as planar FETs. Some embodiments may also be used in semiconductor devices other than FETs.

FIG. 1 illustrates an example of a fin field-effect transistor (FinFET) 30 in a three-dimensional view. The FinFET 30 comprises a fin 36 on a substrate 32. The isolation regions 34 are disposed on the substrate 32 around fin 36, the fin 36 protruding above neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in subsequent figures. Cross-section A-A is across a channel, gate dielectric 38, and gate electrode 40 of the FinFET 30. Cross-section C-C is in a plane that is parallel to cross-section A-A and is across fin 36 outside of the channel. Cross-section B-B is perpendicular to cross-section A-A and is along a longitudinal axis of the fin 36 and in a direction of, for example, a current flow between the source/drain regions 42 and 44. Subsequent figures refer to these reference cross-sections for clarity.

FIGS. 2A through 22 are cross-sectional views of intermediate stages in the manufacturing of FinFETs in accordance with some embodiment. In FIGS. 2A through 11A-C and FIGS. 16A-C through 21A-C, figures ending with an "A" designation are illustrated along the reference cross-section A-A illustrated in FIG. 1, except for multiple FinFETs and multiple fins per FinFET. Figures ending with a "B" designation are illustrated along the reference cross-section B-B illustrated in FIG. 1. Figures ending with a "C" designation are illustrated along the cross-section C-C illustrated in FIG. 1. FIGS. 12-15C and 22 are all illustrated along the reference cross-section B-B illustrated in FIG. 1.

Figure 2A:
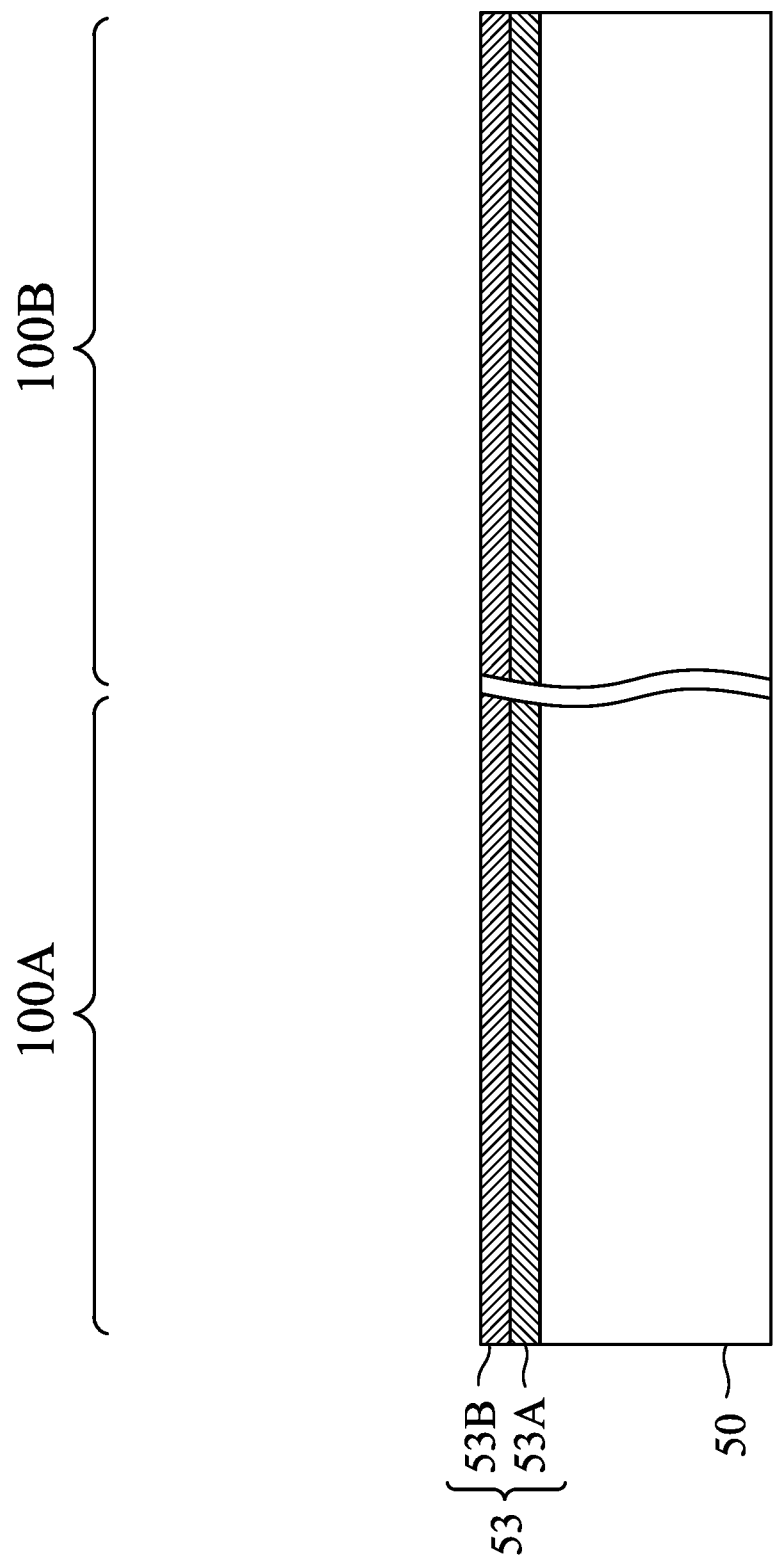
FIG. 2A is a cross-sectional view of an intermediate stage in the manufacture of a FinFET device in accordance with some embodiments.

FIG. 2A illustrates a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer, and may have a particular crystalline orientation, such as (100), (111), or (110). Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 may further include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the resulting FinFETs. The integrated circuit devices may be formed using any suitable methods.

In some embodiments, the substrate 50 may include a first region 100A and a second region 100B. The first region 100A can be for forming n-type devices, such as NMOS transistors, such as n-type FinFETs. The second region 100B can be for forming p-type devices, such as PMOS transistors, such as p-type FinFETs. Accordingly, the first region 100A may be also referred to as an NMOS region 100A, and the second region 100B may be also referred to as a PMOS region 100B. In some embodiments, the first region 100A may be physically separated from the second region 100B. The first region 100A may be separated from the second region 100B by any number of features.

FIG. 2A further illustrates the formation of a mask 53 over the substrate 50. In some embodiments, the mask 53 may be used in a subsequent etching step to pattern the substrate 50 (See FIG. 3A). As shown in FIG. 2A, the mask 53 may include a first mask layer 53A and a second mask layer 53B. The first mask layer 53A may be a hard mask layer, may include silicon nitride (SiN), silicon oxynitride (SiON), silicon carbide (SiC), silicon carbonitride (SiCN), a combination thereof, or the like, and may be formed using any suitable process, such as atomic layer deposition (ALD), physical vapor deposition (PVD), chemical vapor deposition (CVD), a combination thereof, or the like. The first mask layer 53A may also include multiple layers, and the multiple layers may be different materials. For example, the first mask layer 53A may include a layer of silicon nitride over a layer of silicon oxide, though other materials and combinations of materials may also be used. The second mask layer 53B may comprise photoresist, and in some embodiments, may be used to pattern the first mask layer 53A for use in the subsequent etching step discussed above. The second mask layer 53B may be formed by using a spin-on technique and may be patterned using acceptable photolithography techniques. In some embodiments, the mask 53 may include three or more mask layers.

Figure 3A:
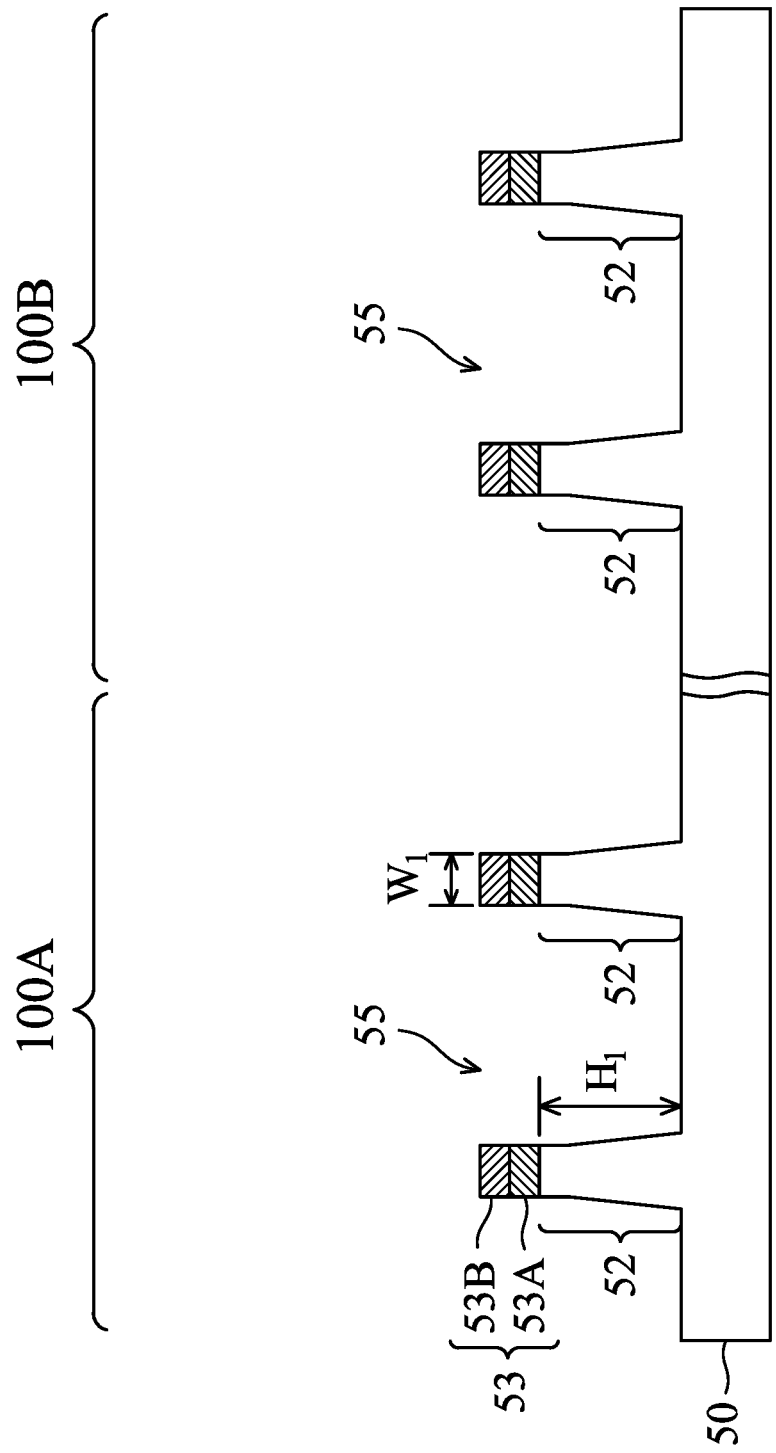
FIG. 3A is a cross-sectional view of an intermediate stage in the manufacture of a FinFET device in accordance with some embodiments.

FIG. 3A illustrates the formation of semiconductor strips 52 in the substrate 50. First, mask layers 53A and 53B may be patterned, where openings in mask layers 53A and 53B expose areas 55 of the substrate 50 where Shallow Trench Isolation (STI) regions 54 will be formed. Next, an etching process may be performed, where the etching process creates the trenches 55 in the substrate 50 through the openings in the mask 53. The remaining portions of the substrate 50 underlying a patterned mask 53 form a plurality of semiconductor strips 52. The etching may be any acceptable etch process, such as a reactive ion etch (RIE), neutral beam etch (NBE), the like, or a combination thereof. The etch process may be anisotropic. In some embodiments, the semiconductor strips 52 may have a height $H_1$ between about 200 nm and about 400 nm, and may have a width $W_1$ between about 10 nm and about 40 nm.

The semiconductor strips 52 may be patterned by any suitable method. For example, the semiconductor strips 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over substrate 50 and patterned using a photolithography process. Spacers may be formed alongside the patterned sacrificial layer using a self-aligned process. The sacrificial layer is then removed, and the remaining spacers, or mandrels, may then be used as a mask to pattern the semiconductor strips 52.

Figure 4A:
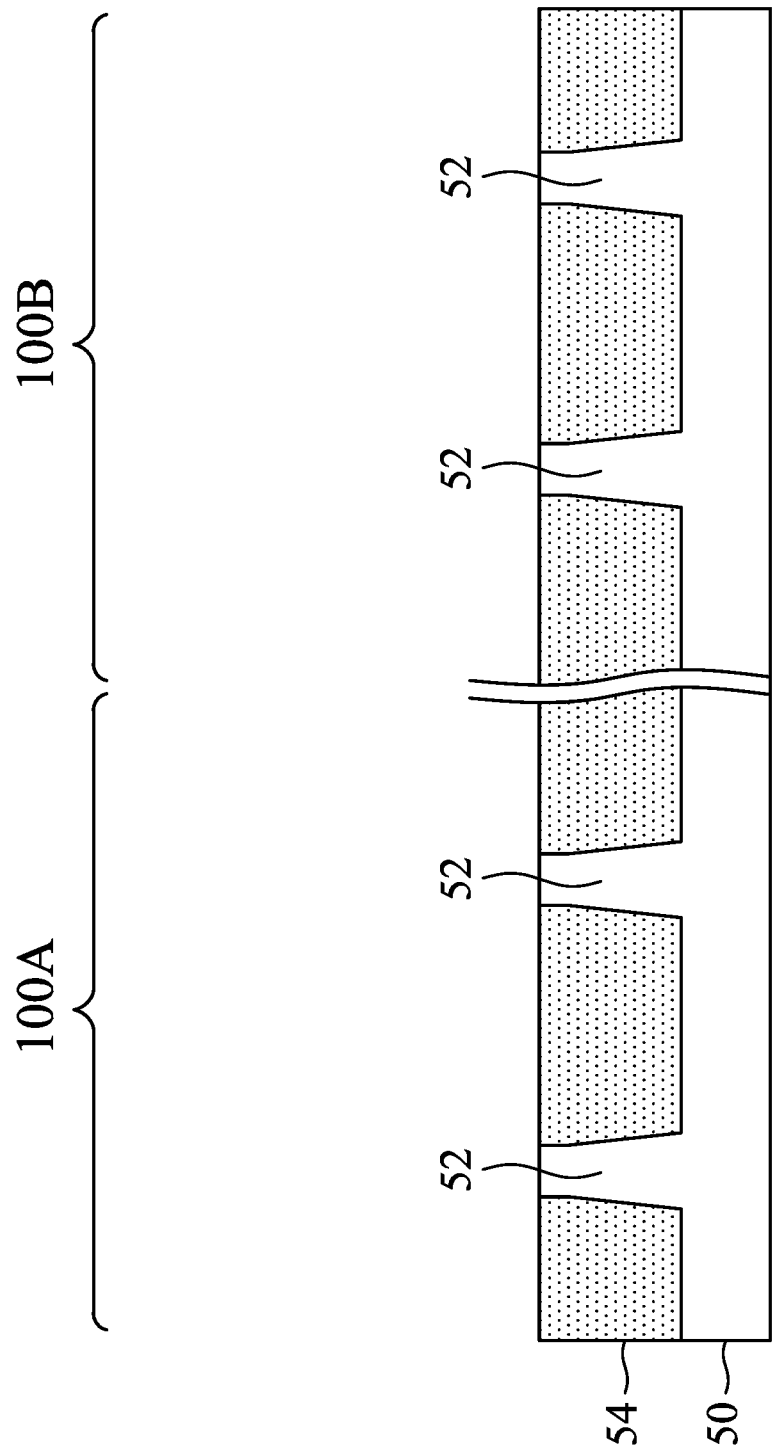
FIG. 4A is a cross-sectional view of an intermediate stage in the manufacture of a FinFET device in accordance with some embodiments.

FIG. 4A illustrates the formation of an insulation material in the trenches 55 (see FIG. 3A) between neighboring semiconductor strips 52 to form isolation regions 54. The insulation material may be an oxide, such as silicon oxide, a nitride, such as silicon nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable processes may be also used.

Furthermore, in some embodiments, the isolation regions 54 may include a conformal liner (not illustrated) formed on sidewalls and a bottom surface of the trenches 55 (see FIG. 3A) prior to the filling of the trenches 55 with an insulation material of the isolation regions 54. In some embodiments, the liner may comprise a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, or the like. The formation of the liner may include any suitable method, such as ALD, CVD, HDP-CVD, PVD, a combination thereof, or the like. In such embodiments, the liner may prevent (or at least reduce) the diffusion of the semiconductor material from the semiconductor strips 52 (e.g., Si and/or Ge) into the surrounding isolation regions 54 during the subsequent annealing of the isolation regions 54. For example, after the insulation material of the isolation regions 54 are deposited, an annealing process may be performed on the insulation material of the isolation regions 54.

Referring further to FIG. 4A, a planarization process, such as a chemical mechanical polishing (CMP), may remove any excess insulation material of the isolation regions 54, such that top surfaces of the isolation regions 54 and top surfaces of the semiconductor strips 52 are coplanar. In some embodiments, the CMP may also remove the mask 53. In other embodiments, the mask 53 may be removed using a wet etching process separate from the CMP.

Figure 5A:
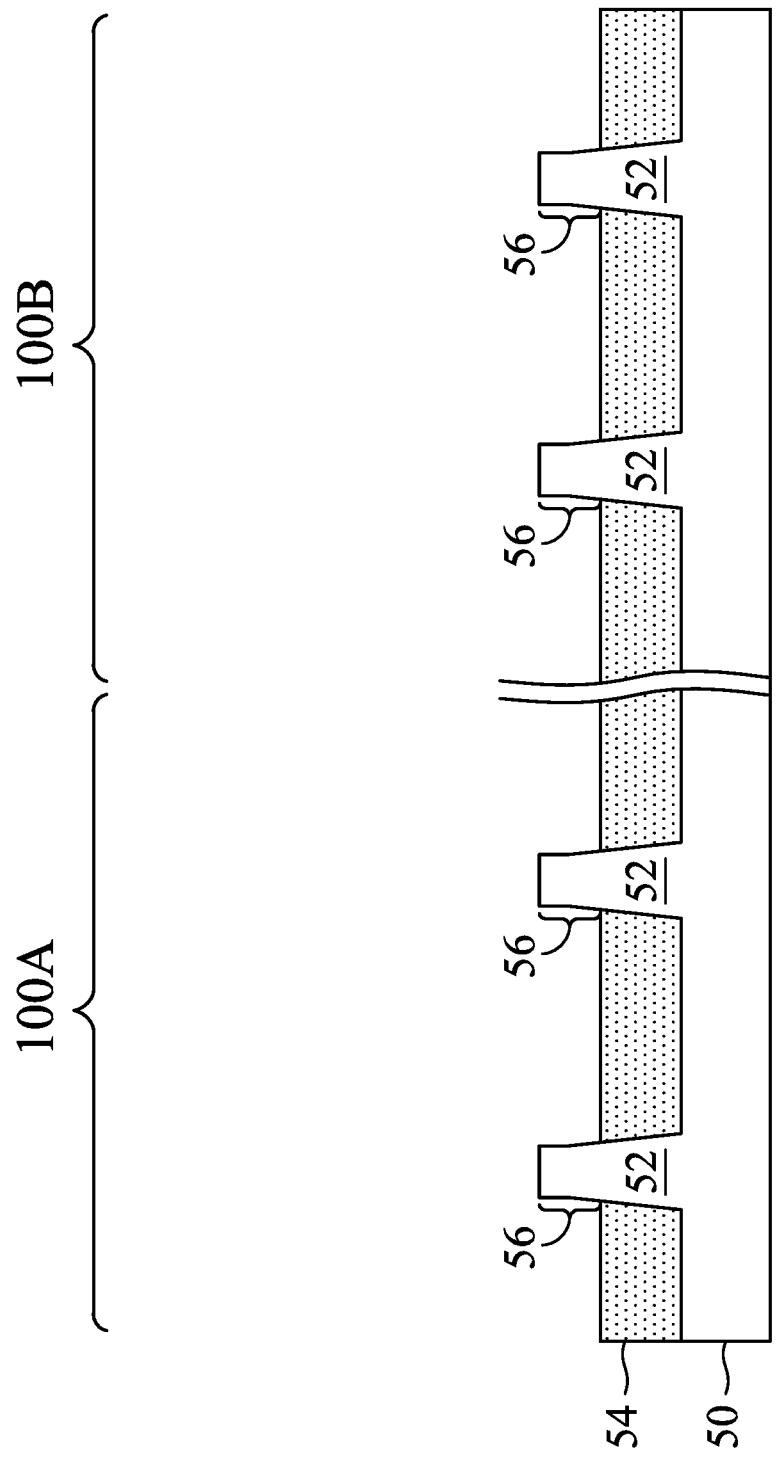
FIG. 5A is a cross-sectional view of an intermediate stage in the manufacture of a FinFET device in accordance with some embodiments.

FIG. 5A illustrates the recessing of the isolation regions 54 to form fins 56. The isolation regions 54 are recessed such that fins 56 in the first region 100A and in the second region 100B protrude from between neighboring isolation regions 54. In some embodiments, the semiconductor strips 52 may be considered to be part of the fins 56. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate process. The isolation regions 54 may be recessed using an acceptable etching process, such as one that is selective to the material of the isolation regions 54.

A person having ordinary skill in the art will readily understand that the process described with respect to FIGS. 2A through 5A is just one example of how the fins 56 may be formed. In other embodiments, a dielectric layer can be formed over a top surface of the substrate 50, trenches can be etched through the dielectric layer, homoepitaxial structures can be epitaxially grown in the trenches, and the dielectric layer can be recessed such that the homoepitaxial structures protrude from the dielectric layer to form fins. In yet other embodiments, heteroepitaxial structures can be used for the fins. For example, the semiconductor strips 52 in FIG. 4A can be recessed, and a material different from the semiconductor strips 52 may be epitaxially grown in their place. In even further embodiments, a dielectric layer can be formed over a top surface of the substrate 50, trenches can be etched through the dielectric layer, heteroepitaxial structures can be epitaxially grown in the trenches using a material different from the substrate 50, and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth. In other embodiments, homoepitaxial or heteroepitaxial structures may be doped using, for example, ion implantation after homoepitaxial or heteroepitaxial structures are epitaxially grown. Still further, it may be advantageous to epitaxially grow a material in the NMOS region 100A different from the material in the PMOS region 100B. In various embodiments, the fins 56 may include silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6A:
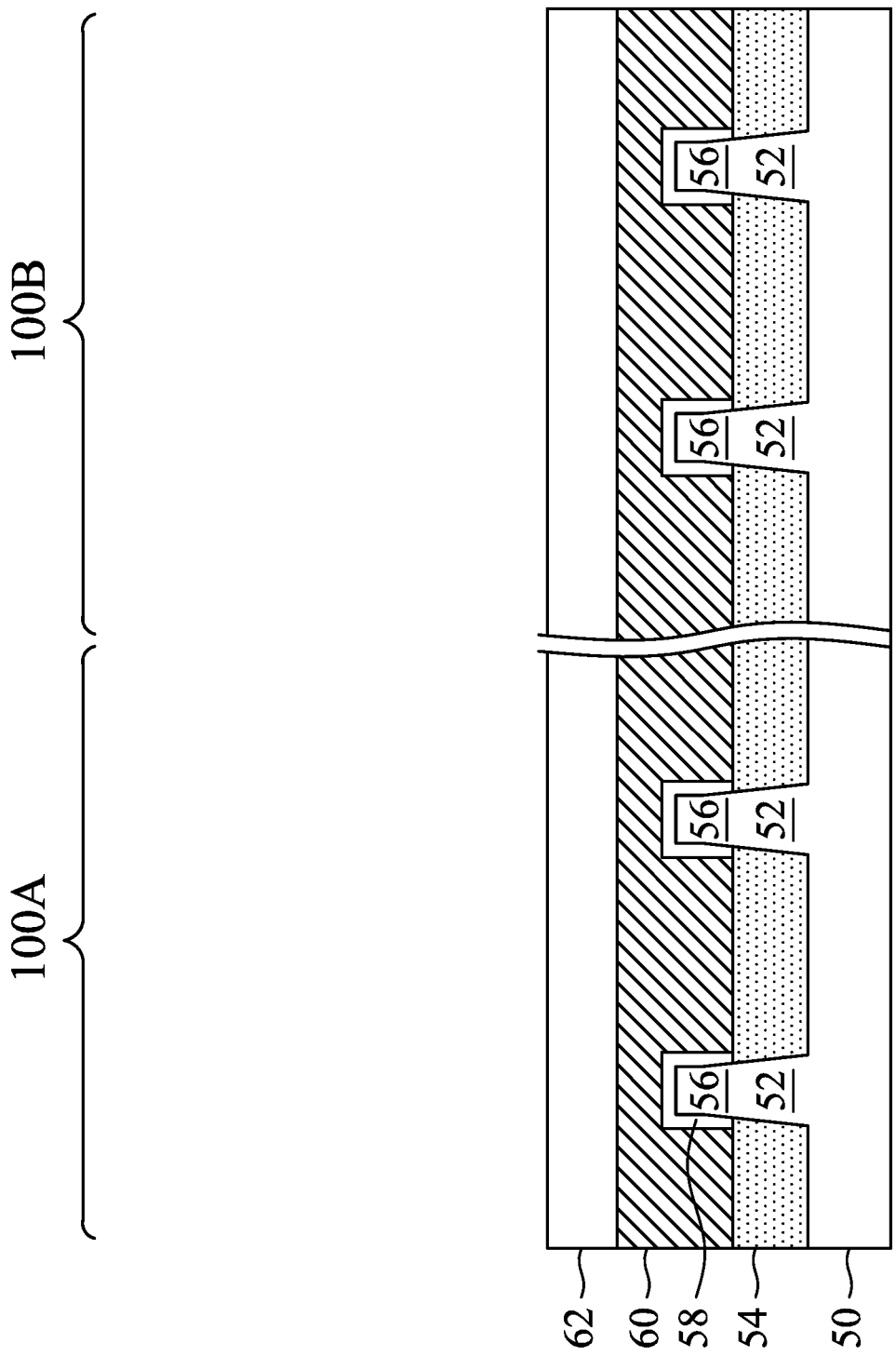
FIGS. 6A-6B are cross-sectional views of intermediate stages in the manufacture of a FinFET device in accordance with some embodiments.
Figure 6B:
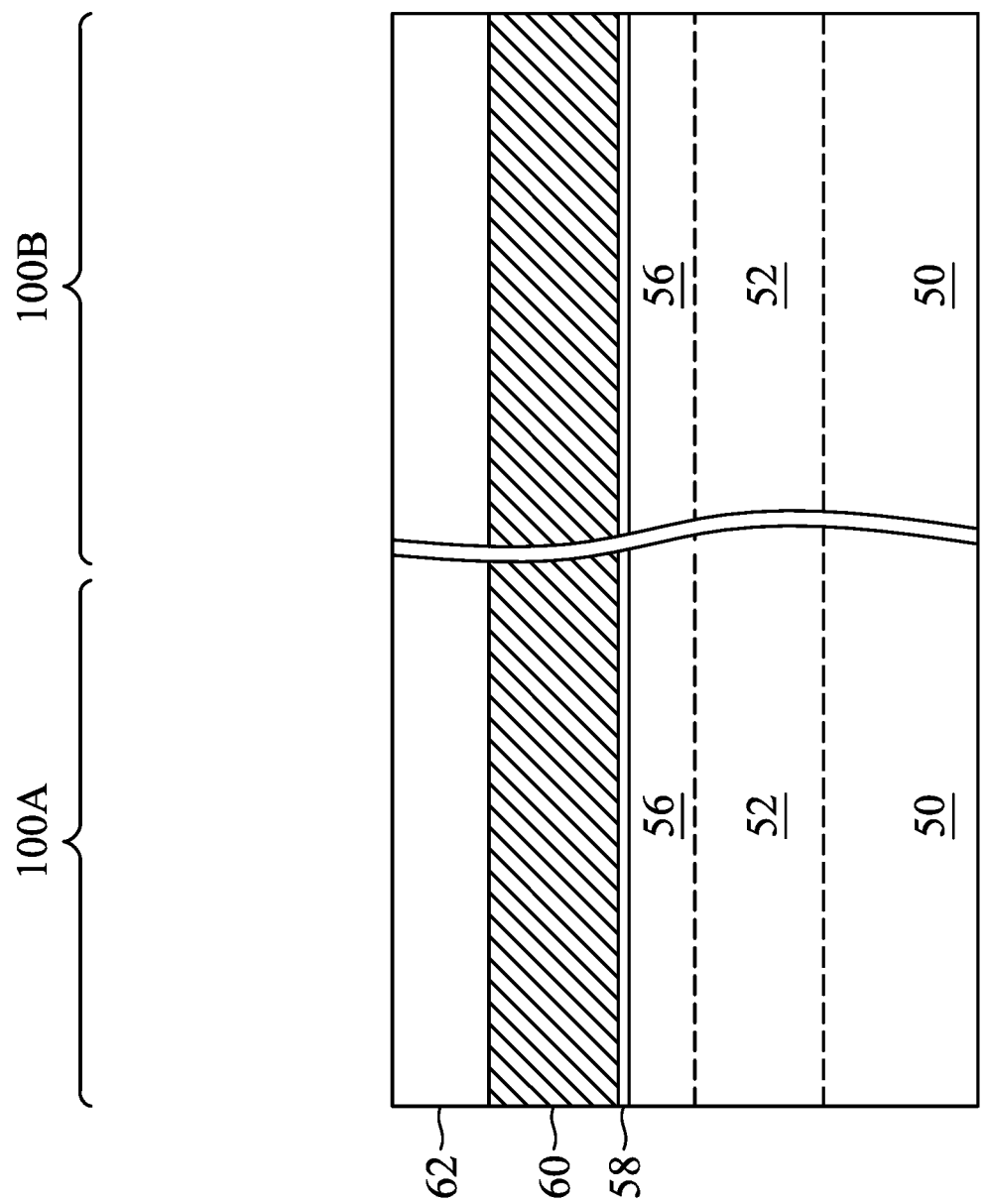

In FIGS. 6A-B, a dummy dielectric layer 58 is formed on the fins 56. The dummy dielectric layer 58 may be, for example, silicon oxide, silicon nitride, a combination thereof, or the like, and may be deposited (using, for example, CVD, PVD, a combination thereof, or the like) or thermally grown (for example, using thermal oxidation, or the like) according to acceptable techniques. A dummy gate layer 60 is formed over the dummy dielectric layer 58, and a mask 62 is formed over the dummy gate layer 60. In some embodiments, the dummy gate layer 60 may be deposited over the dummy dielectric layer 58 and then planarized using, for example, a CMP process. The mask 62 may be deposited over the dummy gate layer 60. The dummy gate layer 60 may be made of, for example, polysilicon, although other materials that have a high etching selectivity with respect to the material of the isolation regions 54 may also be used. The mask 62 may include one or more layers of, for example, silicon nitride, silicon oxynitride, silicon carbide, silicon carbonitride, the like, or a combination thereof.

Referring further to FIGS. 6A-B, in the illustrated embodiment, a single dummy dielectric layer 58, a single dummy gate layer 60, and a single mask 62 are formed across the first region 100A and the second region 100B. In other embodiments, separate dummy dielectric layers, separate dummy gate layers, and separate masks may be formed in the first region 100A and the second region 100B. In some embodiments, the dummy dielectric layer 58 may have a thickness between about 0.8 nm and about 2.0 nm, and the dummy gate layer 60 may have a thickness between about 50 nm and about 100 nm.

Figure 7A:
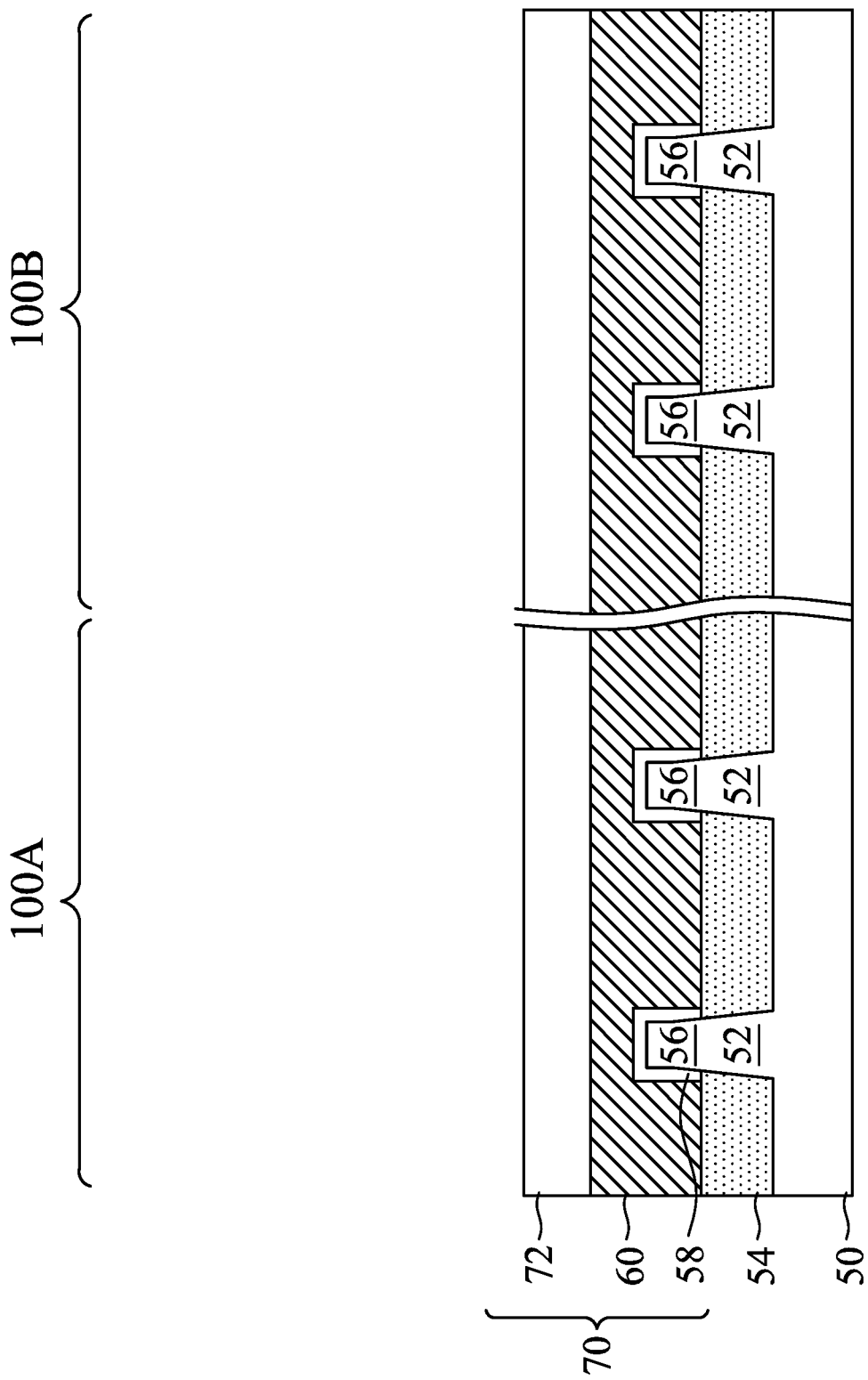
FIGS. 7A-7C are cross-sectional views of intermediate stages in the manufacture of a FinFET device in accordance with some embodiments.
Figure 7B:
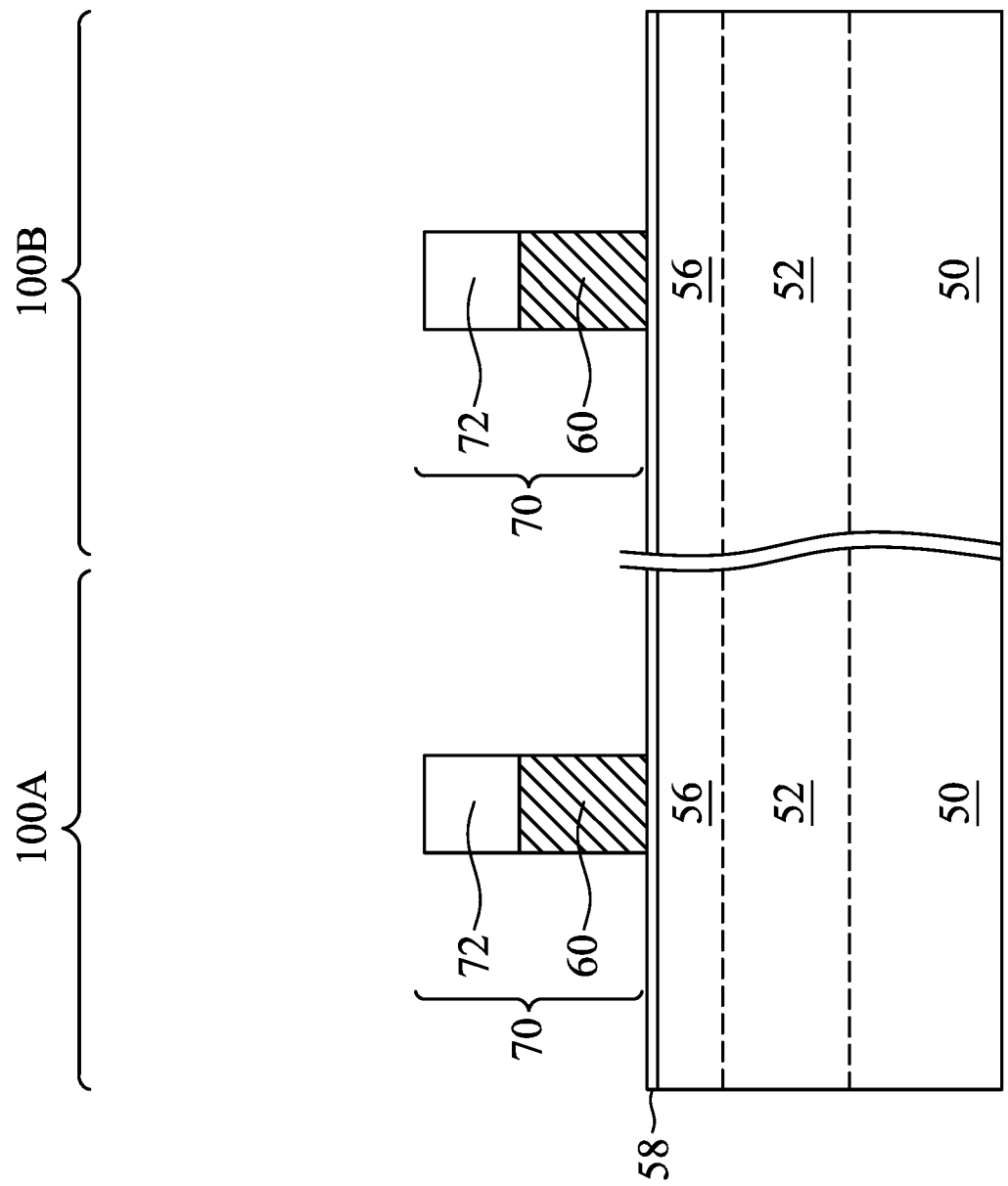
Figure 7C:
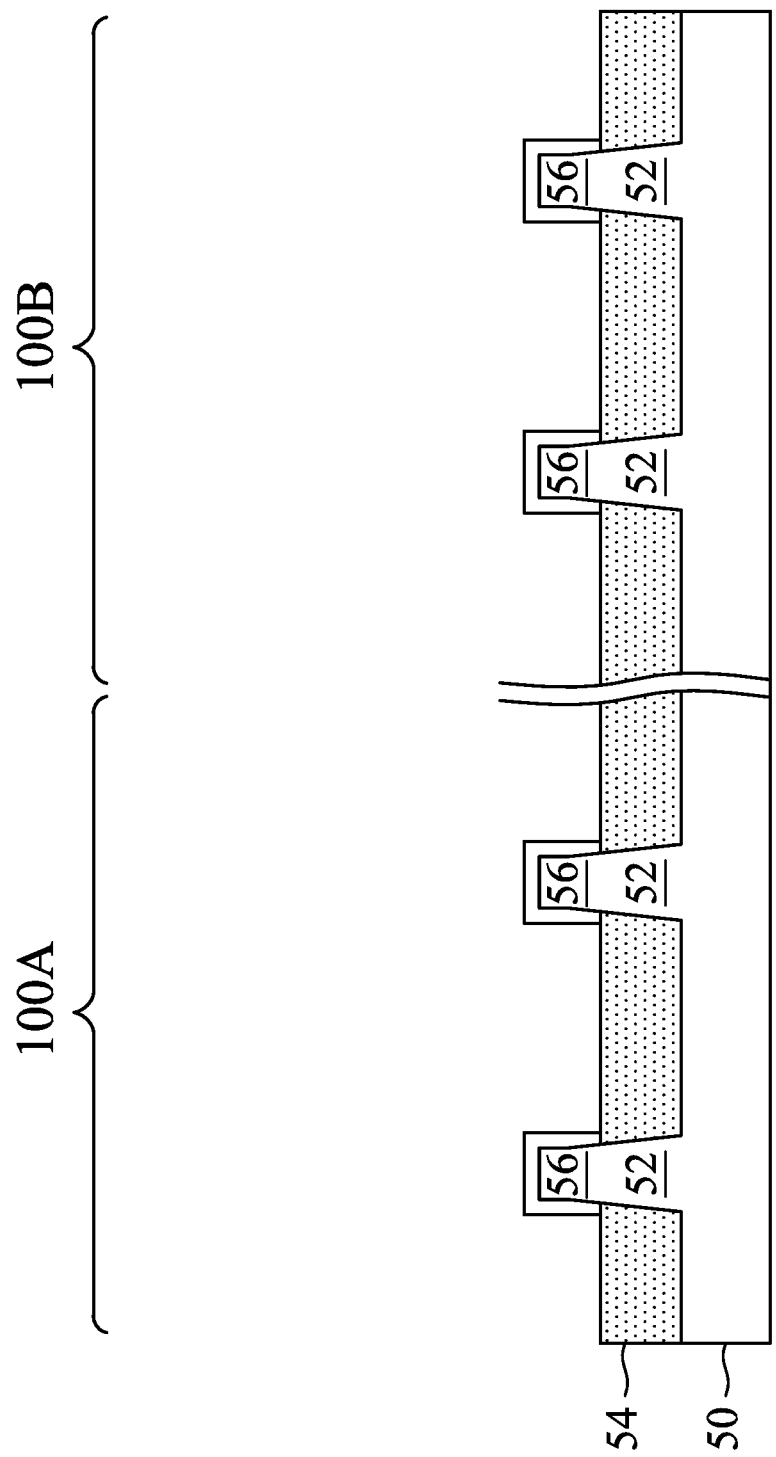

In FIGS. 7A-C, the mask 62 (see FIGS. 6A and 6B) may be patterned using acceptable photolithography and etching techniques to form a mask 72 in the first region 100A and in the second region 100B. The mask 72 may be a hardmask, and the pattern of the mask 72 may be different between the first region 100A and the second region 100B. The pattern of the mask 72 may be transferred to the dummy gate layer 60 by an acceptable etching technique in the first region 100A and in the second region 100B. For convenience, the dummy gate layer 60 and the mask 72 may be collectively referred to as the dummy structure 70. In some embodiments, the dummy gate layer 60 and the mask 72 are formed in separate processes in the first region 100A and the second region 100B, and may be formed of different materials in the first region 100A and the second region 100B. Optionally, the pattern of the mask 72 may similarly be transferred to dummy dielectric layer 58. The pattern of the dummy structure 70 covers respective channel regions of the fins 56 while exposing source/drain regions of the fins 56. The dummy structure 70 may also have a lengthwise direction substantially perpendicular to the lengthwise direction of respective fins 56. A size of the dummy structure 70 or a pitch between dummy structures 70 may depend on a region of a die in which the dummy gates are formed. In some embodiments, dummy structures 70 may have a larger size or a larger pitch when located in an input/output region of a die (e.g., where input/output circuitry is disposed) than when located in a logic region of a die (e.g., where logic circuitry is disposed). In some embodiments, the dummy structure 70 may have a width between about 15 nm and about 40 nm.

Referring further to FIGS. 7A-C, appropriate wells (not shown) may be formed in the fins 56, the semiconductor strips 52, and/or the substrate 50. For example, a P-well may be formed in the first region 100A, and an N-well may be formed in the second region 100B. The different implant steps for the different regions 100A and 100B may be achieved using a photoresist or other masks (not shown). For example, a photoresist is formed over the fins 56 and the isolation regions 54 in the first region 100A and the second region 100B. The photoresist is patterned to expose the second region 100B of the substrate 50, such as a PMOS region, while protecting the first region 100A, such as an NMOS region. The photoresist can be formed by using a spin-on technique and can be patterned using acceptable photolithography techniques. Once the photoresist is patterned, n-type impurities are implanted in the second region 100B, and the photoresist may act as a mask to substantially prevent n-type impurities from being implanted into the first region 100A. The n-type impurities may be phosphorus, arsenic, or the like, and may be implanted in the second region 100B to a concentration of equal to or less than $10^{18}$ $cm^{-3}$, such as in a range from about $10^{17}$ $cm^{-3}$ to about $10^{18}$ $cm^{-3}$. After the implantation process, the photoresist is removed using, for example, an acceptable ashing process followed by a wet cleaning process.

Following the implanting of the second region 100B, a second photoresist (not shown) is formed over the fins 56 and the isolation regions 54 in the first region 100A and the second region 100B. The second photoresist is patterned to expose the first region 100A of the substrate 50, while protecting the second region 100B. The second photoresist can be formed by using a spin-on technique and can be patterned using acceptable photolithography techniques. Once the second photoresist is patterned, p-type impurities are implanted in the first region 100A, and the second photoresist may act as a mask to substantially prevent p-type impurities from being implanted into the second region 100B. The p-type impurities may be boron, $BF_2$, or the like, and may be implanted in the first region 100A to a concentration of equal to or less than $10^{18}$ $cm^{-3}$, such as in a range from about $10^{17}$ $cm^{-3}$ to about $10^{18}$ $cm^{-3}$. After the implantation process, the second photoresist is removed using, for example, an acceptable ashing process followed by a wet cleaning process.

After implanting appropriate impurities in first region 100A and the second region 100B, an anneal may be performed to activate the p-type and n-type impurities that were implanted. The implantation process may form a P-well in the first region 100A, and an N-well in the second region 100B. In some embodiments where the fins are epitaxial grown, the grown materials of the fins 56 may be in situ doped during the growth process.

Figure 8B:
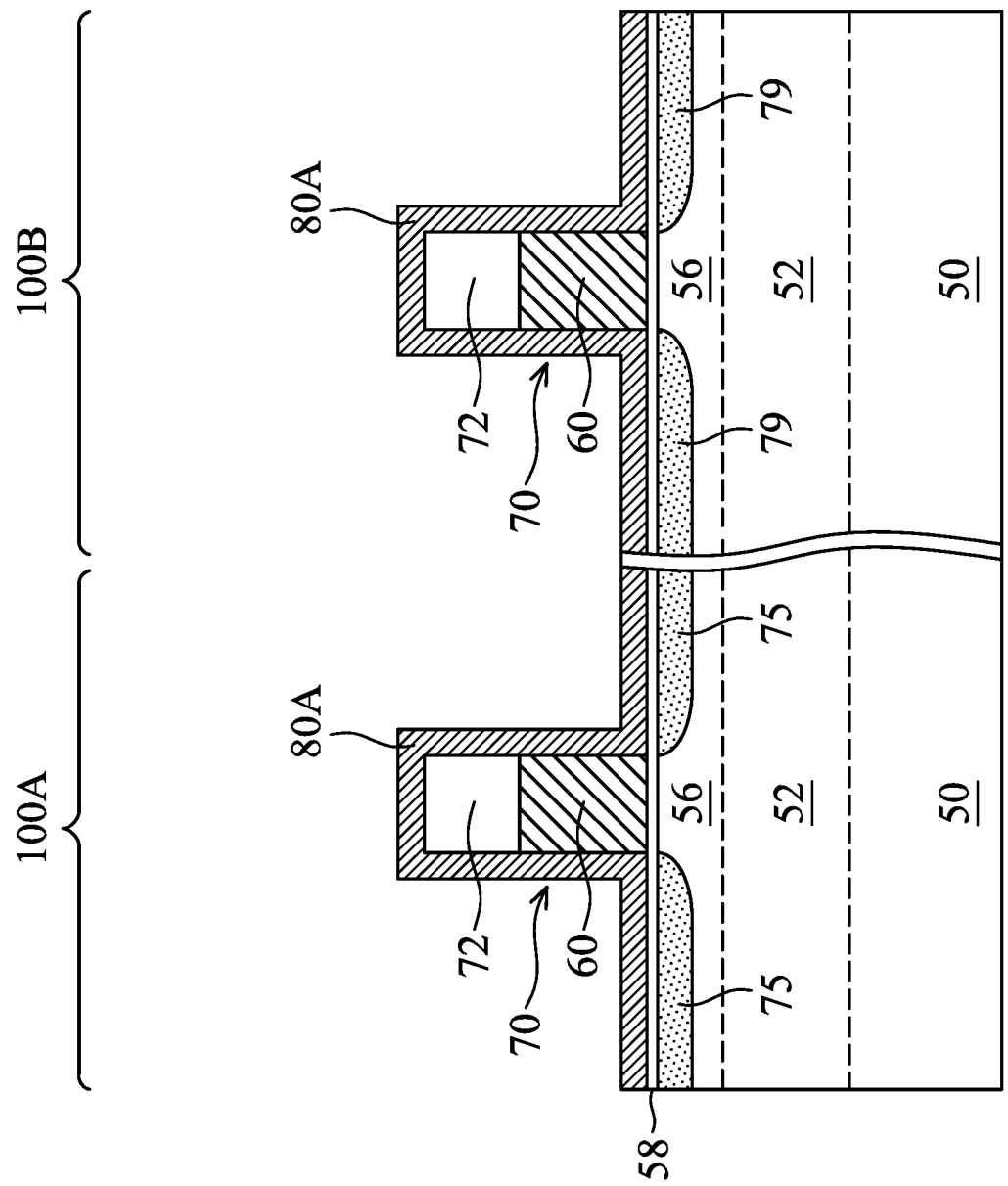

In FIGS. 8A-C, a first spacer layer 80A is formed on exposed surfaces of the dummy structure 70 (see FIGS. 8A and 8B) and/or the dummy dielectric layer 58 over the fins 56 (see FIG. 8C). Any suitable methods of forming the first spacer layer 80A may be used. In some embodiments, a deposition (such as CVD, ALD, or the like) may be used form the first spacer layer 80A. In some embodiments, the first spacer layer 80A may include one or more layers of, for example, silicon nitride (SiN), silicon oxynitride, silicon carbonitride, silicon oxycarbonitride (SiOCN), a combination thereof, or the like.

Referring further to FIGS. 8A-C, lightly doped source/drain (LDD) regions 75 and 79 may be formed in the substrate 50 in the first region 100A and the second region 100B, respectively. Similar to the implantation process discussed above with reference to FIGS. 7A-C, a mask (not shown), such as a photoresist, may be formed over the first region 100A, e.g., the NMOS region, while exposing the second region 100B, e.g., the PMOS region, and p-type impurities may be implanted into the exposed fins 56 in the second region 100B to create LDD regions 79. During the implantation of the LDD regions 79, the dummy structure 70 may act as a mask to prevent (or at least reduce) dopants from implanting into a channel region of the exposed fins 56. Thus, the LDD regions 79 may be formed substantially in source/drain regions of the exposed fins 56. The mask may then be removed. Subsequently, a second mask (not shown), such as a photoresist, may be formed over the second region 100B, while exposing the first region 100A, and n-type impurities may be implanted into the exposed fins 56 in the first region 100A to create LDD regions 75. During the implantation of the LDD regions 75, the dummy structure 70 may act as a mask to prevent (or at least reduce) dopants from implanting into a channel region of the exposed fins 56. Thus, the LDD regions 75 may be formed substantially in source/drain regions of the exposed fins 56. The second mask may then be removed. The n-type impurities may be any of the n-type impurities previously discussed, and the p-type impurities may be any of the p-type impurities previously discussed. The LDD regions 75 and 79 may each have a concentration of impurities from about $10^{15}$ $cm^{-3}$ to about $10^{16}$ $cm^{-3}$. An annealing process may be performed to activate the implanted impurities.

Figure 9A:
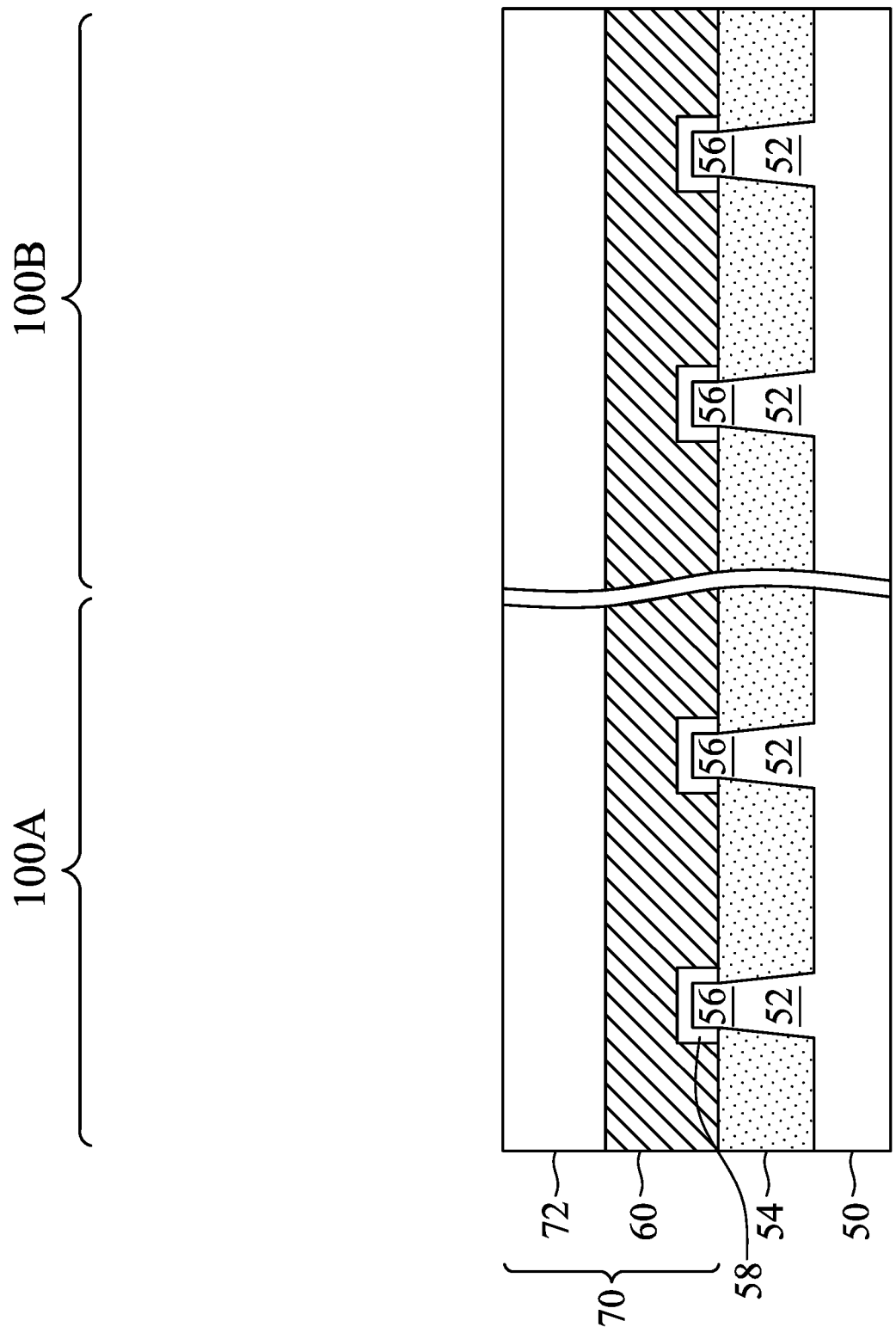
FIGS. 9A-9C are cross-sectional views of intermediate stages in the manufacture of a FinFET device in accordance with some embodiments.
Figure 9B:
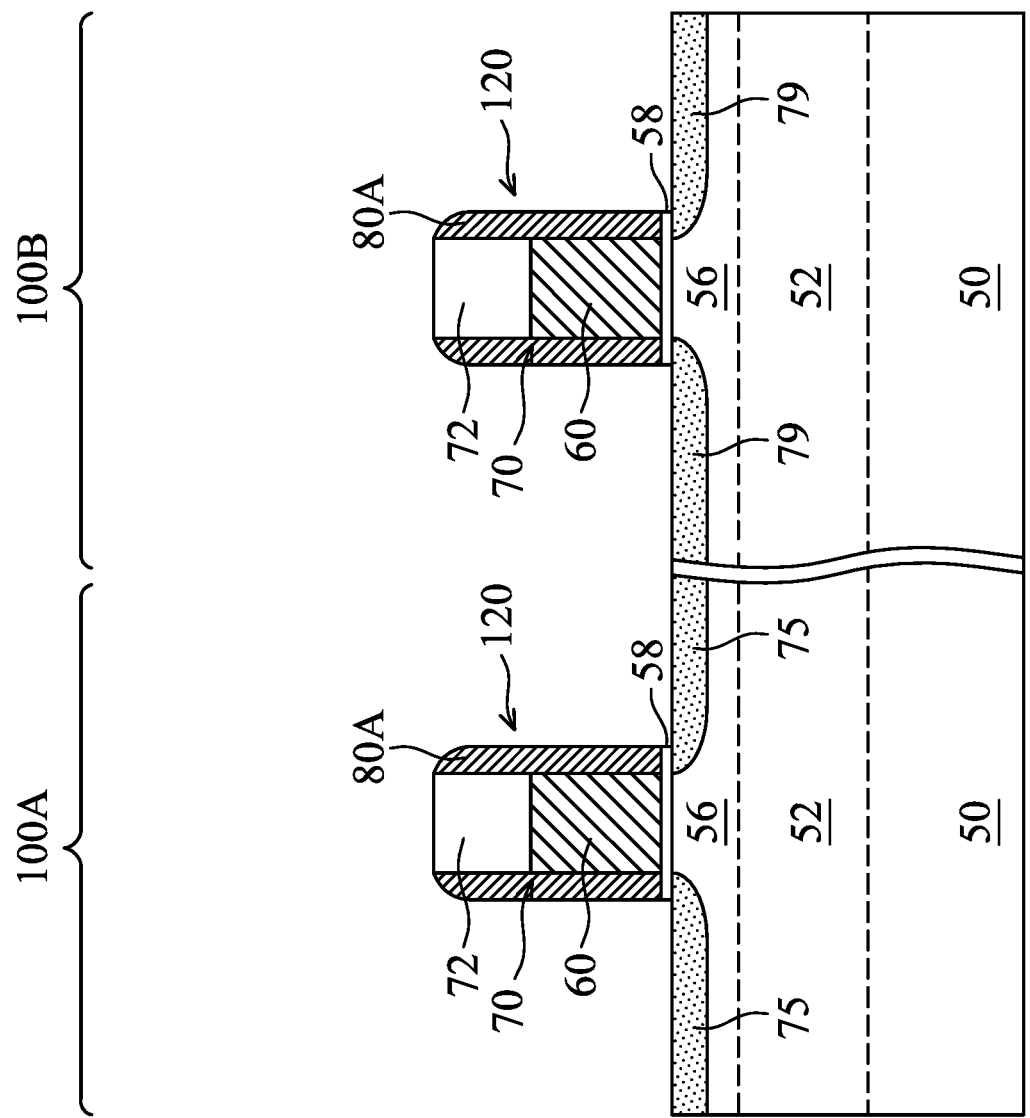
Figure 9C:
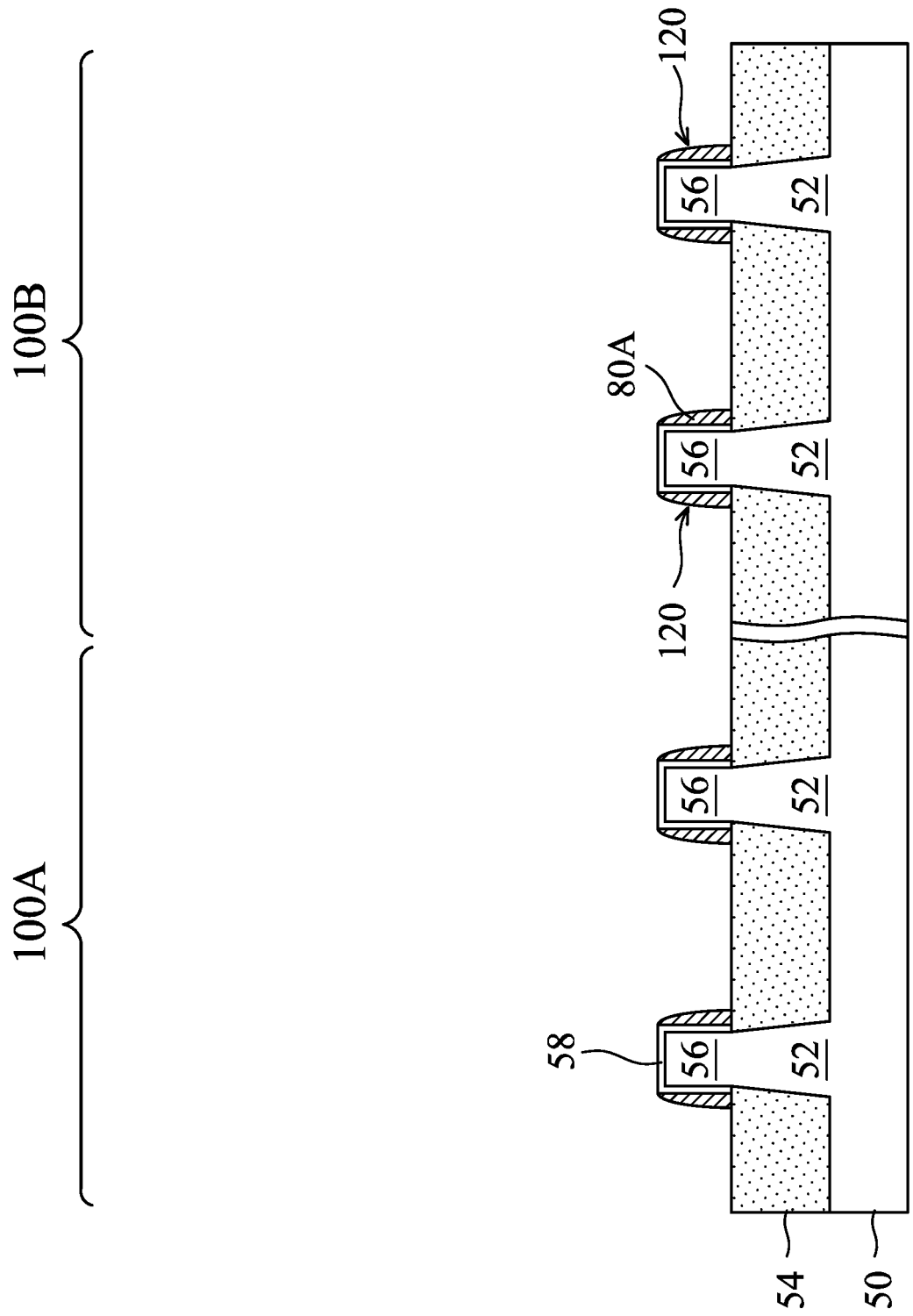

Referring to FIGS. 9A-C, an etching process is performed on portions of the first spacer layer 80A. The etching process may be a dry etch process, and may be anisotropic. After performing the etching process, lateral portions of the first spacer layer 80A over the LDD regions 75/79 and over the isolation regions 54 may be removed to expose top surfaces of the fins 56 and the masks 72 for the dummy structure 70. Portions of the first spacer layer 80A along sidewalls of the dummy structure 70 and the fins 56 may remain and form offset spacers 120. In other embodiments, the first spacer layer 80A may also be removed from the sidewalls of the fins 56. In some embodiments, offset spacers 120 in the first region 100A are formed at the same time as offset spacers 120 in the second region 100B, and in other embodiments, offset spacers 120 in the first region 100A and the second regions 100B are formed in separate processes. In some embodiments, lateral portions of the dummy dielectric layer 58 over the LDD regions 75/79 and over the isolation regions 54 may also be removed.

Figure 10A:
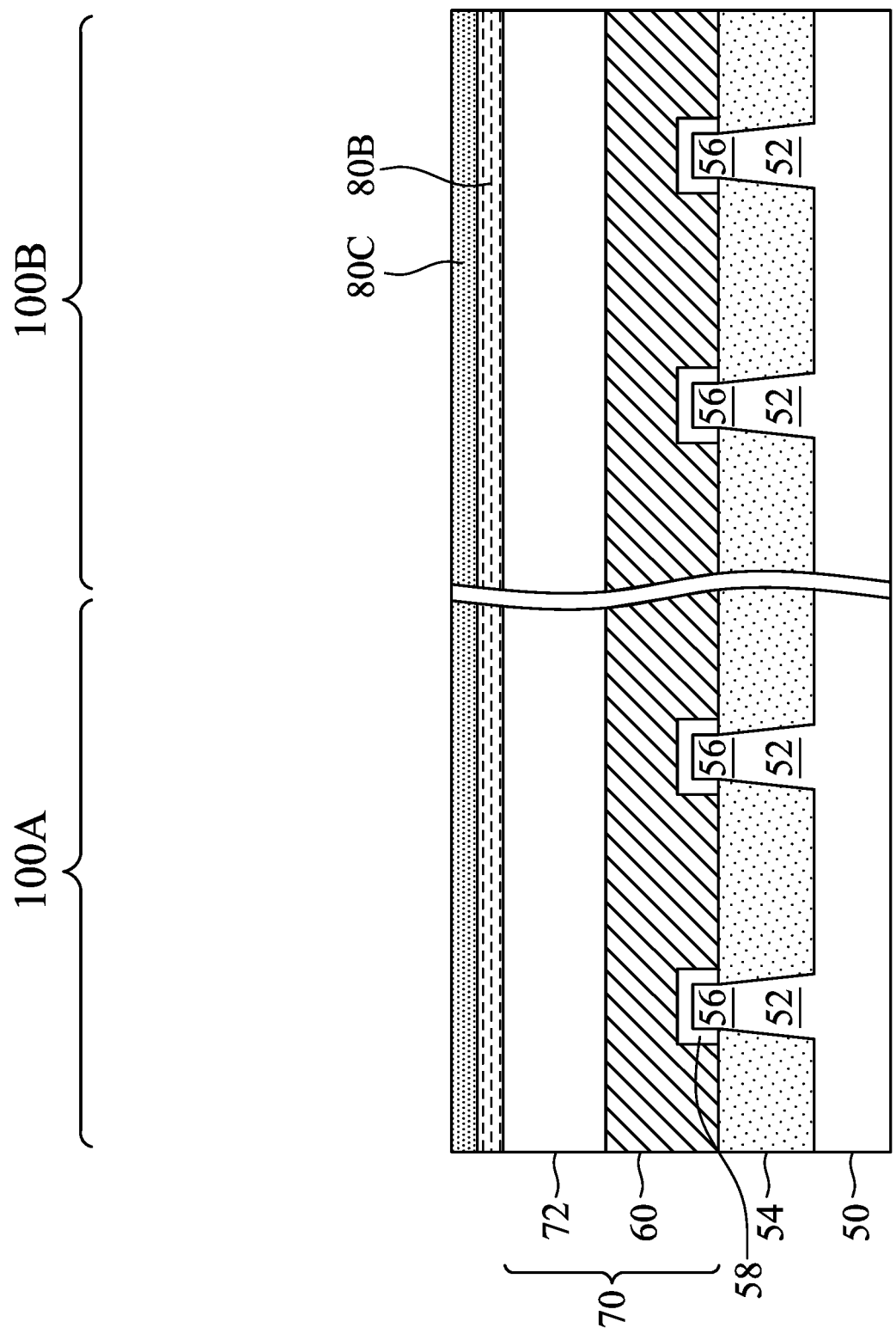
FIGS. 10A-10C are cross-sectional views of intermediate stages in the manufacture of a FinFET device in accordance with some embodiments.
Figure 10B:
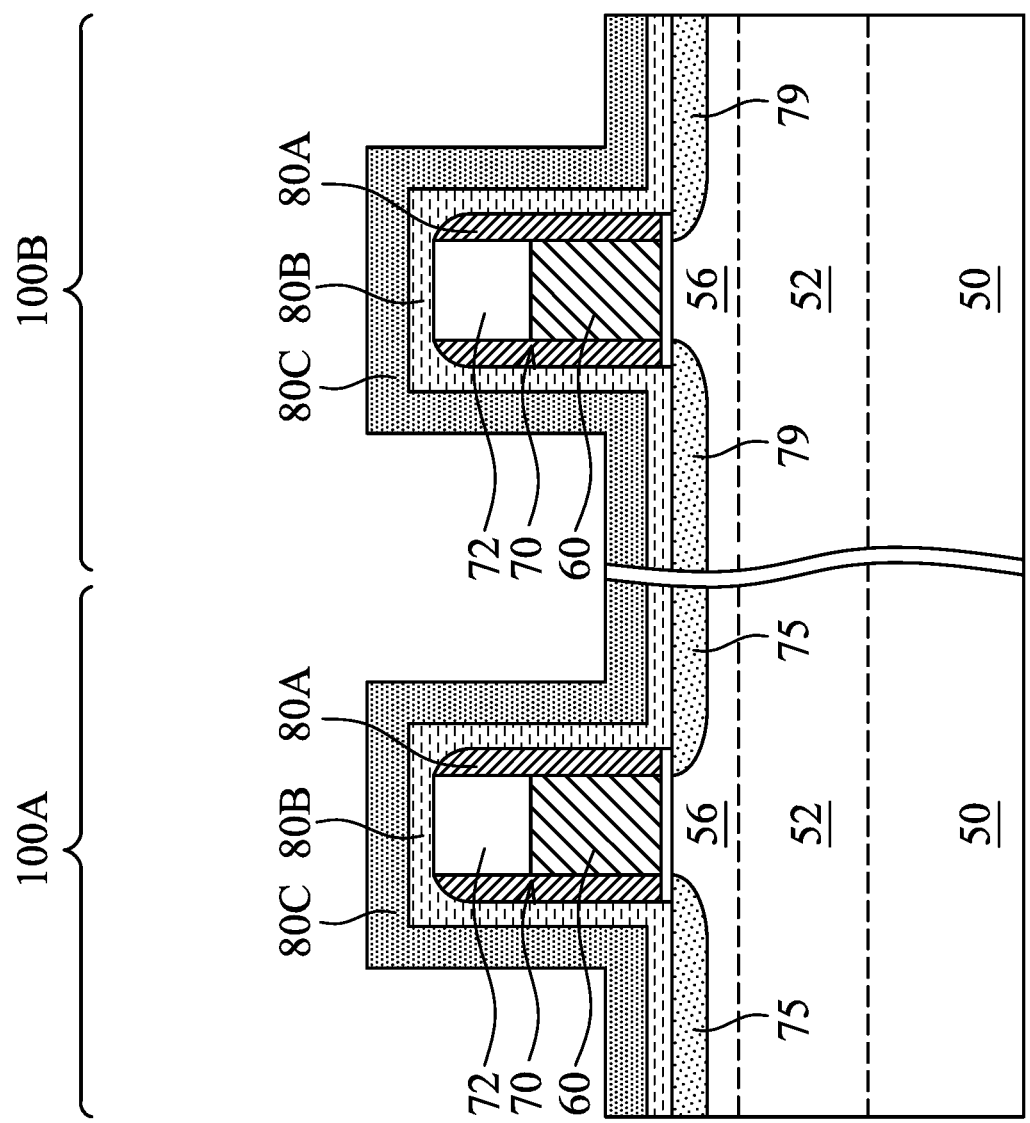
Figure 10C:
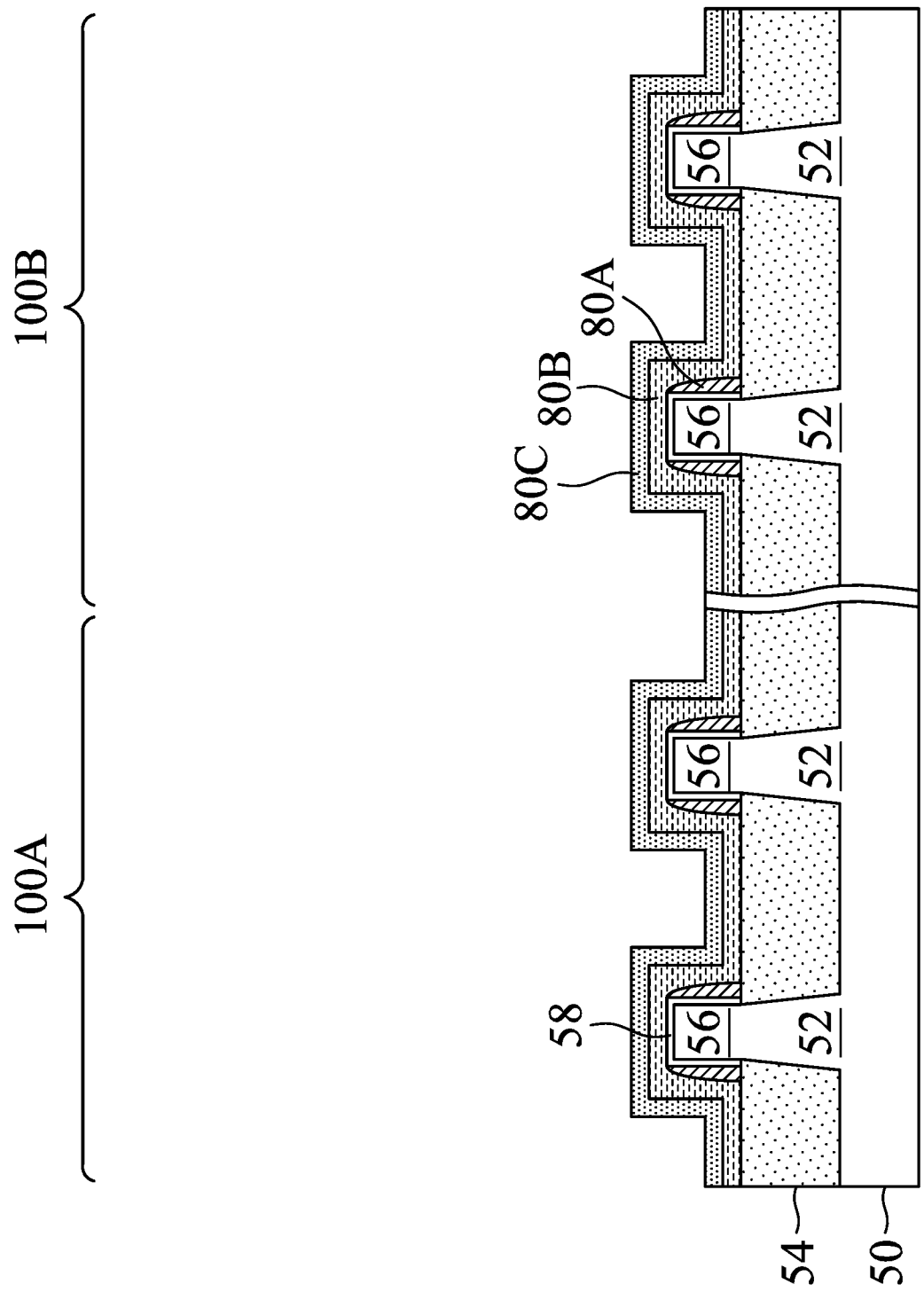

In FIGS. 10A-C, a second spacer layer 80B and a third spacer layer 80C are formed over the first region 100A and the second region 100B. Any suitable methods of forming the first spacer layer 80A may be used. In some embodiments, a deposition (such as CVD, ALD, or the like) may be used to form the second spacer layer 80B or the third spacer layer 80C. In some embodiments, the second spacer layer 80B or the third spacer layer 80C may include one or more layers of, for example, an oxide material, silicon nitride, silicon oxynitride, silicon carbonitride, silicon oxycarbonitride, a combination thereof, or the like. In some embodiments, one of the second spacer layer 80B or the third spacer layer 80C may be omitted.

Figure 11A:
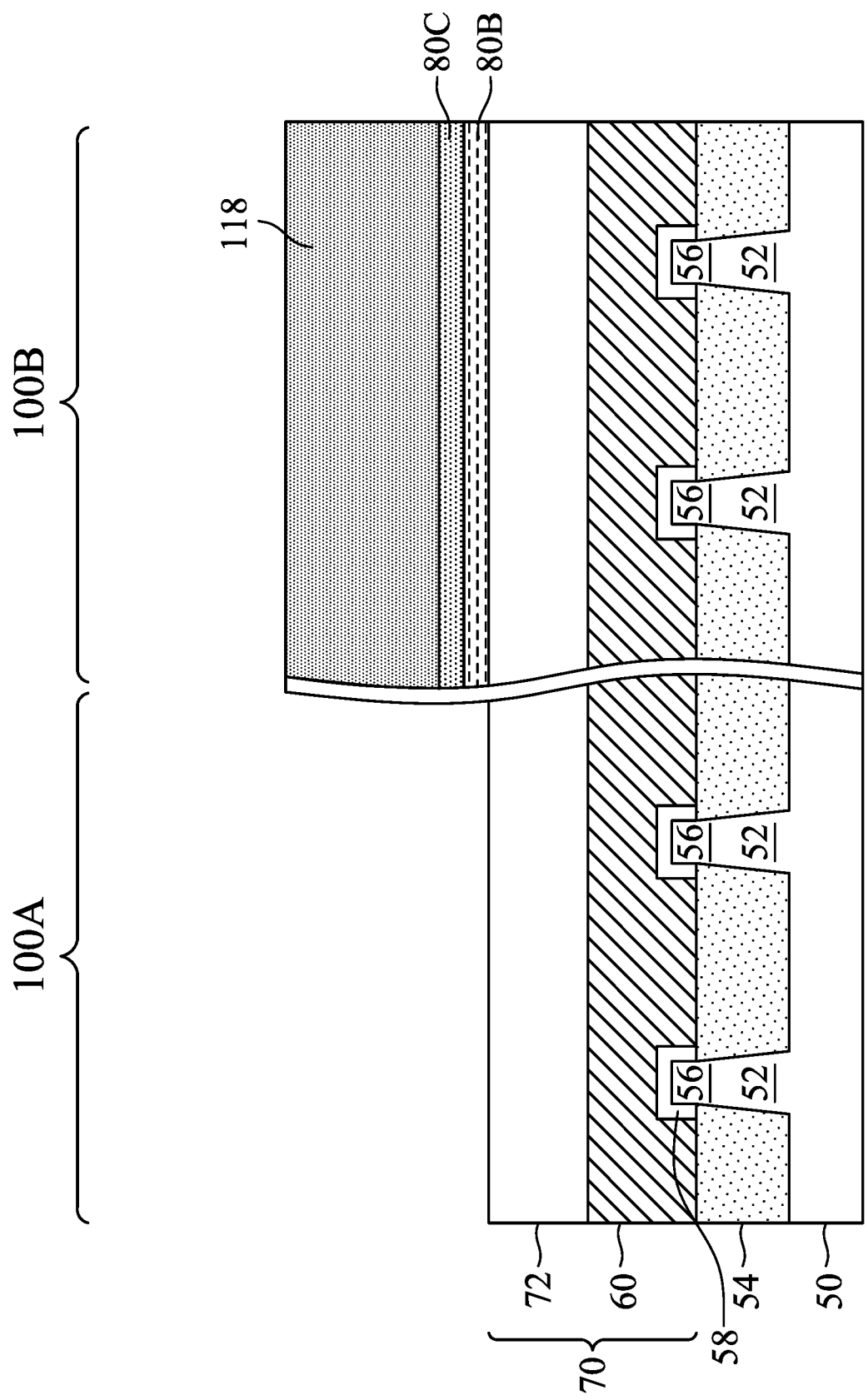
FIGS. 11A-11C are cross-sectional views of intermediate stages in the manufacture of a FinFET device in accordance with some embodiments.
Figure 11B:
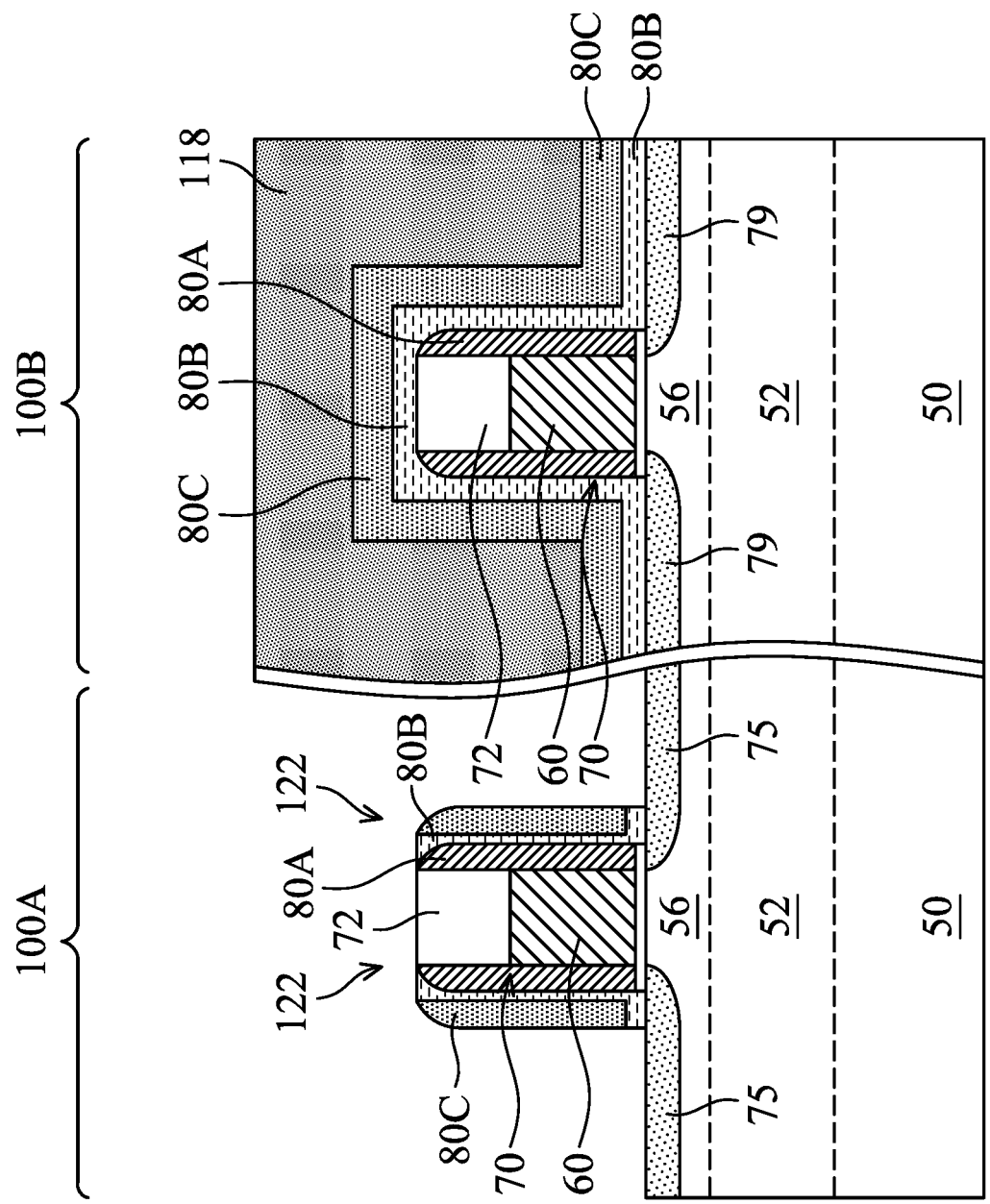
Figure 11C:
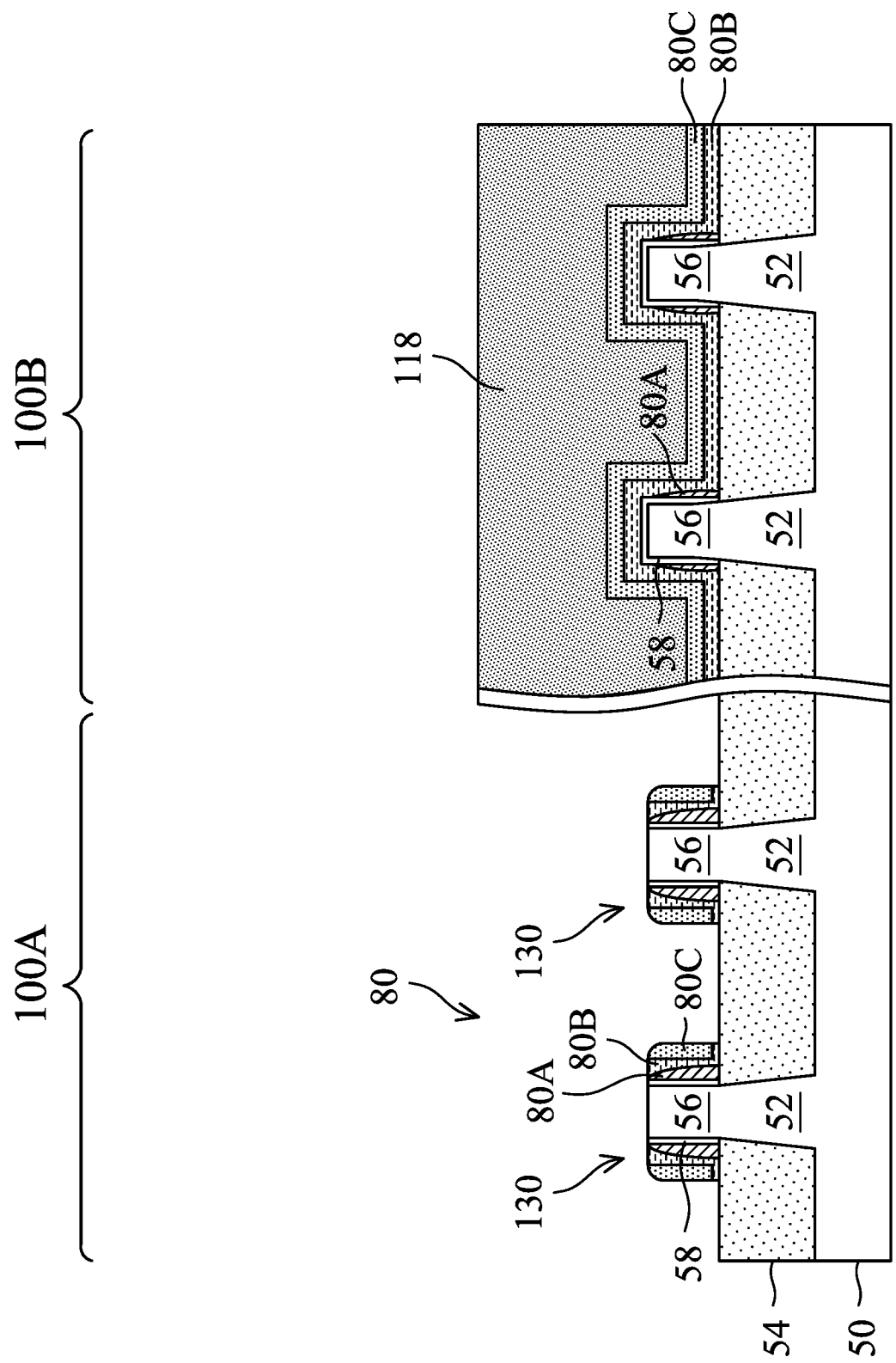

Referring to FIGS. 11A-C, a patterning process is performed to remove portions of the second spacer layer 80B and the third spacer layer 80C in the first region 100A. Any acceptable patterning process may be used. In some embodiments, mask 118 is formed over the first region 100A and the second region 100B. The mask 118 may be a single layer or may include multiple layers, such as a tri-layer mask structure or other type of mask structure. In some cases, the mask 118 may include a photoresist, though the mask 118 may include other materials. The mask 118 is patterned to expose the first region 100A. The mask 118 may be patterned using suitable photolithography techniques.

Referring further to FIGS. 11A-C, an etching process is performed on portions of the second spacer layer 80B and the third spacer layer 80C, using the mask 118 as a mask. The etching process may be a dry etch process, and may be anisotropic. After performing the etching process, lateral portions of the second spacer layer 80B and the third spacer layer 80C over the LDD regions 75/79 and over the isolation regions 54 may be removed to expose top surfaces of the fins 56 and the masks 72. Portions of the second spacer layer 80B and the third spacer layer 80C along sidewalls of the dummy structure 70 and the fins 56 may remain and form gate spacers 122 and fin spacers 130. In some embodiments, the gate spacers 122 and the fin spacers 130 in the first region 100A are formed at the same time as the gate spacers 122 and the fin spacers 130 in the second region 100B, and in other embodiments, the gate spacers 122 and the fin spacers 130 in the second region 100B are formed before the gate spacers 122 and the fin spacers 130 in the first region 100A are formed. In some embodiments, the second spacer layer 80B may be etched as described above before forming the third spacer layer 80C, and then the third spacer layer 80C may then be etched to form gate spacers 122 and fin spacers 130.

FIGS. 12 through 16C illustrate the formation of the epitaxial source/drain regions 82 in the first region 100A between neighboring fins 56. FIGS. 12-15C are all illustrated along the reference cross-section B-B illustrated in FIG. 1. During the formation of the epitaxial source/drain regions 82 in first region 100A, the second region 100B may be masked (e.g. by mask 118). In some embodiments, the epitaxial source/drain regions 82 in the first region 100A may be formed before forming epitaxial source/drain regions 84 in the second region 100B. In other embodiments, the epitaxial source/drain regions 84 in the second region 100B may be formed before forming the epitaxial source/drain regions 82 in first region 100A.

Figure 12:
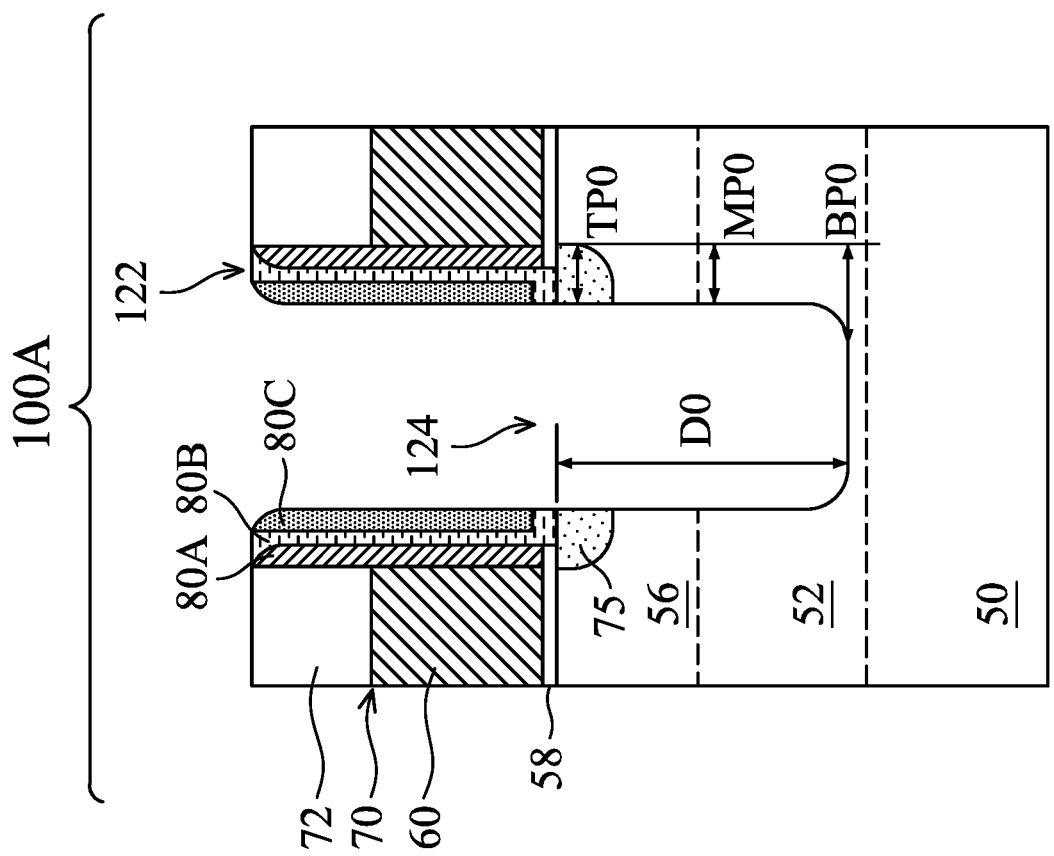
FIG. 12 is a cross-sectional view of the forming of a first recess in the manufacture of a FinFET device in accordance with some embodiments.

Referring first to FIG. 12, a first patterning process is performed on the fins 56 to form recesses 124 in source/drain regions of the fins 56. The first patterning process may be performed in a manner that the recesses 124 are formed between neighboring dummy structures 70 (in interior regions of the fins 56), or between an isolation region 54 and adjacent dummy structure 70 (in end regions of the fins 56). In some embodiments, the first patterning process may include a suitable anisotropic dry etching process, while using the dummy structure 70, the gate spacers 122, the fin spacers 130 and/or isolation regions 54 as a combined mask. The suitable anisotropic dry etching process may include a reactive ion etch (RIE), neutral beam etch (NBE), the like, or a combination thereof. In some embodiments where the RIE is used in the first patterning process, process parameters such as, for example, a process gas mixture, a voltage bias, and an RF power may be chosen such that etching is predominantly performed using physical etching, such as ion bombardment. In some embodiments, a voltage bias may be increased to increase energy of ions used in the ion bombardment process and, thus, increase a rate of physical etching. Since, the physical etching in anisotropic in nature and the chemical etching is isotropic in nature, such an etching process has an etch rate in the vertical direction that is greater than an etch rate in the lateral direction. In some embodiments, the anisotropic etching process may be performed using a process gas mixture including $BF_2$, $Cl_2$, $CH_3F$, $CH_4$, HBr, $O_2$, Ar, other etchant gases, a combination thereof, or the like. In some embodiments, the first patterning process forms recesses 124 having U-shaped bottom surfaces. The recesses 124 may also be referred to as U-shaped recesses 124, an example recess 124 of which is shown in FIG. 12. FIG. 12 also shows the recess 124 has a top proximity TP0, a middle proximity MP0, and a bottom proximity BP0, each of which is measured laterally from the edge of the adjacent dummy gate 60 to a sidewall of the recess 124. The top proximity TP0 is measured at the top of the fins 56, and may be between about 1 nm and about 30 nm. The bottom proximity BP0 is measured at the bottom of the recess 124, and may be between about 1 nm and about 30 nm. The middle proximity MP0 is measured about halfway between the top of the fins 56 and the bottom of the recess 124, and may be between about 1 nm and about 30 nm. As shown in FIG. 12, the recess 124 has a recess depth D0, measured vertically from a top surface of the fins 56 to the bottom of the recess 124, which may be between about 40 nm and about 100 nm. In some embodiments, the etching process for forming the recesses 124 may also etch isolation regions 54. In some cases, the etching process may be followed by a cleaning process, such a dry cleaning process (e.g., an ashing process), a wet cleaning process, the like, or a combination. In some cases, a native oxide may form on exposed surfaces of the U-shaped recesses 124 (not shown).

Figure 13:
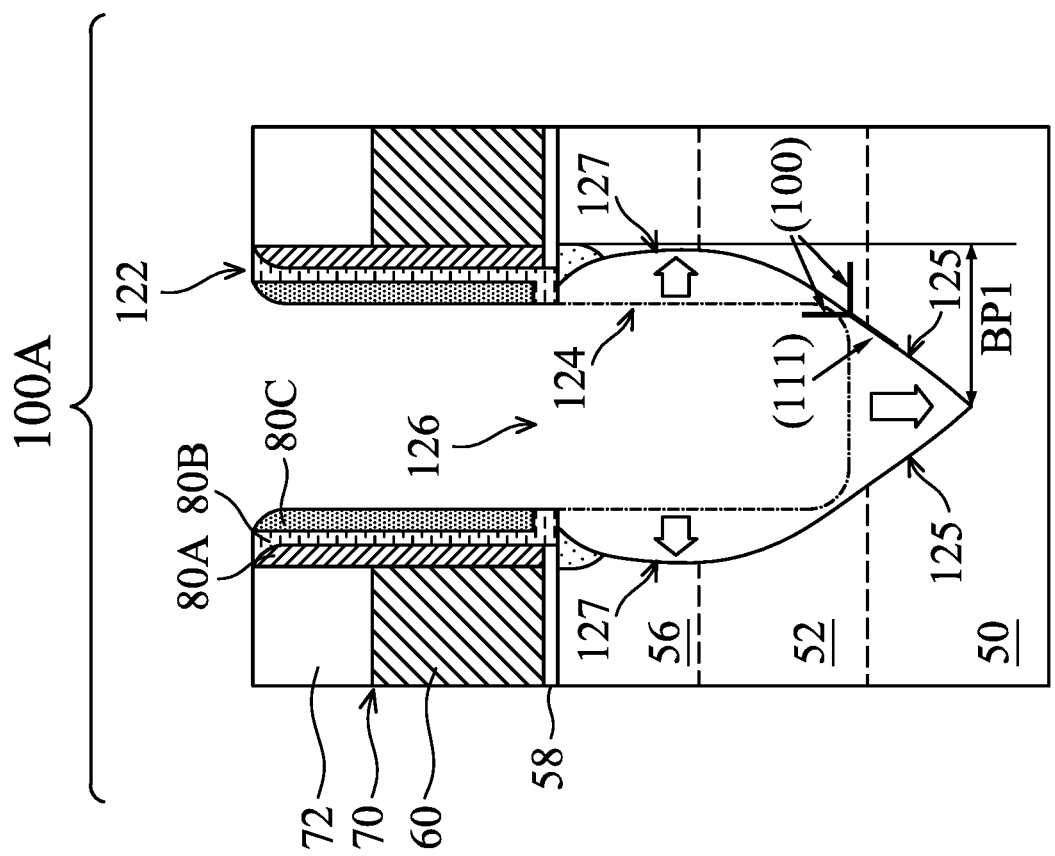
FIG. 13 is a cross-sectional view of the forming of a reshaped recess in the manufacture of a FinFET device in accordance with an embodiment.

Referring to FIG. 13, a second patterning process is performed on the fins 56 to reshape the U-shaped recesses 124 and form reshaped recesses 126. As shown in FIG. 13, the second patterning process expands the U-shaped recesses 124 (shown with a dotted line in FIG. 13, for comparison) to form the reshaped recesses 126. In FIGS. 13-15C, sidewall regions of the recess 126 at or near the bottom of the recess 126 are labeled as lower sidewalls 125, and sidewall regions of the recess 126 at or near the top of the fins 56 are labeled as upper sidewalls 127. The sidewall regions labeled as lower sidewalls 125 and upper sidewalls 127 in FIG. 13 are examples, and may be different than shown. The lower sidewalls 125 may be separated from the upper sidewalls 127 by other sidewall regions, or the lower sidewalls 125 may be contiguous with the upper sidewalls 127. In some embodiments, upper sidewalls 127 may extend between about 10 nm and about 90 nm from a top surface of a fin 56. In some embodiments, lower sidewalls 125 may extend between about 10 nm and about 90 nm from a bottom surface of a recess 126. In some embodiments, the upper sidewalls 127 may extend between about 10% and about 90% of the sidewall depth of a recess 126, such as about 50%. In some embodiments, the lower sidewalls 125 may extend between about 10% and about 90% of the sidewall depth of a recess 126, such as about 50%. In some cases, the lower sidewalls 125 are defined as sidewall regions of the recess 126 that have surfaces along crystalline planes, described in greater detail below. In some embodiments, the second patterning process causes the reshaped recess 126 to have a greater bottom proximity BP1 than bottom proximity BP0 of the U-shaped recess 124. In some embodiments, the second patterning process may include an anisotropic dry etching process, while using the dummy structures 70, the spacers 122 and/or isolation regions 54 as a combined mask. In some cases, the second patterning process may have a slower etch rate than the first patterning process.

In some embodiments, the second patterning process includes a plasma etching process performed in a processing chamber with process gases being supplied into the processing chamber. In some embodiments, the plasma is a direct plasma. In other embodiments, the plasma is a remote plasma that is generated in a separate plasma generation chamber connected to the processing chamber. Process gases may be activated into plasma by any suitable method of generating the plasma, such as transformer coupled plasma (TCP) systems, inductively coupled plasma (ICP) systems, magnetically enhanced reactive ion techniques, electron cyclotron resonance techniques, or the like.

In some embodiments, the process gases used in the plasma etching process includes etchant gases such as $H_2$, Ar, other gases, or a combination of gases. In some embodiments, carrier gases, such as $N_2$, Ar, He, Xe, or the like, may be used to carry process gases into the processing chamber. The process gases may be flowed into the processing chamber at a rate between about 10 sccm and about 3000 sccm. For example, the etchant gases may be flowed into the processing chamber or plasma generation chamber at a rate between about 10 sccm and about 1000 sccm, such as about 70 sccm. Carrier gases may be flowed into the processing chamber at a rate between about 10 sccm and about 3000 sccm, such as about 130 sccm. In some cases, a lower flow rate of process gases can reduce the etch rate of the second patterning process and reduce damage to the fin 56 during the second patterning process. In some embodiments, the plasma etching process is performed at a temperature between about 200° C. and about 400° C., such as about 330° C. In some cases, a higher process temperature can reduce the etch rate of the second patterning process and reduce damage to the fin 56 during the second patterning process. A pressure in the processing chamber may be between about 60 mTorr and about 120 mTorr, such as about 100 mTorr. In some cases, a higher process pressure can allow for a more stable or more reproducible plasma. A higher process pressure can also reduce damage to the fin 56 during the second patterning process. In some embodiments, the plasma etching process is performed for a time between about 10 seconds and about 1000 seconds. In some embodiments, the plasma etching process includes multiple steps.

In some embodiments, the second patterning process includes a plasma etching process using hydrogen (H) radicals. The H radicals may be formed by flowing $H_2$ gas into a plasma generation chamber and igniting a plasma within the plasma generation chamber. In some embodiments, an additional gas may be ignited into a plasma within the plasma generation chamber, such as Ar. The fins 56 are exposed to the H radicals, and the H radicals laterally and vertically etch the sidewalls of the U-shaped recesses 124, forming the reshaped recesses 126. In some cases, the H radicals may preferentially etch some crystalline planes of the semiconductor material of the fins 56. As an example, for embodiments in which the material of the fins 56 is silicon, the H radicals may selectively etch (100) planes over (111) planes or (110) planes. Examples of (100) planes and a (111) plane are indicated in FIG. 13, though (100), (111), or (110) planes other than those indicated may also be present. In some cases, the etch rate of (100) planes may be about three times greater than the etch rate of (111) planes. Due to this selectivity, the etching by the H radicals may tend to slow or stop along (111) planes or (110) planes of silicon during the second patterning process.

In some embodiments, the selective etching of the H radicals may cause some sidewalls of the reshaped recess 126 to have surfaces that remain as (111) planes or (110) planes after the second patterning process. This is shown in FIG. 13, in which some or all of the lower sidewalls 125 of the recess 126 have surfaces along crystalline planes. The lower sidewalls 125 may have surfaces that include (111) planes, (110) planes, or a combination of (111) planes or (110) planes. In some cases, a proportion of (111) planes to (110) planes present in the lower sidewalls 125 may depend on the crystalline orientation of the material of the fins 56 or of the substrate 50. In some cases, the lower sidewalls 125 having surfaces along crystalline planes may result in the bottom of the reshaped recess 126 having a tapered shape, pointed shape, or a V-shape as shown in FIG. 13. For example, at the bottom of the reshaped recess 126, opposite lower sidewalls 125 may have surfaces along crystalline planes that meet at an angle defined by the intersection of the crystalline planes of the surfaces. For example, in some cases the bottom of the reshaped recess 126 may be defined by the intersection of a crystalline plane of a first sidewall surface and a crystalline plane of a second sidewall surface. FIG. 13 shows the reshaped recess 126 having a bottom whose pointed shape is laterally centered between opposite spacers 122, but in other cases the bottom of the recess 126 may have a pointed shape that is laterally offset. In some cases, some, none, or all of the upper sidewalls 127 of the reshaped recess 126 have planar surfaces (e.g., (111) or (110) surfaces). In some cases, the reshaped recesses 126 may have surfaces that are planar or straight but are not along crystalline planes. For example, the reshaped recesses may have vertical, lateral, or angled surfaces that are not along crystalline planes. In some cases, the upper sidewalls 127 may have curved or convex surfaces, as shown in FIG. 13.

In some cases, by having the bottom of the reshaped recess 126 be defined by the intersection of crystalline planes as described, the bottom proximity (e.g., BP1 shown in FIG. 13) may be increased. For example, a reshaped recess 126 having a V-shaped bottom may be farther from neighboring fins than a recess having a U-shaped bottom or a more horizontal bottom surface, such as the recess 124 shown in FIG. 12. In some cases, a larger bottom proximity reduces the amount of dopants within the epitaxial source/drain regions that diffuse into or under the channel of a FinFET. The reduction of diffused dopants can improve device performance. For example, reducing the diffusion of dopants can reduce unwanted Drain-Induced Barrier Lowering (DIBL) effects or can decrease off-state leakage of a FinFET device.

Figure 14:
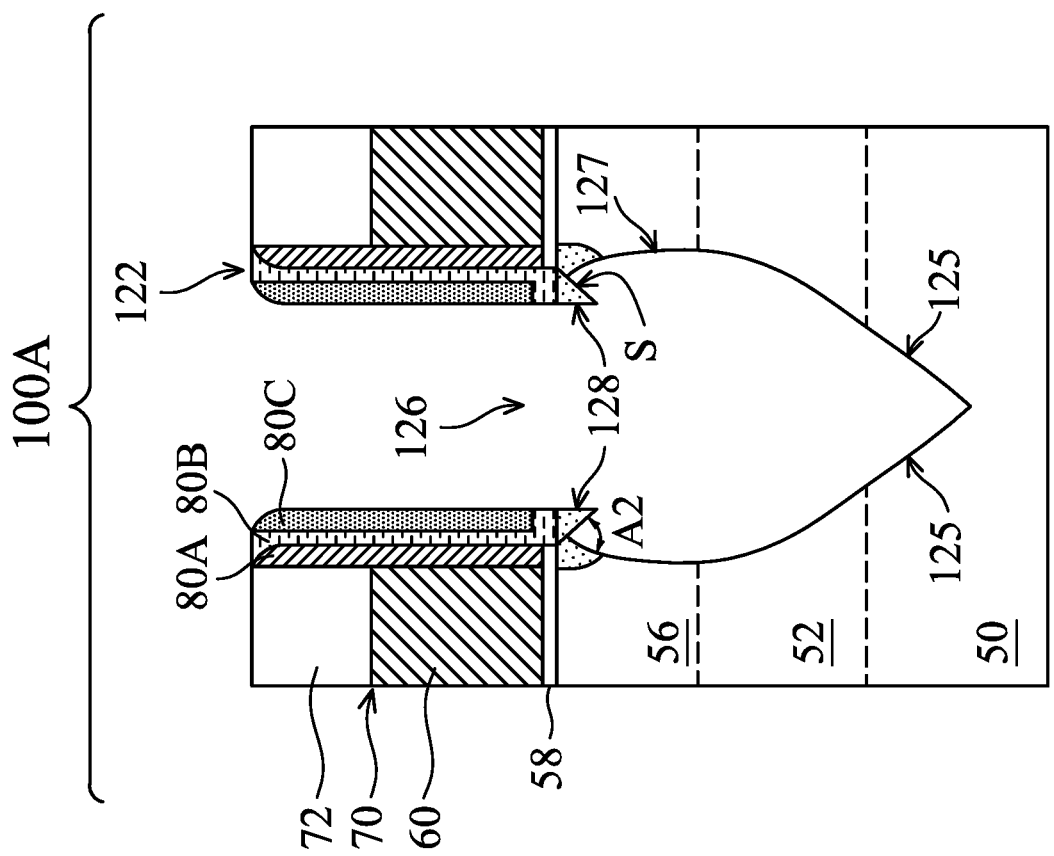
FIG. 14 is a cross-sectional view of the forming of an alternative embodiment of the forming of a reshaped recess in the manufacture of a FinFET device.

FIG. 14 shows an alternative embodiment of a reshaped recess 126 after a second patterning process has been performed. The reshaped recess 126 shown in FIG. 14 is similar to that shown in FIG. 13, except that after the second patterning process, portions 128 of the fins 56 remain under the gate spacers 122. In some embodiments, a second patterning process that leaves portions 128 remaining may have a shorter duration than a second patterning process without remaining portions 128 (as shown in FIG. 13). For example, in some embodiments, a second patterning process that leaves portions 128 may be performed for a first duration that is less than half of a second duration of a second patterning process that removes the portions 128, though the first duration may be another fraction of the second duration in other embodiments. In some embodiments, the portions 128 may extend from the gate spacers 122 toward the fin 56 a distance between about 0.1 nm and about 10 nm, and may extend downward from the gate spacers 122 a distance between about 0.1 nm and about 10 nm. In some embodiments, the portions 128 have a sidewall surface that faces away from the center of the recess 126 (i.e., toward the fins 56), labelled as surface "S" in the example of FIG. 14. In some embodiments, the surface S includes one or more crystalline planar surfaces. For example, due to the selective etching of the H radicals described above, the surface S may have (111) or (110) surfaces. In some embodiments, an angle A2 between a sidewall of the recess 126 and the surface S may be between about 35° and about 125°. In some cases, the portions 128 of the fins 56 remaining under the gate spacers 122 act as additional highly-doped regions, which may effectively extend the LDD regions 75/79 beneath the gate spacers 122. In this manner, the portions 128 may provide additional device performance improvements similar to those provided by the LDD regions 75/79. In some cases, leaving portions 128 of the fins 56 remaining under the gate spacers 122 after the second patterning process may protect the replacement gate (see FIGS. 20A-C) from dopants diffusing into the replacement gates from the epitaxial source/drain regions (see FIGS. 16A-C), and thus can improve device performance. In some embodiments, the shape (e.g., angle A2) or size of the portions 128 may be controlled by controlling parameters of the second patterning process, such as process duration, process temperature, process pressure, process gas flow rate (e.g., $H_2$ flow rate), or other parameters.

Figure 15A:
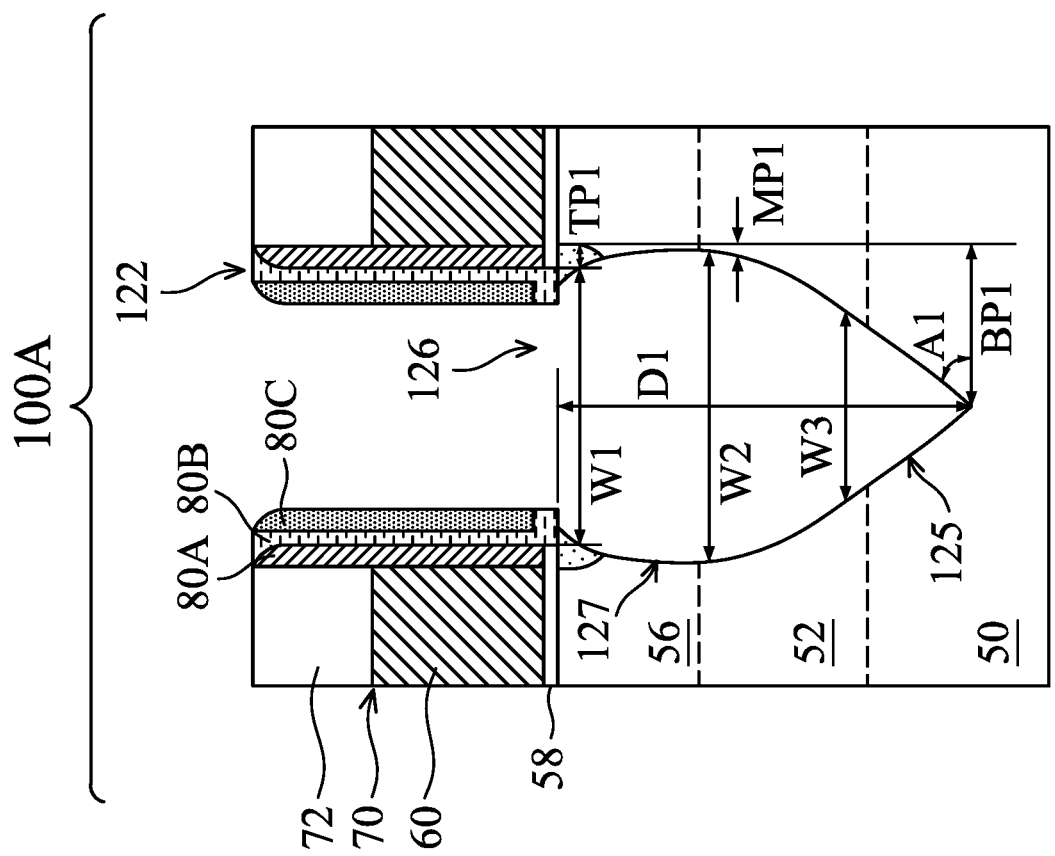
FIGS. 15A-15C are cross-sectional views of alternative embodiments of the forming of a reshaped recesses in the manufacture of a FinFET.
Figure 15B:
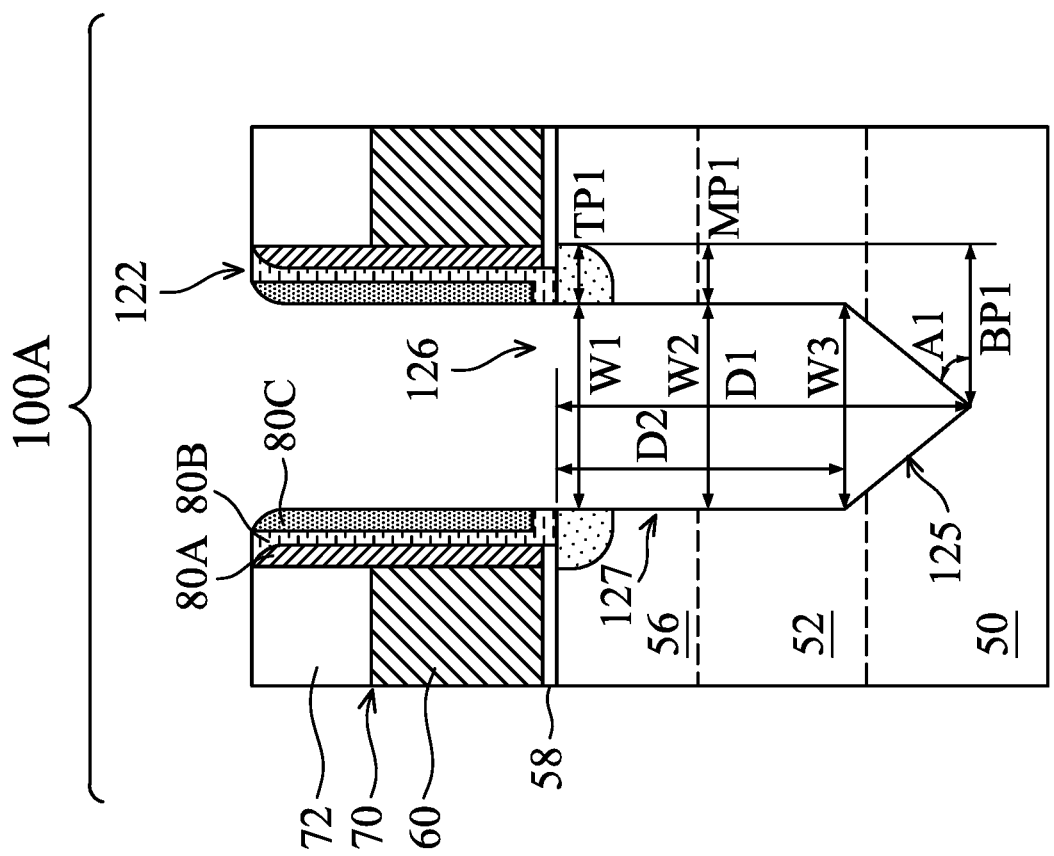
Figure 15C:
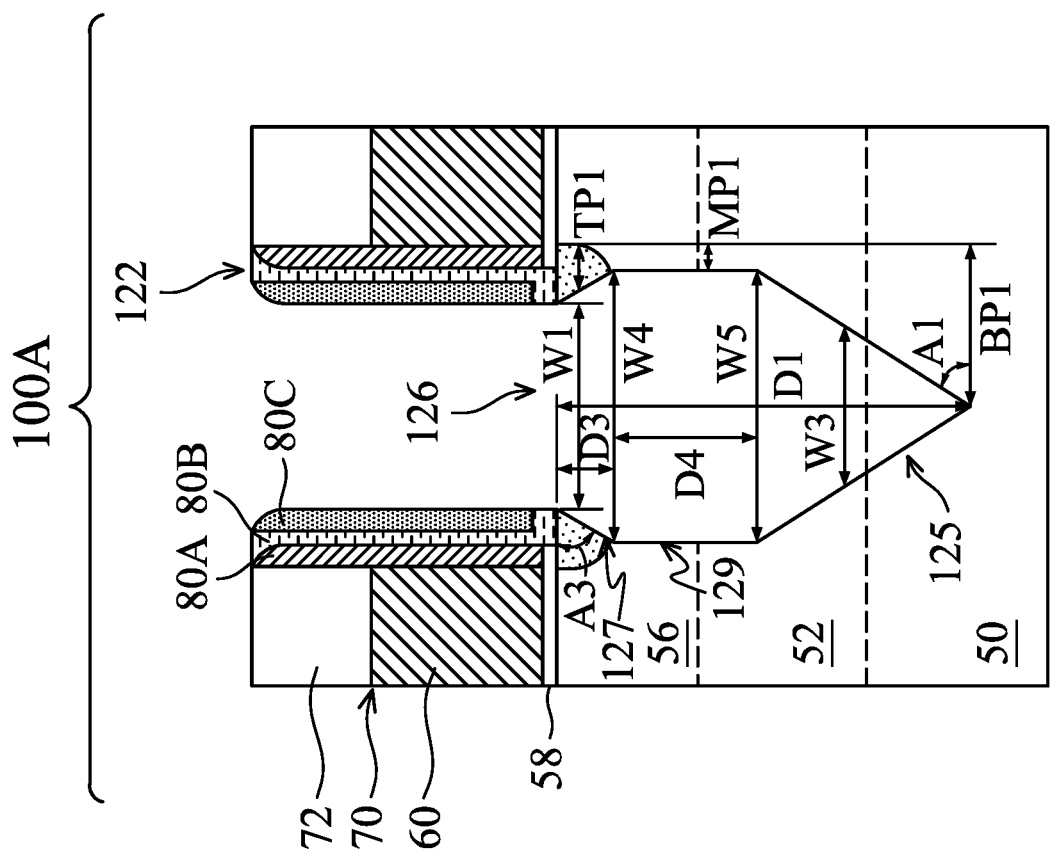

FIGS. 15A-C show other alternative embodiments of reshaped recesses 126 having different shapes that may be formed using the second patterning process described herein. The reshaped recesses 126 shown in FIGS. 15A-C are similar to the recesses 126 shown in FIGS. 13-14. For example, a second patterning process with H radicals used in a plasma etching process may be used to form the recesses 126 shown in FIGS. 15A-C. Additionally, the reshaped recesses 126 shown in FIGS. 13-15C are examples for illustrative purposes, and reshaped recesses 126 may have different shapes or dimensions than the reshaped recesses 126 shown or may have combinations of shapes or dimensions of the reshaped recesses 126 shown. In some embodiments, the shape or size of the reshaped recesses 126 may be controlled by controlling parameters of the second patterning process, such as process duration, process temperature, process pressure, process gas flow rate, or other parameters.

In some embodiments, the parameters of the second patterning process may be controlled to form a reshaped recess 126 having a desired shape or having desired dimensions. In some cases, controlling the shape of the reshaped recess 126 also controls the shape of the channel region of the neighboring FinFETs. In this manner, the channel region may be formed having desired features, such as its particular top proximity, middle proximity, or bottom proximity. The sidewall profile of the channel region may also be controlled for particular features, such as for uniform sidewalls, vertical sidewalls, tapered sidewalls, etc. In some cases, a particular shape of a reshaped recess 126 (e.g., having a V-shaped bottom or having vertical sidewalls, etc.) may be more suitable for a particular source/drain epitaxial material or an epitaxial material formation process used to form epitaxial source/drain regions within the reshaped recess 126. In this manner, the embodiments shown herein present illustrative examples of some of the shapes of a reshaped recess 126 that the second patterning process as described herein may be controlled to produce. As such, the second patterning process as described herein may allow for more flexibility in the controlling the shapes of recesses or the shapes of channel regions of FinFETs.

FIG. 15A shows an alternative embodiment of a reshaped recess 126 having a shape similar to that of the reshaped recess 126 shown in FIG. 13. The lower sidewalls 125 of the recess 126 may include surfaces along crystalline planes (e.g., (111) or (110) surfaces), and the upper sidewalls 127 may include surfaces that are not along crystalline planes (e.g., curved surfaces). The reshaped recess 126 may have recess depth D1, measured vertically from a top surface of the fins 56 to the bottom of the recess 126, between about 40 nm and about 100 nm. The reshaped recess 126 may have a top width W1, measured laterally across the recess 126 from the top of one fin 56 to the top of the opposite fin 56, between about 15 nm to about 60 nm. The reshaped recess 126 may have a middle width W2, measured laterally across the recess 126 from one fin 56 to the opposite fin 56 at about half the recess depth D1, between about 15 nm and about 80 nm. The ratio of W1:W2 may be between about 0.5:1 and about 1:1. The reshaped recess 126 may have a width W3, measured laterally across the recess 126 from one fin 56 to the opposite fin 56 at about halfway between the middle width W2 and the bottom of the recess 126, between about 5 nm and about 50 nm. The ratio of W3:W2 may be between about 0.5:1 and about 1:1. The reshaped recess may have a top proximity TP1 between about 1 nm and about 15 nm, a middle proximity MP1 between about 1 nm and about 10 nm, and a bottom proximity BP1 between about 1 nm and about 25 nm. The second patterning process as described herein can allow for a smaller middle proximity MP1, which in some cases may reduce DIBL effects in a FinFET. In some cases, the second patterning process may be able to reduce the middle proximity MP1 with less increase of the depth D1 or with less reduction of the tip proximity TP1 than other techniques. The lower sidewalls 125 of the recess 126 may have an angle A1 from the horizontal defined by a crystalline plane, such as a (111) or (110) plane. The angle A1 may be between about 20° and about 80°.

FIG. 15B shows an alternative embodiment of a reshaped recess 126 having straight upper sidewalls 127. In some cases, the upper sidewalls 127 may be substantially vertical (as shown in FIG. 15B) or may have an angle. The lower sidewalls 125 may include surfaces along crystalline planes (e.g., (111) or (110) surfaces). The reshaped recess 126 may have recess depth D1, measured vertically from a top surface of the fins 56 to the bottom of the recess 126, between about 40 nm and about 100 nm. The reshaped recess 126 may have a depth D2, measured vertically from a top surface of the fins 56 to the lower sidewalls 125, between about 30 nm and about 100 nm. The reshaped recess 126 may have a top width W1, measured laterally across the recess 126 from the top of one fin 56 to the top of the opposite fin 56, between about 10 nm to about 60 nm. The reshaped recess 126 may have a middle width W2, measured laterally across the recess 126 from one fin 56 to the opposite fin 56 at about half the recess depth D1, between about 10 nm and about 80 nm. The ratio of W1:W2 may be between about 0.5:1 and about 1:1. The reshaped recess 126 may have a width W3, measured laterally across the recess 126 from one fin 56 to the opposite fin 56 at about halfway between the middle width W2 and the bottom of the recess 126, between about 5 nm and about 60 nm. The ratio of W3:W2 may be between about 0.5:1 and about 1:1. The reshaped recess may have a top proximity TP1 between about 1 nm and about 15 nm, a middle proximity MP1 between about 1 nm and about 15 nm, and a bottom proximity BP1 between about 1 nm and about 30 nm. The lower sidewalls 125 of the recess 126 may have an angle A1 from the horizontal defined by a crystalline plane, such as a (111) or (110) plane. The angle A1 may be between about 20° and about 80°. In some cases, the formation of a reshaped recess 126 with more vertical sidewalls can allow a channel region beneath the gate stack of a FinFET to have a more uniform profile. By improving the uniformity of the channel region profile, the FinFET may turn on and turn off more uniformly across the channel, which can improve device speed, current uniformity, and efficiency.

FIG. 15C shows an alternative embodiment of a reshaped recess 126 having upper sidewalls 127, middle sidewalls 129, and lower sidewalls 125. In the example recess 126 shown in FIG. 15C, the upper sidewalls 127 and the lower sidewalls 125 include surfaces along crystalline planes (e.g., (111) or (110) surfaces). The middle sidewalls 129 may be vertical (as shown in FIG. 15C) or may be have a curved or angled profile. The reshaped recess 126 may have recess depth D1, measured vertically from a top surface of the fins 56 to the bottom of the recess 126, between about 40 nm and about 100 nm. The reshaped recess 126 may have a depth D3, measured vertically from a top surface of the fins 56 to the middle sidewalls 129, between about 1 nm and about 30 nm. The middle sidewalls 129 may extend a vertical depth D4 between about 10 nm and about 50 nm. The reshaped recess 126 may have a top width W1, measured laterally across the recess 126 from the top of one fin 56 to the top of the opposite fin 56, between about 10 nm to about 60 nm. The reshaped recess 126 may have a width W4, measured laterally across the recess 126 from one fin 56 to the opposite fin 56 at the top of the middle sidewalls 129, between about 10 nm to about 70 nm. The reshaped recess 126 may have a width W5, measured laterally across the recess 126 from one fin 56 to the opposite fin 56 at the bottom of the middle sidewalls 129, between about 10 nm to about 80 nm. The ratio of W5:W4 may be between about 0.5:1 and about 1:1. The reshaped recess 126 may have a width W3, measured laterally across the recess 126 from one fin 56 to the opposite fin 56 at about halfway between the width W5 and the bottom of the recess 126, between about 1 nm and about 40 nm. The reshaped recess may have a top proximity TP1 between about 1 nm and about 20 nm, a middle proximity MP1 between about 1 nm and about 15 nm, and a bottom proximity BP1 between about 2 nm and about 30 nm. The lower sidewalls 125 of the recess 126 may have an angle A1 from the horizontal defined by a crystalline plane of the lower sidewalls 125, such as a (111) or (110) plane. The angle A1 may be between about 20° and about 80°. The upper sidewalls 127 of the recess 126 may have an angle A3 from the horizontal defined by a crystalline plane, such as a (111) or (110) plane. The angle A3 may be between about 45° and about 90°. In some cases, the formation of a reshaped recess 126 with more vertical sidewalls (e.g., middle sidewalls 129) can allow a channel region beneath the gate stack of a FinFET to have a more uniform profile. By improving the uniformity of the channel region profile, the FinFET may turn on and turn off more uniformly across the channel, which can improve device speed, current uniformity, and efficiency.

Figure 16A:
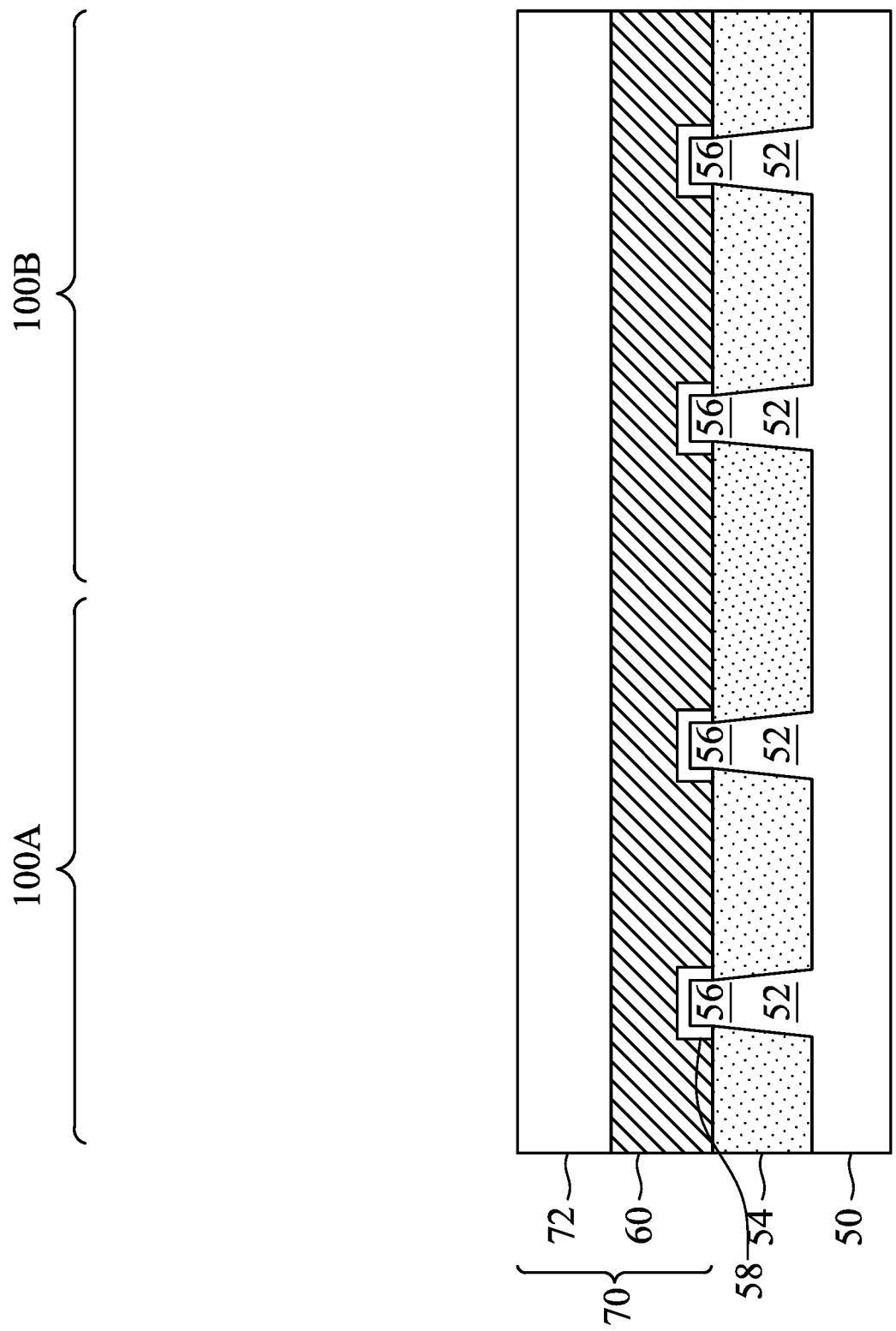
FIGS. 16A-16C are cross-sectional views of intermediate stages in the manufacture of a FinFET device in accordance with some embodiments.
Figure 16B:
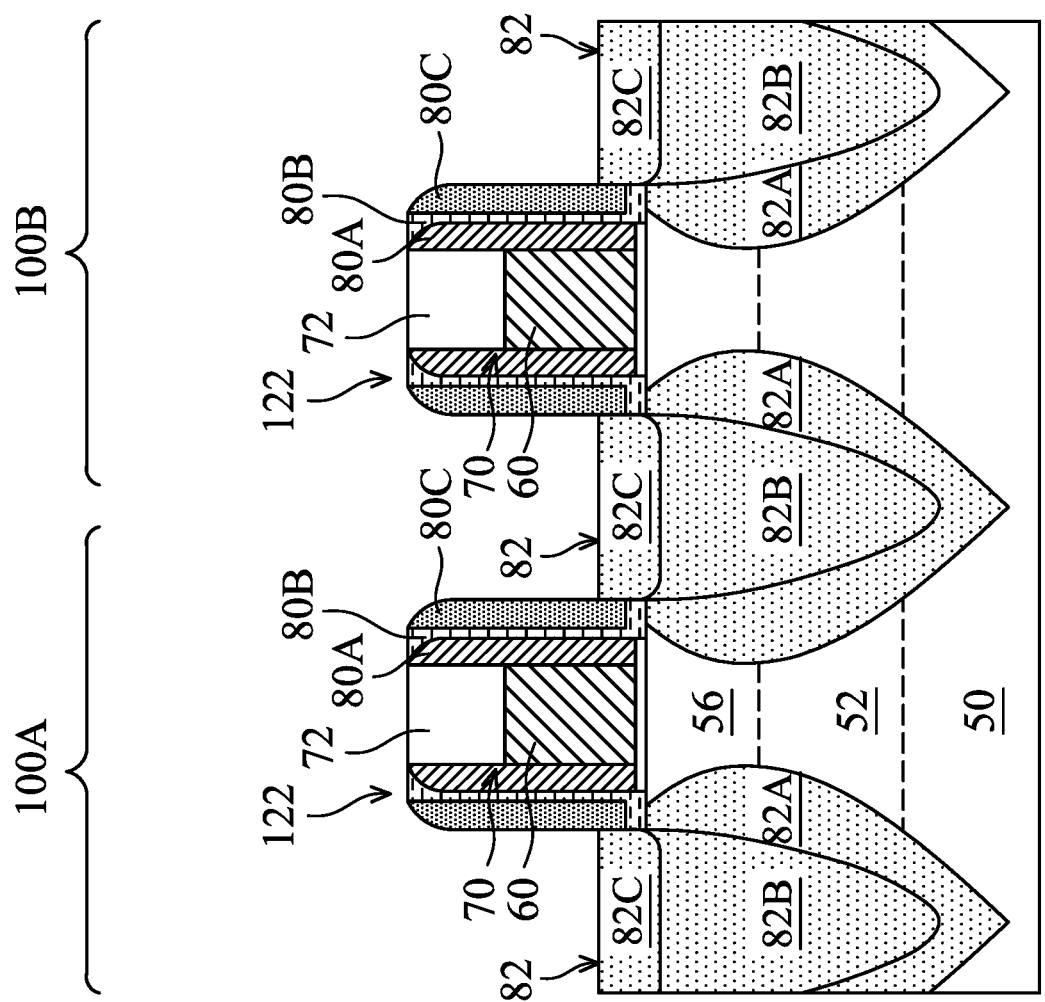
Figure 16C:
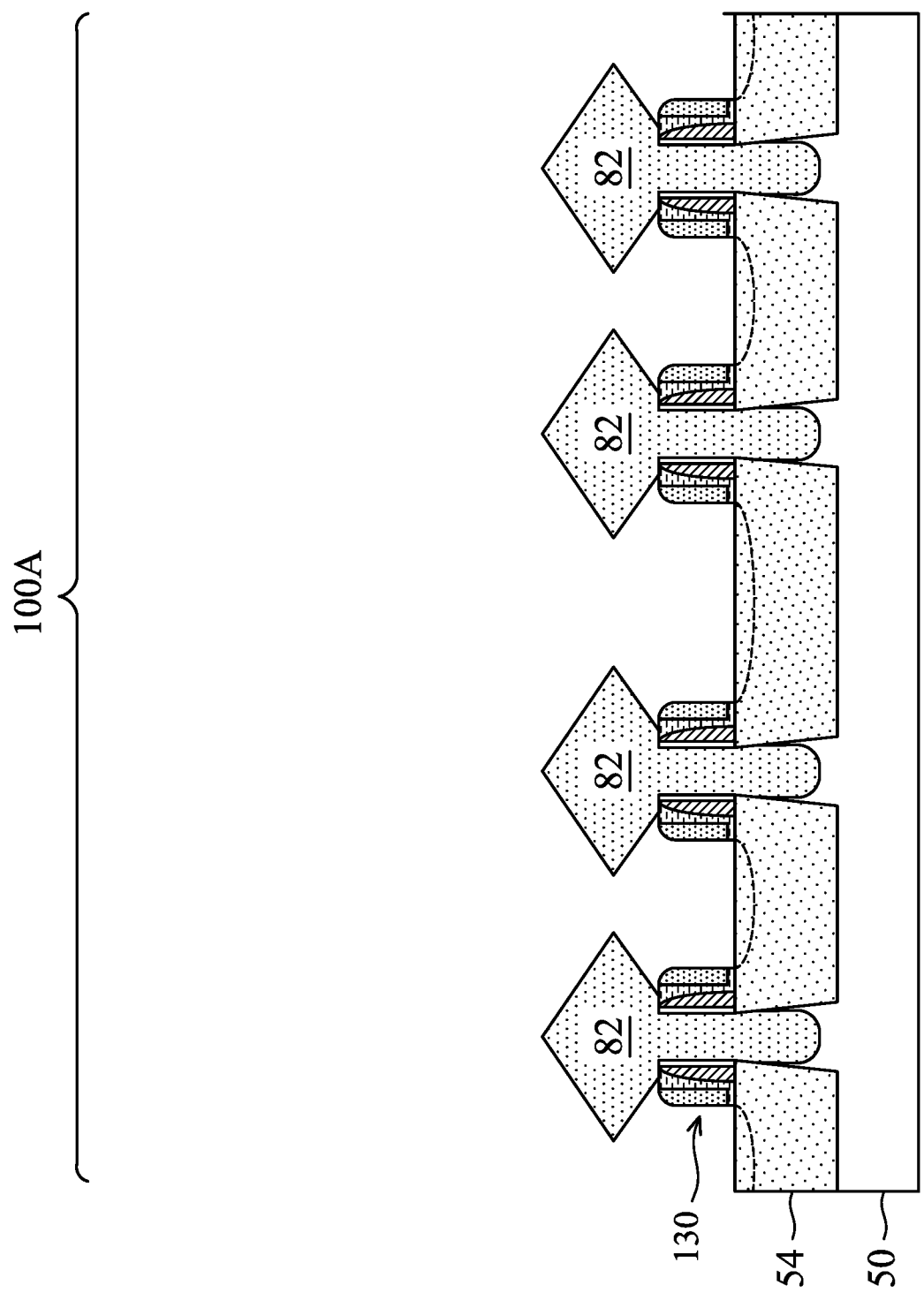

FIGS. 16A-C illustrate the formation of epitaxial source/drain regions 82 in the first region 100A. The epitaxial source/drain regions may 82 may be a single layer or include two or more layers of materials. As an example, the epitaxial source/drain regions 82 shown in FIG. 16B includes multiple epitaxial layers 82A-C. For clarity, the multiple epitaxial layers are not shown in other Figures. In some embodiments, the epitaxial source/drain regions 82 are epitaxially grown in the recesses 126 using metal-organic CVD (MOCVD), molecular beam epitaxy (MBE), liquid phase epitaxy (LPE), vapor phase epitaxy (VPE), selective epitaxial growth (SEG), a combination thereof, or the like. In some embodiments, the epitaxial source/drain regions 82 are grown in the same process chamber in which the second patterning process is performed. In some cases, a cleaning process may be performed on the fins 56 prior to forming the epitaxial source/drain regions 82, such a dry cleaning process (e.g., an ashing process), a wet cleaning process (e.g., using Caro's Strip or HF), the like, or a combination. The epitaxial source/drain regions 82 may have surfaces raised from respective surfaces of the fins 56 and may have facets. The epitaxial source/drain regions 82 are formed in the fins 56 such that each dummy structure 70 is disposed between respective neighboring pairs of the epitaxial source/drain regions 82. The epitaxial source/drain regions 82 may include any acceptable materials, such as any materials that are appropriate for n-type FinFETs. For example, if the fin 56 is silicon, the epitaxial source/drain regions 82 may include silicon, SiC, SiCP, SiP, SiGeB, the like, or a combination. Different layers of an epitaxial source/drain region 82 may be different materials or may be the same material, and may be grown in separate steps. For example, epitaxial layer 82A may be deposited first within the recess 126, then epitaxial layer 82B may be deposited over epitaxial layer 82A, then epitaxial layer 82C may be deposited over epitaxial layer 82B. In some embodiments, the first epitaxial layer 82A may include a material such as silicon, SiC, SiP, the like, or a combination. The first epitaxial layer 82A may be undoped or doped. For example, in some embodiments the first epitaxial layer 82A may be doped with phosphorus in a concentration between about $5 \times 10^{19}$ cm$^{-3}$ and about $5 \times 10^{20}$ cm$^{-3}$, though other dopants or concentrations may be used. In some embodiments, the first epitaxial layer 82A may be formed having a thickness between about 5 nm and about 20 nm. In some embodiments, the first epitaxial layer 82A may include a stressor material that imparts stress on a channel region of the fins 56. For example, the stress may be a tensile stress for n-type FinFETs. In some embodiments, the second epitaxial layer 82B may include a material such as silicon, SiP, the like, or a combination. The second epitaxial layer 82B may be undoped or doped. For example, in some embodiments the second epitaxial layer 82B may be doped with phosphorus in a concentration between about $5 \times 10^{20}$ cm$^{-3}$ and about $4 \times 10^{21}$ cm$^{-3}$, though other dopants or concentrations may be used. In some embodiments, the second epitaxial layer 82B may be formed having a thickness between about 15 nm and about 60 nm. In some embodiments, the third epitaxial layer 82C may include a material such as silicon, SiP, SiGe, SiGe:P, the like, or a combination. The third epitaxial layer 82C may be undoped or doped. For example, in some embodiments the third epitaxial layer 82C may be doped with phosphorus in a concentration between about $1\times10^{21}$ cm$^{-3}$ and about $3\times10^{21}$ cm$^{-3}$, though other dopants or concentrations may be used. In some embodiments, the third epitaxial layer 82C may be formed having a thickness between about 5 nm and about 20 nm. In some cases, the tapered shape of the reshaped recesses 126 may allow for improved fill efficiency of the epitaxial source/drain regions 82 during formation of the epitaxial source/drain regions 82.

Figure 22:
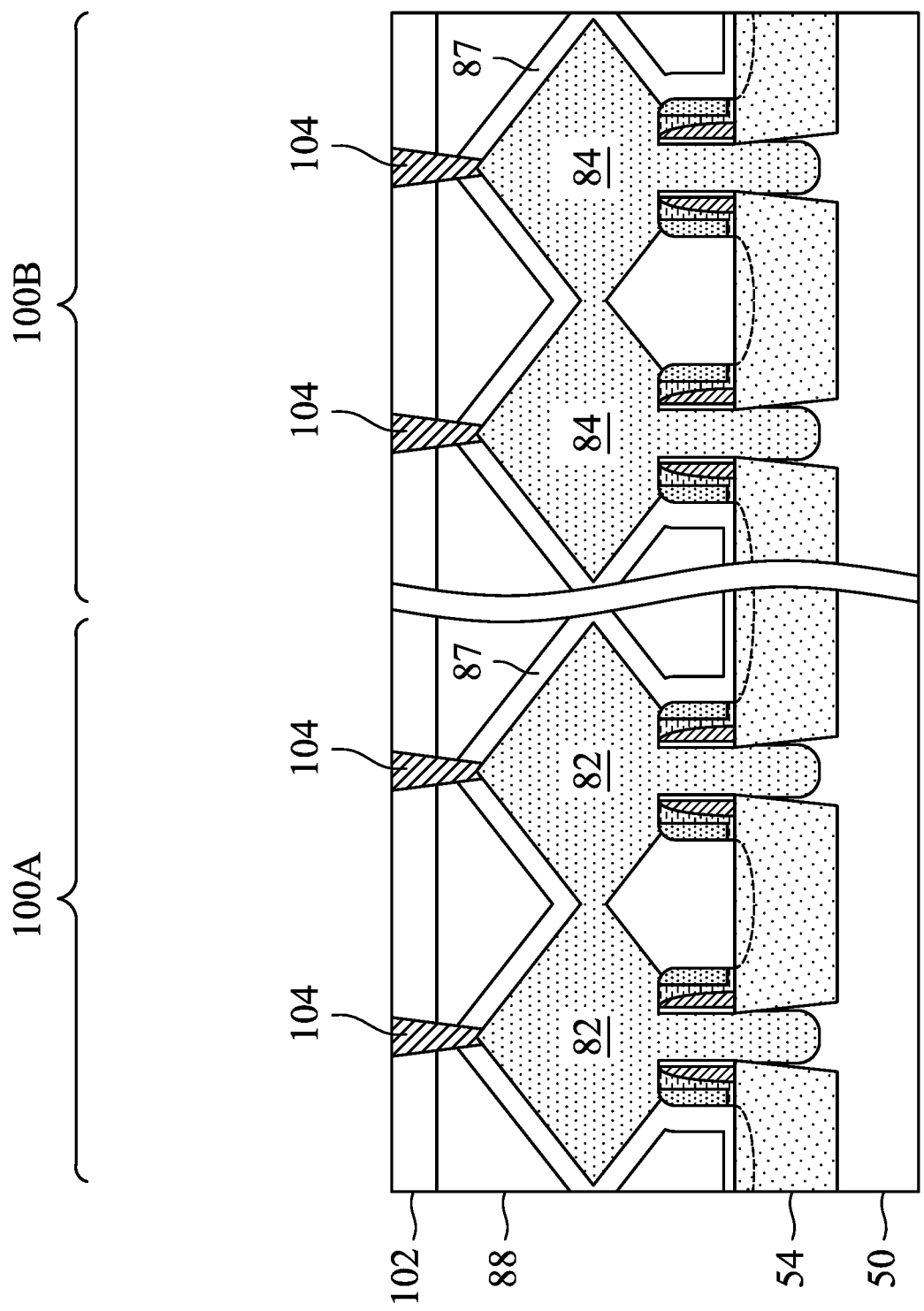
FIG. 22 is a cross-sectional view of an intermediate stage in the manufacture of a FinFET device having merged epitaxial regions in accordance with some embodiments.

In some embodiments, the epitaxial source/drain regions 82 in the first region 100A may be implanted with dopants, similar to the process previously discussed for forming the LDD regions 75/79, followed by an anneal (see FIGS. 8A, 8B, and 8C). The epitaxial source/drain regions 82 may have an impurity concentration of in a range from about $10^{19}$ cm$^{-3}$ to about $10^{21}$ cm$^{-3}$. The n-type impurities for source/drain regions in the first region 100A, e.g., the NMOS region, may be any of the n-type impurities previously discussed. In other embodiments, the material of the epitaxial source/drain regions 82 may be in situ doped during growth. In the illustrated embodiments, each of the source/drain regions 82 is physically separate from other source/drain regions 82. In other embodiments, two or more adjacent source/drain regions 82 may be merged. Such an embodiment is depicted in FIG. 22, such that two adjacent source/drain regions 82 are merged to form a common source/drain region. In some embodiments, more than two adjacent source/drain regions 82 may be merged.

Figure 17A:
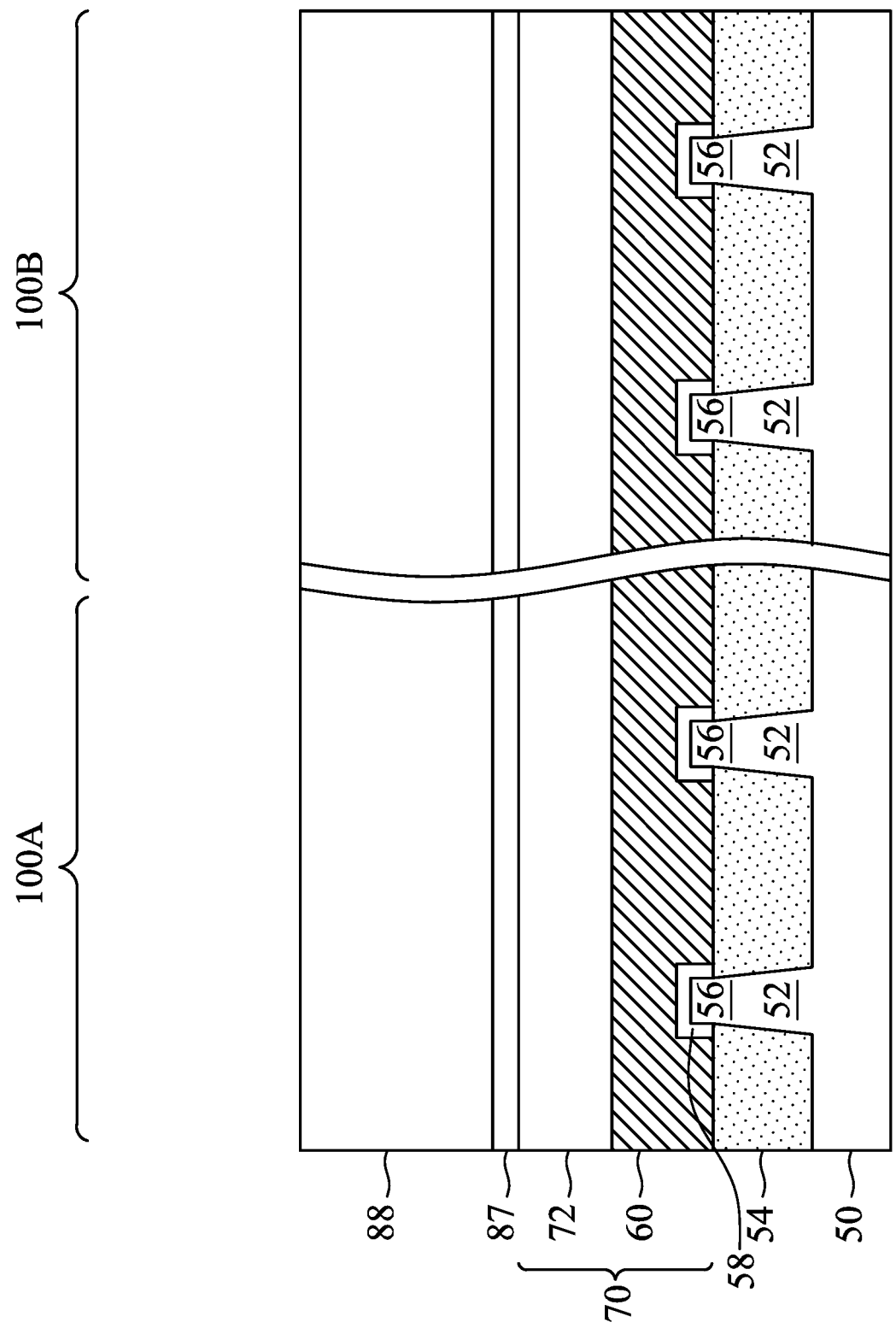
FIGS. 17A-17C are cross-sectional views of intermediate stages in the manufacture of a FinFET device in accordance with some embodiments.
Figure 17B:
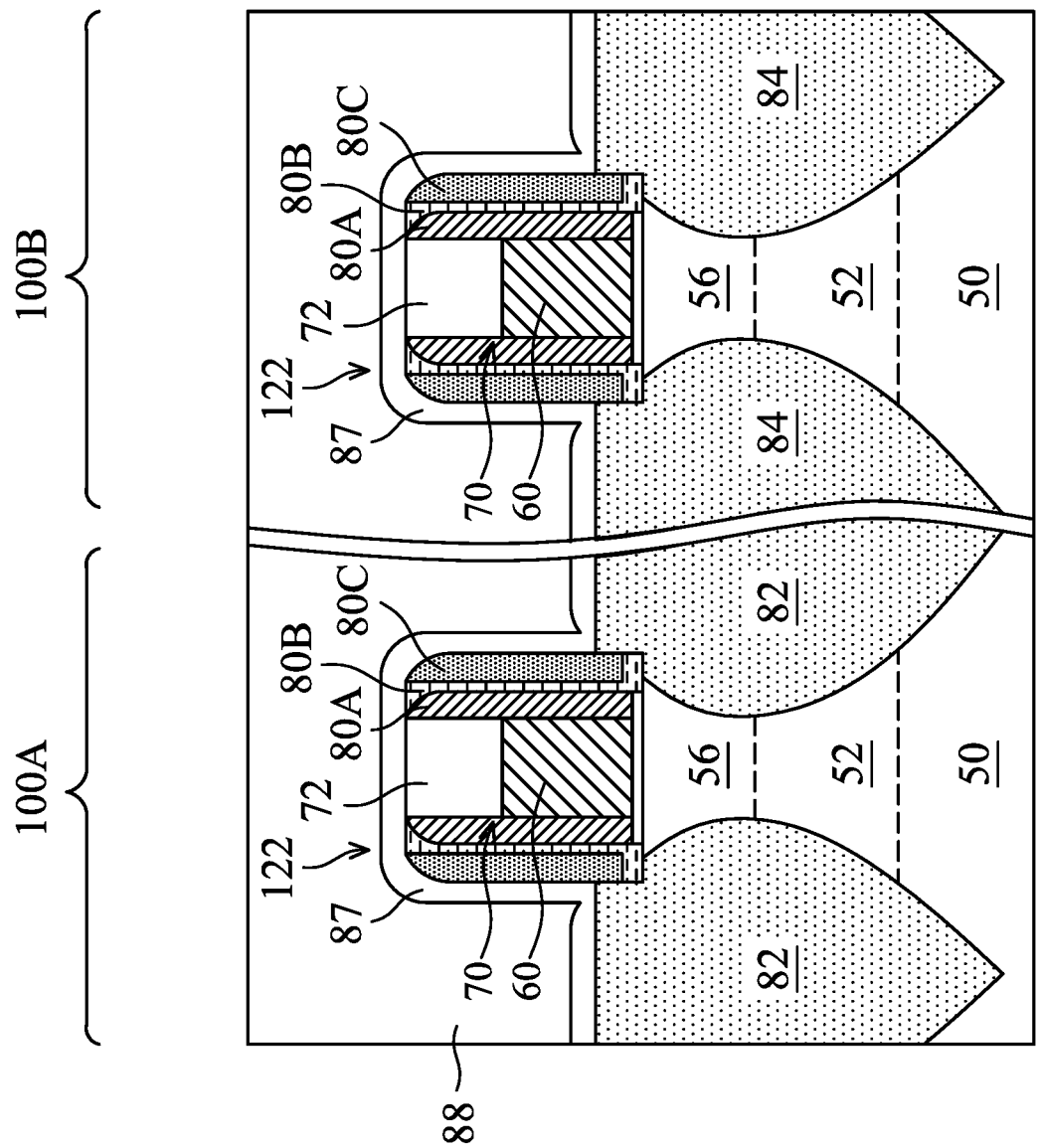
Figure 17C:
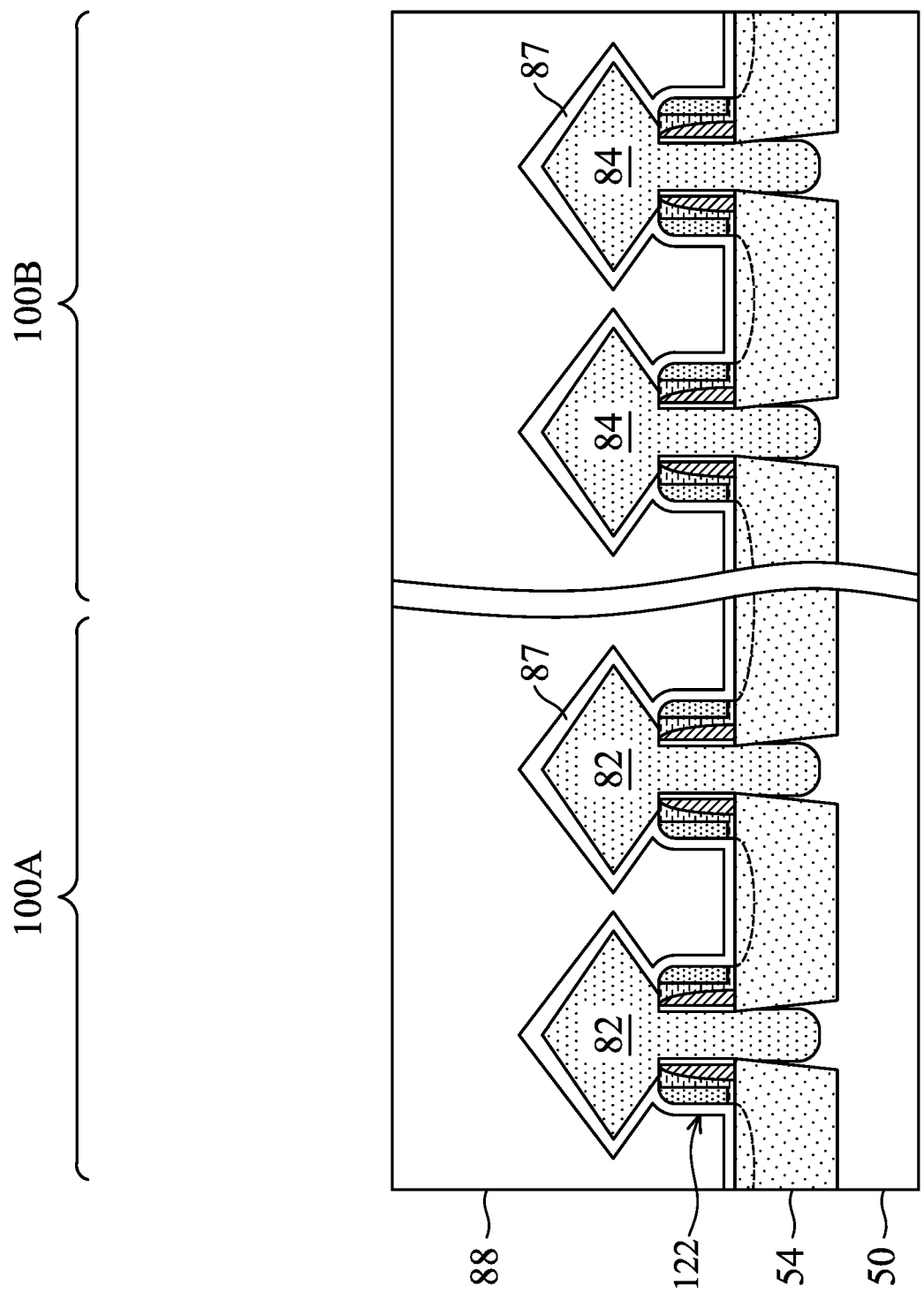

Referring to FIGS. 17A-C, after forming the epitaxial source/drain regions 82 in the first region 100A, the epitaxial source/drain regions 84 are formed in the second region 100B. In some embodiments, the epitaxial source/drain regions 84 are formed in the second region 100B using similar methods as the epitaxial source/drain regions 82 described above with reference to FIGS. 12 through 15C, and the detailed description is not repeated for the sake of brevity. In some embodiments, during the formation of the epitaxial source/drain regions 84 in the second region 100B, e.g., the PMOS region, the first region 100A, e.g., the NMOS region may be masked (not shown). Subsequently, the source/drain regions of the fins 56 in the second region 100B are etched to form recesses (shown as filled with the epitaxial source/drain regions 84 in FIGS. 17B-C) similar to the reshaped recesses 126 (see FIGS. 13-15C). For example, a first patterning process may be used to form a U-shaped recess similar to U-shaped recess 124 (see FIG. 12), and then a second patterning process may be performed to reshape the recess. The second patterning process may, for example, include a plasma etching process using H radicals or may include other techniques described previously. The reshaped recesses in the second region 100B may be formed using similar method as the reshaped recesses 126 in the first region 100A, described above with reference to FIGS. 12-15C, description is not repeated herein for the sake of brevity.

Next, the epitaxial source/drain regions 84 in the second region 100B are epitaxially grown in the recesses using MOCVD, MBE, LPE, VPE, SEG, a combination thereof, or the like. In some embodiments, the epitaxial source/drain regions 84 are grown in the same process chamber in which the second patterning process is performed. In some cases, a cleaning process may be performed on the fins 56 prior to forming the epitaxial source/drain regions 84, such a dry cleaning process (e.g., an ashing process), a wet cleaning process (e.g., using Caro's Strip or HF), the like, or a combination. The epitaxial source/drain regions may 84 may be a single layer or include two or more layers of materials. The epitaxial source/drain regions 84 may include any acceptable material, such as any material that is appropriate for p-type FinFETs. For example, if the fin 56 is silicon, the epitaxial source/drain regions 84 may comprise SiGe, SiGeB, Ge, GeSn, the like, or a combination. Different layers of an epitaxial source/drain region 84 may be different materials or may be the same material, and may be grown in separate steps. For example, a first epitaxial layer may be deposited first within the recesses, then a second epitaxial layer may be deposited over the first epitaxial layer, then a third epitaxial layer may be deposited over the second epitaxial layer. In some embodiments, a first epitaxial layer may include a material such as silicon, SiGe, SiGe:B, the like, or a combination. The first epitaxial layer may be undoped or doped. For example, in some embodiments the first epitaxial layer may be SiGe having an atomic percent of Ge that is between about 1% and about 25%, or may be a material doped with boron in a concentration between about $5\times10^{19}$ cm$^{-3}$ and about $1\times10^{20}$ cm$^{-3}$, though other dopants or concentrations may be used. In some embodiments, the first epitaxial layer may be formed having a thickness between about 5 nm and about 20 nm. In some embodiments, a first epitaxial layer may include a stressor material that imparts stress on a channel region of the fins 56. For example, the stress may be a compressive stress for p-type FinFETs. In some embodiments, a second epitaxial layer may include a material such as silicon, SiGe, SiGe:B, the like, or a combination. The second epitaxial layer may be undoped or doped. For example, in some embodiments the second epitaxial layer may be SiGe having an atomic percent of Ge that is between about 25% and about 55%, or may be a material doped with boron in a concentration between about $1\times10^{20}$ cm$^{-3}$ and about $2\times10^{21}$ cm$^{-3}$, though other dopants or concentrations may be used. In some embodiments, the second epitaxial layer may be formed having a thickness between about 20 nm and about 60 nm. In some embodiments, a third epitaxial layer may include a material such as silicon, SiGe, SiGe:B, the like, or a combination. The second epitaxial layer may be undoped or doped. For example, in some embodiments the second epitaxial layer may be SiGe having an atomic percent of Ge that is between about 45% and about 60%, or may be a material doped with boron in a concentration between about $5\times10^{20}$ cm$^{-3}$ and about $2\times10^{21}$ cm$^{-3}$, though other dopants or concentrations may be used. In some embodiments, the second epitaxial layer may be formed having a thickness between about 10 nm and about 20 nm. The epitaxial source/drain regions 84 may have surfaces raised from respective surfaces of the fins 56 and may have facets. In the second region 100B, epitaxial source/drain regions 84 are formed in the fins 56 such that each dummy structure 70 is disposed between respective neighboring pairs of the epitaxial source/drain regions 84. In some embodiments epitaxial source/drain regions 84 may extend past the fins 56 and into the semiconductor strips 52.

The material of the epitaxial source/drain regions 84 in the second region 100B may be implanted with dopants, similar to the process previously discussed for forming the LDD regions 79, followed by an anneal (see FIGS. 8A, 8B, and 8C). The source/drain regions 84 may have an impurity concentration in a range from about $10^{19}$ cm$^{-3}$ to about $10^{21}$ cm$^{-3}$. The p-type impurities for the source/drain regions 84 in the second region 100B, e.g., the PMOS region, may be any of the p-type impurities previously discussed. In other embodiments, the epitaxial source/drain regions 84 may be in situ doped during growth. Portions of the epitaxial source/drain regions 82 and 84 may have curved sidewalls or substantially straight sidewalls according to the shape of the corresponding reshaped recess. In the illustrated embodiments, each of the source/drain regions 84 is physically separate from other source/drain regions 84. In other embodiments, two or more adjacent source/drain regions 84 may be merged. Such an embodiment is depicted in FIG. 22, such that two adjacent source/drain regions 84 are merged to form a common source/drain region. In some embodiments, more than two adjacent source/drain regions 84 may be merged.

Referring further to FIGS. 17A-C, an etch stop layer 87 and an interlayer dielectric (ILD) 88 are deposited over the dummy structures 70, and over the source/drain regions 82 and 84. In an embodiment, the ILD 88 is a flowable film formed by a flowable CVD. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, PECVD, a combination thereof, or the like. In some embodiments, the etch stop layer 87 is used as a stop layer while patterning the ILD 88 to form openings for subsequently formed contacts. Accordingly, a material for the etch stop layer 87 may be chosen such that the material of the etch stop layer 87 has a lower etch rate than the material of ILD 88.

Figure 18A:
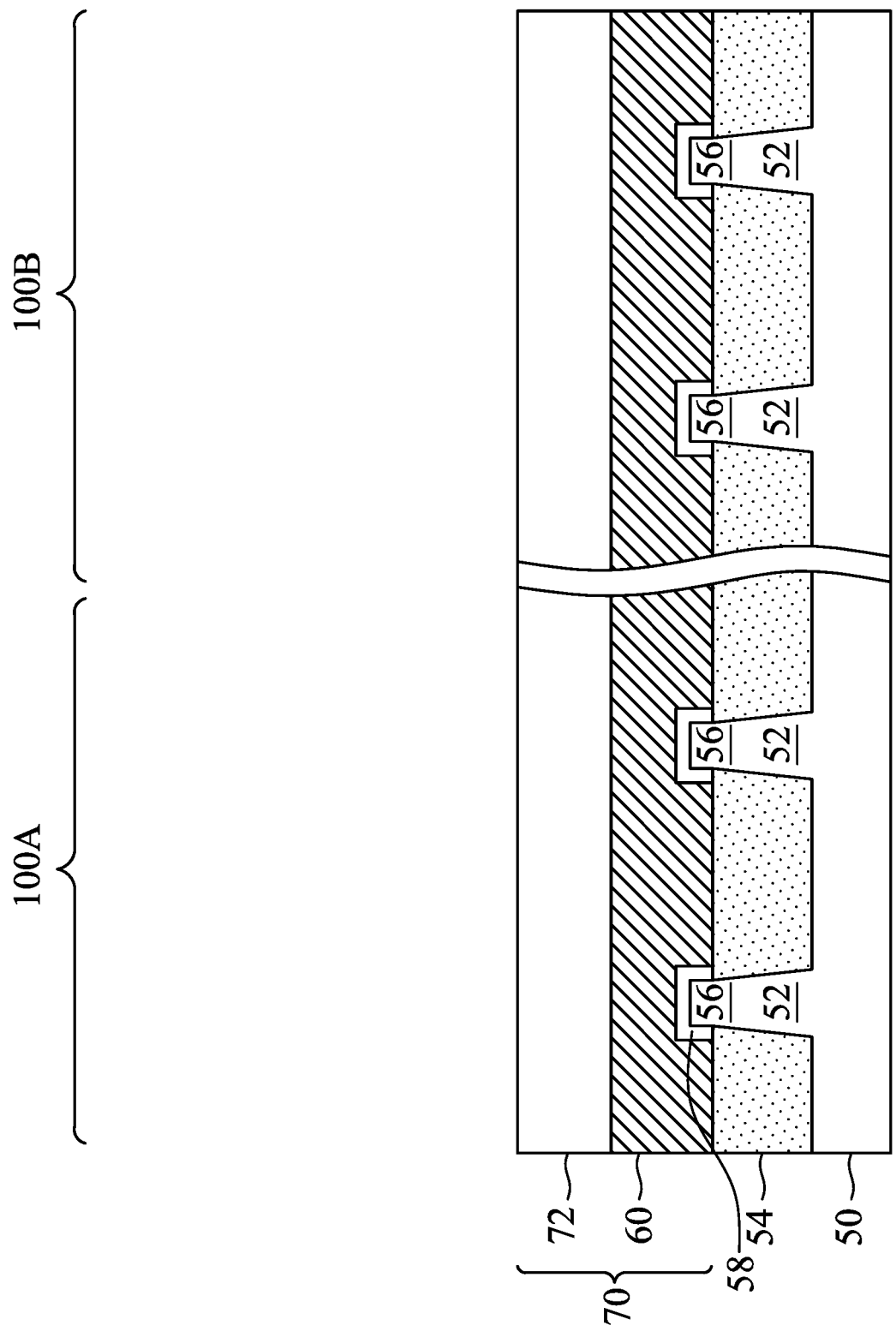
FIGS. 18A-18C are cross-sectional views of intermediate stages in the manufacture of a FinFET device in accordance with some embodiments.
Figure 18B:
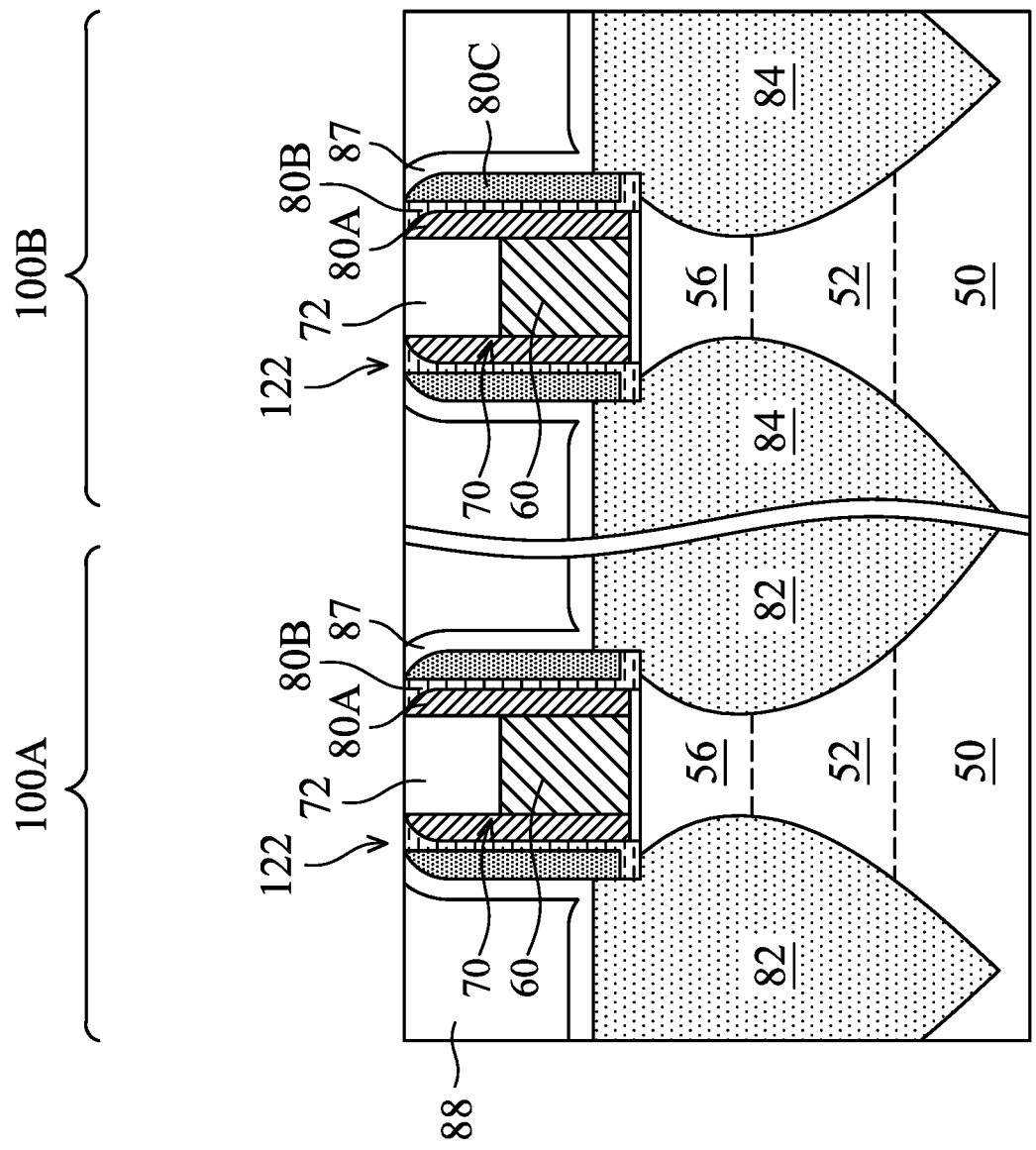
Figure 18C:
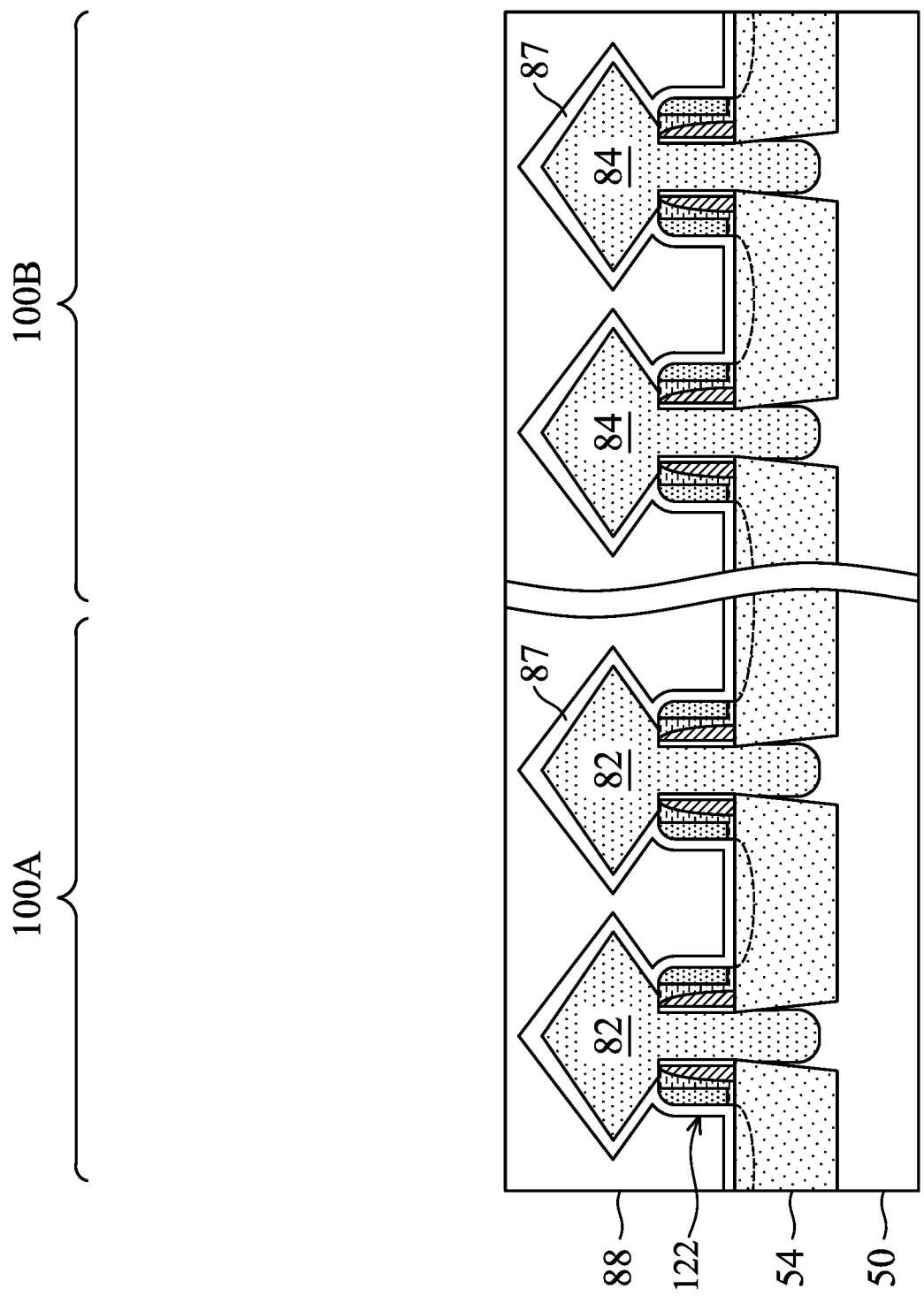

Referring to FIGS. 18A-C, a planarization process, such as a CMP process, may be performed to level the top surface of ILD 88 with the top surfaces of the dummy structures 70. After the planarization process, top surfaces of the dummy structures 70 are exposed through the ILD 88. In some embodiments, the CMP may also remove the mask 72, or portions thereof, on the dummy structures 70.

Figure 19A:
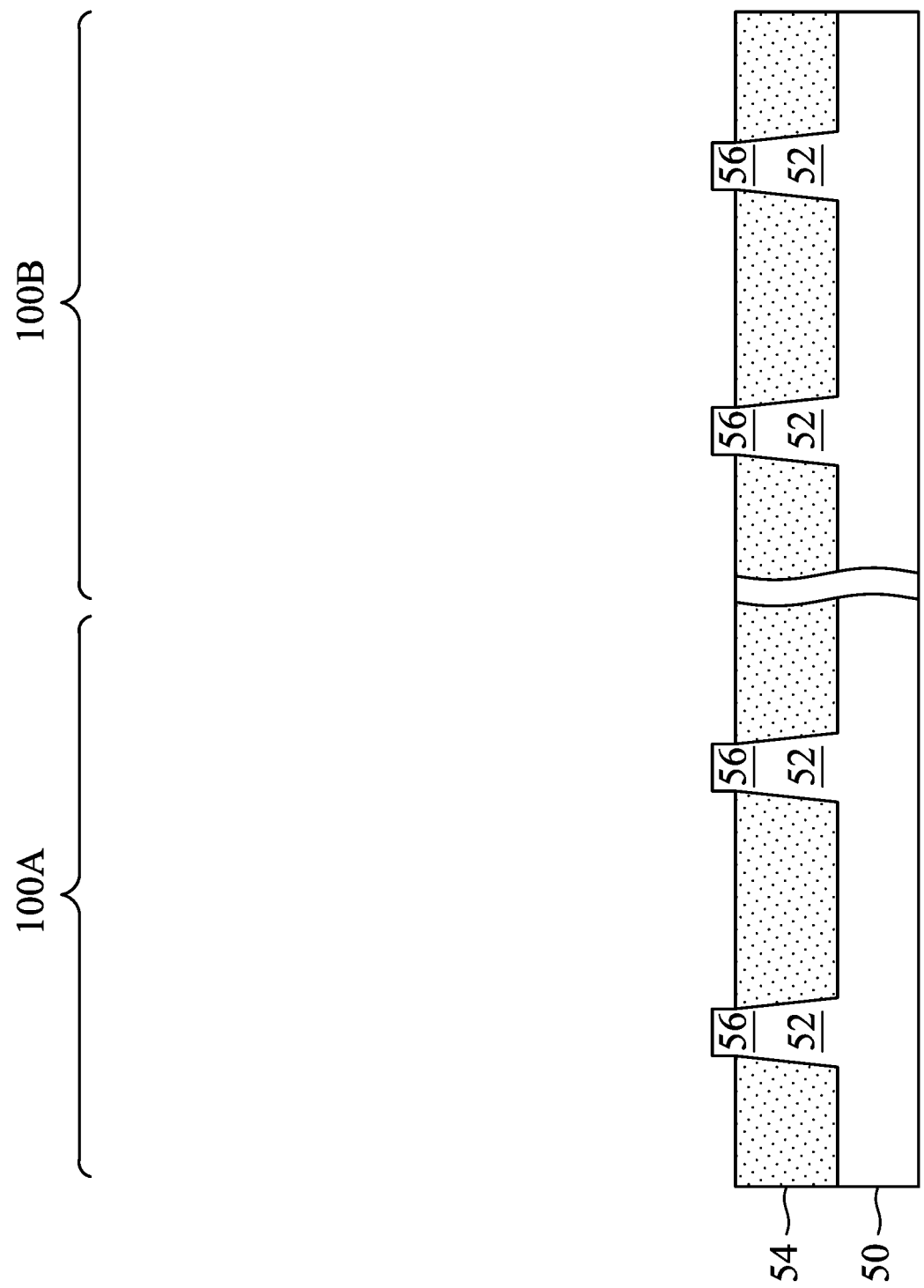
FIGS. 19A-19C are cross-sectional views of intermediate stages in the manufacture of a FinFET device in accordance with some embodiments.
Figure 19B:
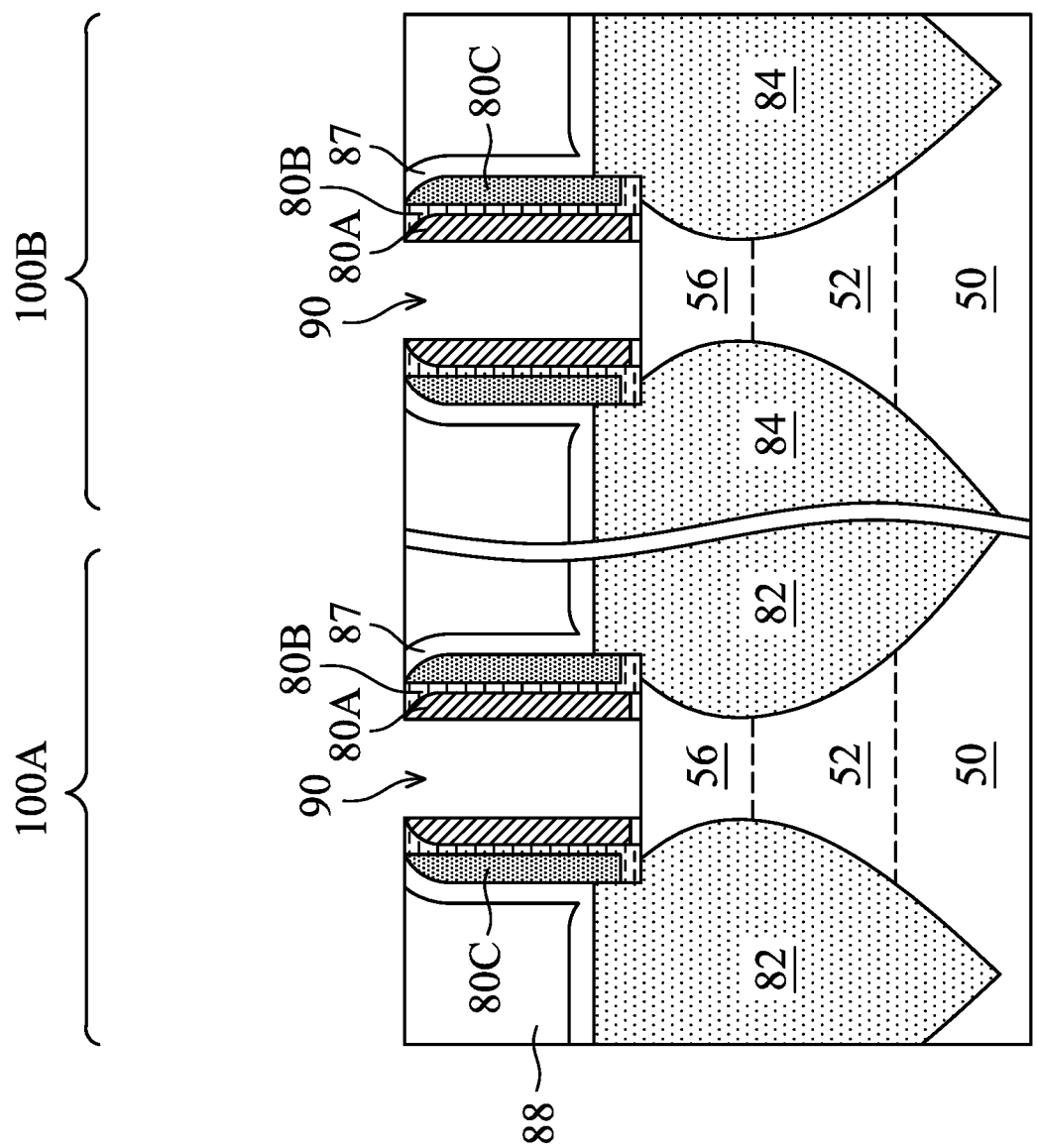
Figure 19C:
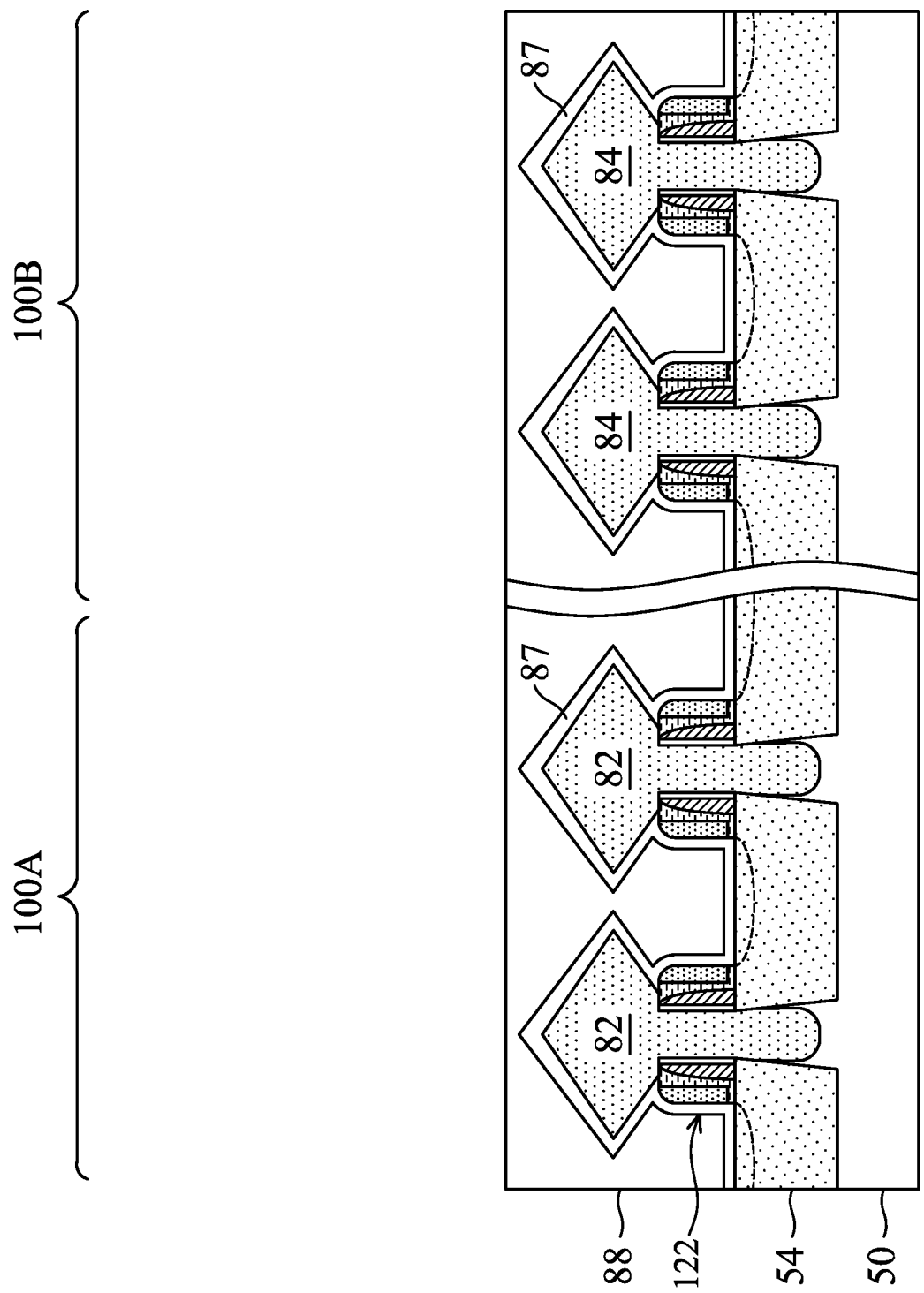

Referring to FIGS. 19A-C, remaining portions of mask 72 and the dummy structures 70 are removed in an etching step(s), so that recesses 90 are formed. Each of the recesses 90 exposes a channel region of a respective fin 56. Each channel region is disposed between neighboring pairs of the epitaxial source/drain regions 82 in the first region 100A or between neighboring pairs of the epitaxial source/drain regions 84 in the second region 100B. During the removal, the dummy dielectric layer 58 may be used as an etch stop layer when the dummy structures 70 are etched. The dummy dielectric layer 58 may then be removed after the removal of the dummy structures 70.

Figure 20A:
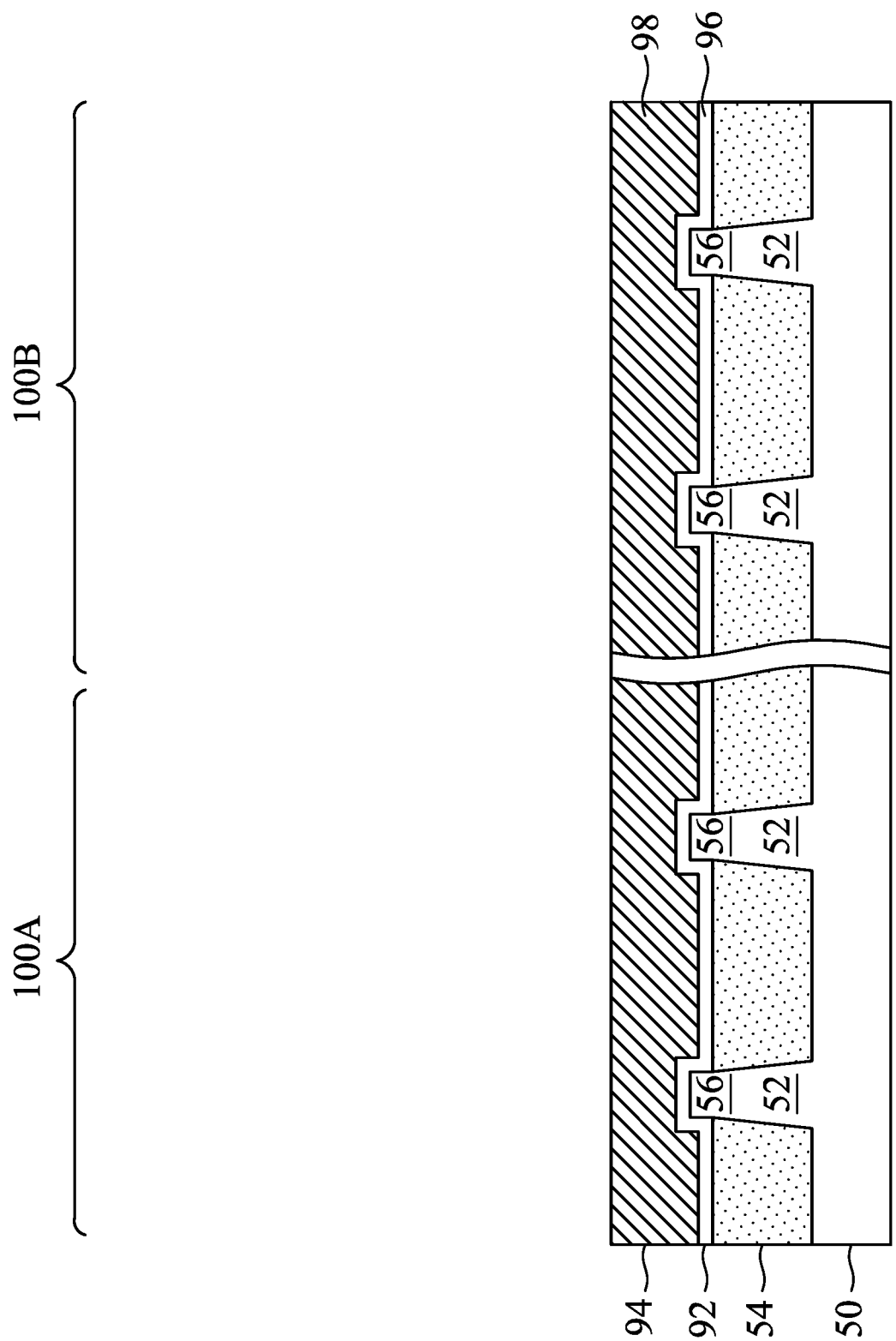
FIGS. 20A-20C are cross-sectional views of intermediate stages in the manufacture of a FinFET device in accordance with some embodiments.
Figure 20B:
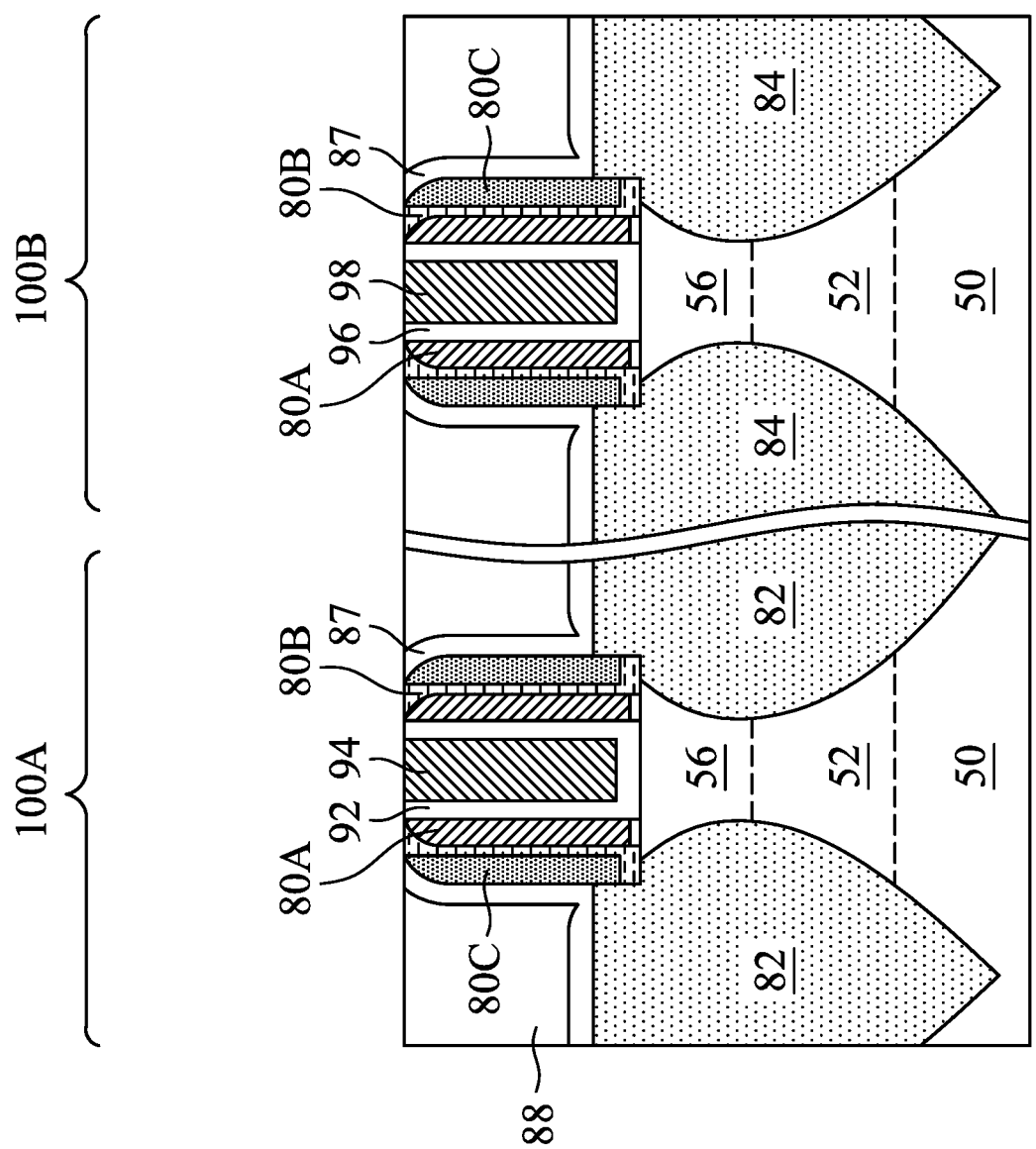
Figure 20C:
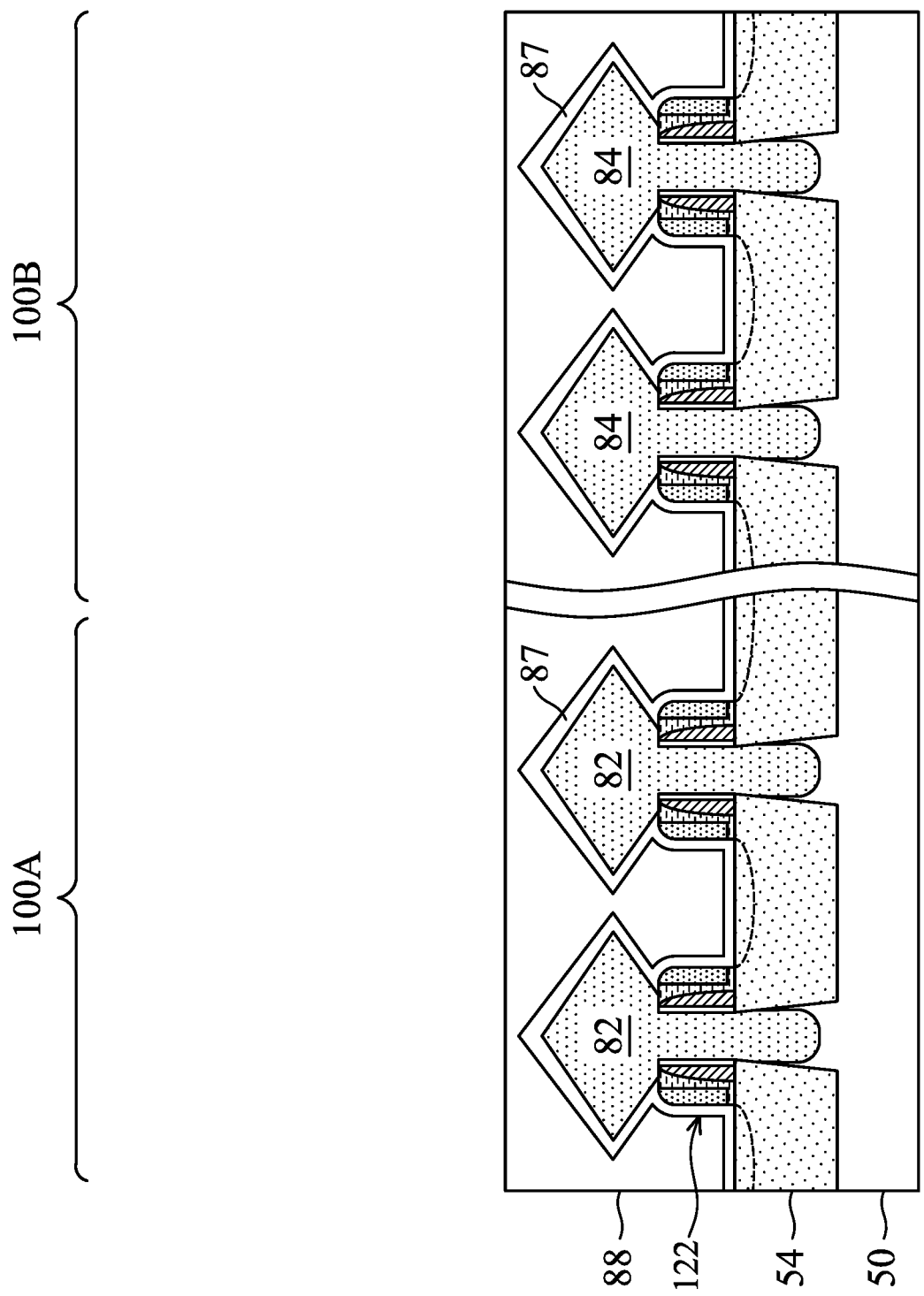

Referring to FIGS. 20A-C, gate dielectric layers 92 and 96, and gate electrodes 94 and 98 are formed for replacement gates in the first region 100A and the second region 100B, respectively. The gate dielectric layers 92 and 96 are deposited conformally in the recesses 90, such as on the top surfaces and the sidewalls of the fins 56, on sidewalls of the gate spacers 122 and fin spacers 130, respectively, and on a top surface of the ILD 88. In some embodiments, the gate dielectric layers 92 and 96 include silicon oxide, silicon nitride, or multilayers thereof. In other embodiments, the gate dielectric layers 92 and 96 include a high-k dielectric material, and in these embodiments, the gate dielectric layers 92 and 96 may have a k value greater than about 7.0, and may include a metal oxide or a silicate of Hf, Al, Zr, La, Mg, Ba, Ti, Pb, and combinations thereof. The formation methods of the gate dielectric layers 92 and 96 may include Molecular-Beam Deposition (MBD), ALD, PECVD, a combination thereof, or the like.

Next, the gate electrodes 94 and 98 are deposited over the gate dielectric layers 92 and 96, respectively, and fill the remaining portions of the recesses 90. The gate electrodes 94 and 98 may be made of a metal-containing material such as TiN, TaN, TaC, Co, Ru, Al, Ag, Au, W, Ni, Ti, Cu, combinations thereof, or multi-layers thereof. After the filling of the gate electrodes 94 and 98, a planarization process, such as a CMP process, may be performed to remove the excess portions of the gate dielectric layers 92 and 96, and the gate electrodes 94 and 98, which excess portions are over the top surface of ILD 88. The resulting remaining portions of material of the gate electrodes 94 and 98, and the gate dielectric layers 92 and 96 thus form replacement gates of the resulting FinFETs.

In some embodiments, the formation of the gate dielectric layers 92 and 96 may occur simultaneously such that the gate dielectric layers 92 and 96 are made of the same materials, and the formation of the gate electrodes 94 and 98 may occur simultaneously such that the gate electrodes 94 and 98 are made of the same materials. However, in other embodiments, the gate dielectric layers 92 and 96 may be formed by distinct processes, such that the gate dielectric layers 92 and 96 may be made of different materials, and the gate electrodes 94 and 98 may be formed by distinct processes, such that the gate electrodes 94 and 98 may be made of different materials. Various masking steps may be used to mask and expose appropriate regions when using distinct processes.

Figure 21A:
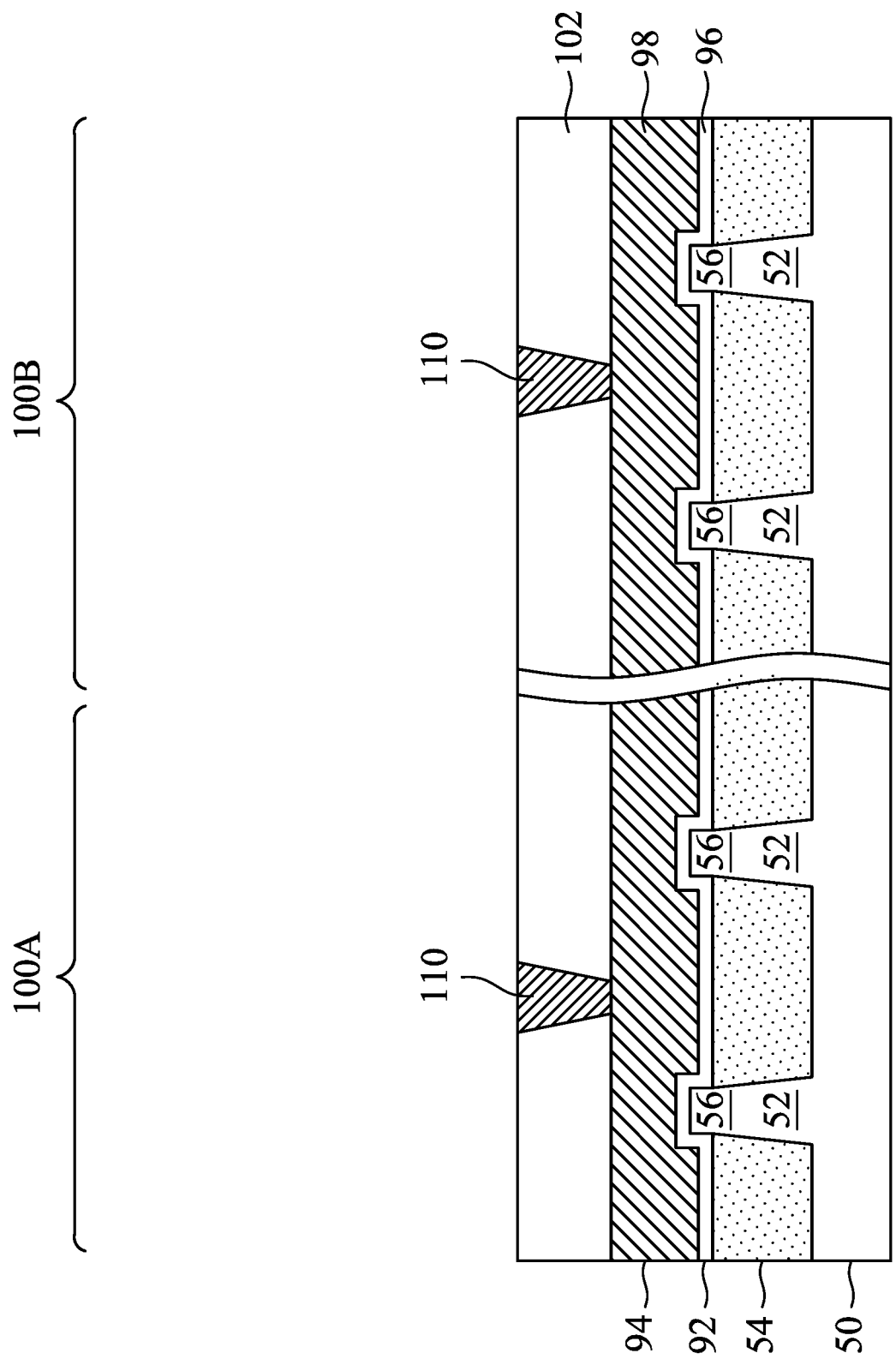
FIGS. 21A-21C are cross-sectional views of intermediate stages in the manufacture of a FinFET device in accordance with some embodiments.
Figure 21B:
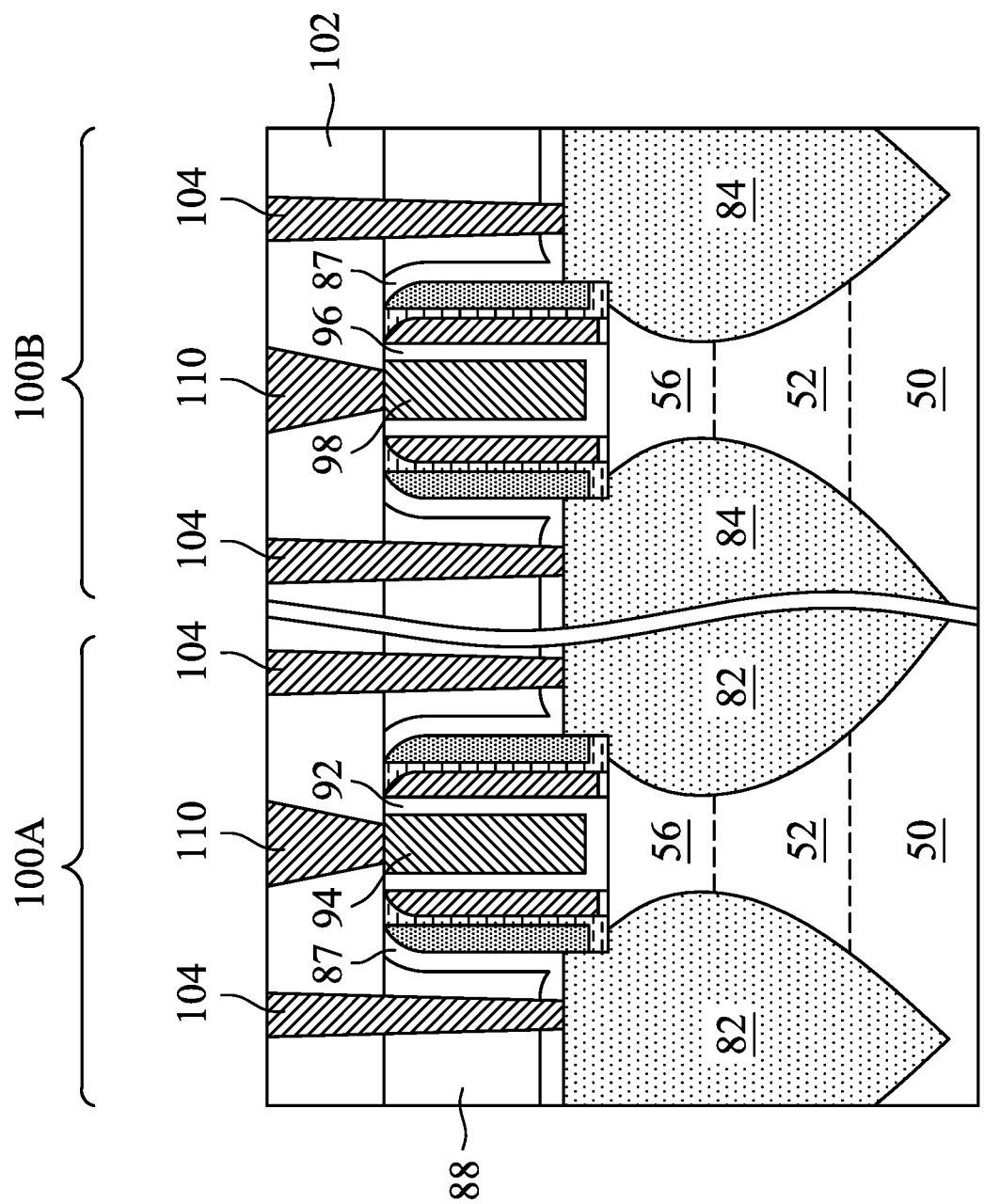
Figure 21C:
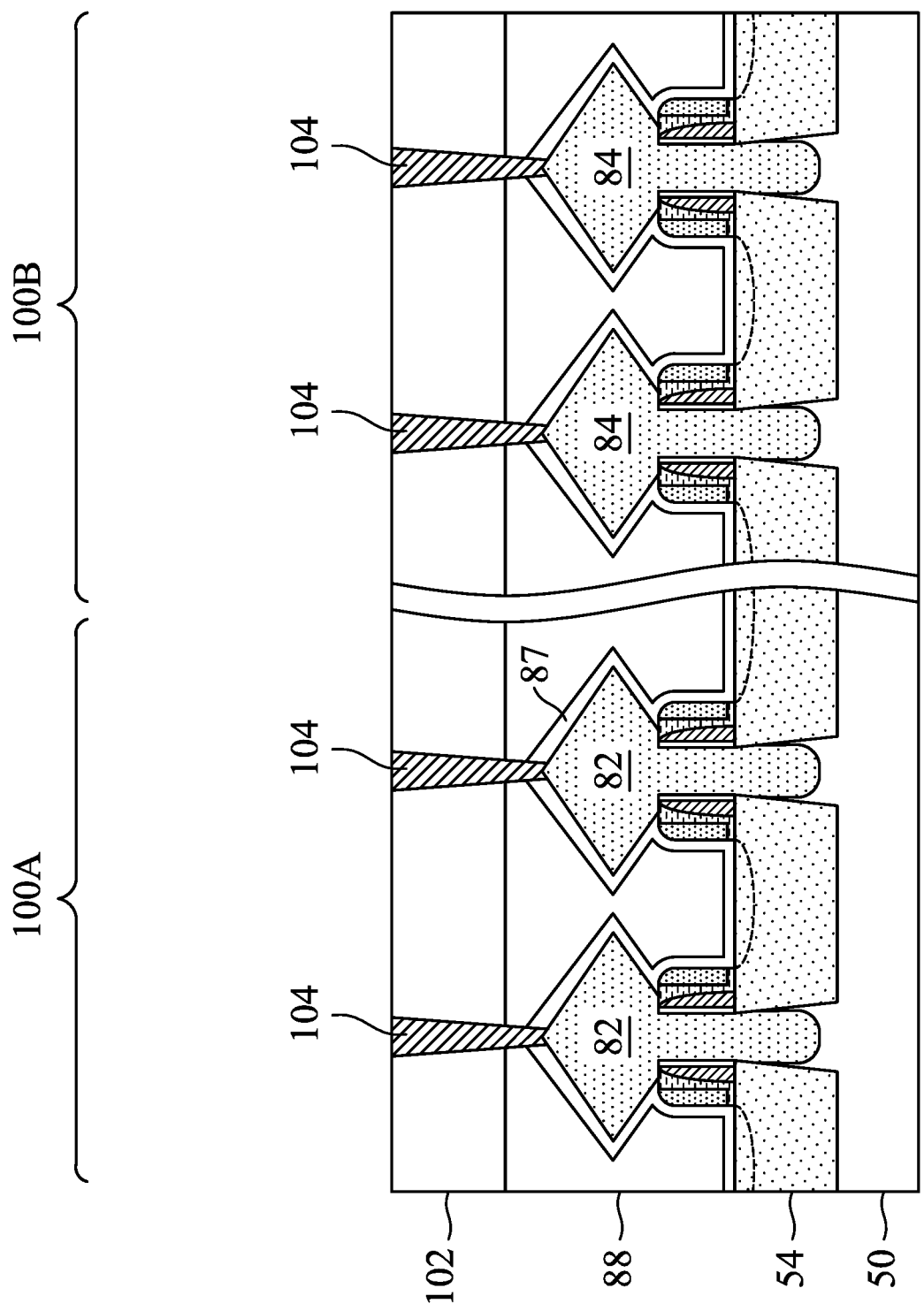

Referring to FIGS. 21A-C, an ILD 102 is deposited over the ILD 88, contacts 104 are formed through the ILD 102 and the ILD 88, and contacts 110 are formed through the ILD 102. In an embodiment, the ILD 102 is formed using similar materials and methods as ILD 88, described above with reference to FIGS. 17A-C, and the description is not repeated herein for the sake of brevity. In some embodiments, the ILD 102 and the ILD 88 are formed of a same material. In other embodiments, the ILD 102 and the ILD 88 are formed of different materials.

Openings for the contacts 104 are formed through the ILDs 88 and 102, and the etch stop layer 87. Openings for the contacts 110 are formed through the ILD 102 and the etch stop layer 87. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess materials from a top surface of the ILD 102. The remaining liner and conductive material form contacts 104 and 110 in the openings. An anneal process may be performed to form a silicide (not shown) at the interface between the epitaxial source/drain regions 82 and 84 and the contacts 104, respectively. The contacts 104 are physically and electrically coupled to the epitaxial source/drain regions 82 and 84, and the contacts 110 are physically and electrically coupled to the gate electrodes 94 and 98. While the contacts 104 are depicted in FIG. 21B in a same cross-section as the contacts 110, this depiction is for purposes of illustration and in some embodiments the contacts 104 are disposed in different cross-sections from contacts 110.

FIG. 22 illustrates a cross-sectional view of a FinFET device that is similar to the FinFET device illustrated in FIGS. 21A-C, with like elements labeled with like numerical references. FIG. 22 is illustrated along the reference cross-section B-B illustrated in FIG. 1. In some embodiments, the FinFET device of FIG. 22 may be formed using similar materials and methods and FinFET device of FIGS. 21A-C, described above with reference to FIGS. 1-21C, and the description is not repeated herein for the sake of brevity. In the illustrated embodiment, two adjacent source/drain regions 82 and two adjacent source/drain regions 84 are merged to form respective common source/drain regions. In other embodiments, more than two adjacent source/drain regions 82 and more than two adjacent source/drain regions 84 may be merged.

Figure 23:
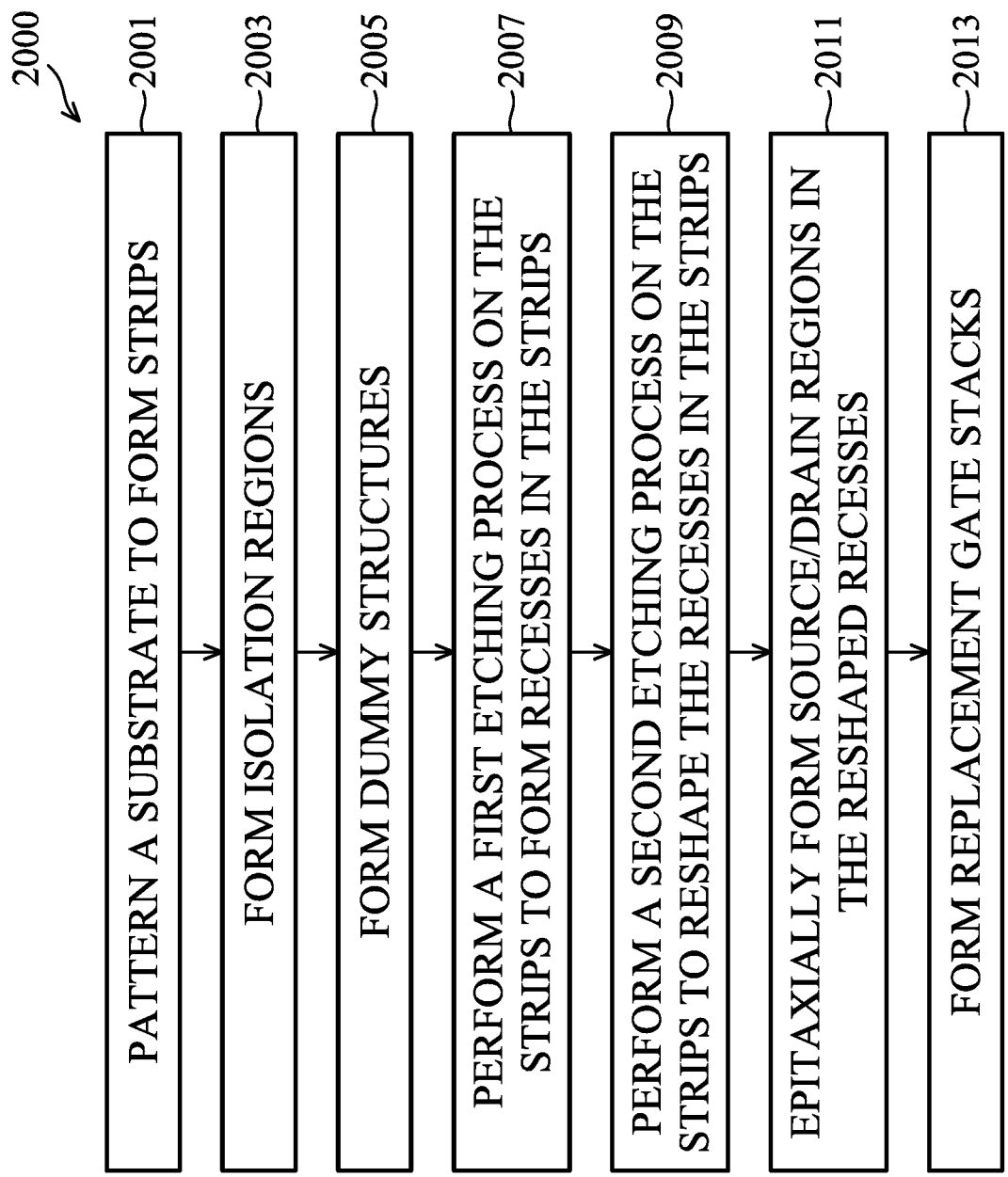
FIG. 23 is a flow diagram illustrating a method of forming a FinFET device using a reshaped recess in accordance with some embodiments.

FIG. 23 is a flow diagram illustrating a method of forming a FinFET device in accordance with some embodiments. The method 2000 starts with step 2001, where a substrate (such as the substrate 50 illustrated in FIG. 2A) is patterned to form strips (such as the semiconductor strips 52 illustrated in FIG. 3A) as described above with reference to FIGS. 2A and 3A. In step 2003, isolation regions (such as the isolation regions 54 illustrated in FIG. 5A) are formed between adjacent strips as described above with reference to FIGS. 4A and 5A. In step 2005, dummy structures (such as the dummy structures 70 illustrated in FIGS. 7A-B) are formed over the strips as described above with reference to FIGS. 6A-B and FIGS. 7A-7C. In step 2007, a first etching process is performed on the strips to form recesses (such as the recesses 124 in the strips as described above with reference to FIG. 12). In step 2009, a second etching process is performed on the strips to form reshaped recesses (such as the recesses 126 in the strips as described above with reference to FIGS. 13-15C). In step 2011, source/drain regions (such as the epitaxial source/drain regions 82 illustrated in FIGS. 16B-C) are epitaxially grown in the reshaped recesses. In some embodiments, steps 2007, 2009, and 2011 are performed on strips disposed in a first region of the substrate where n-type devices are formed. In such embodiments, steps 2007, 2009, and 2011 may be repeated to be performed on strips disposed in a second region of the substrate where p-type devices are formed as described above with reference to FIGS. 17A-C. In step 2013, replacement gate stacks (such as the gate dielectric layers 92/the gate electrodes 94 and the gate dielectric layers 96/the gate electrodes 98 illustrated in FIGS. 20A-C) are formed over the strips.

Various embodiments discussed herein allow for improved FinFET performance. For example, the use of H radicals during an etching process to reshape recesses between fins may have advantages. By using H radicals during the etching process, the bottom of the reshaped recess may be formed having a tapered shape or having a pointed bottom. In this manner, the bottom proximity of the reshaped recess may be increased, as the pointed bottom of the reshaped recess may be farther from neighboring fins. In this manner, the bottom proximity of a recess with a pointed bottom as described herein may be larger than recesses formed having U-shaped or more horizontal bottom surface. In some cases, a larger bottom proximity reduces the chance of dopants within the epitaxial source/drain regions diffusing into or under the channel of a FinFET. The diffusion of dopants into or under the channel can reduce device performance. In some cases, the use of techniques described herein can also reduce Drain-Induced Barrier Lowering (DIBL) effects or decrease off-state leakage. By controlling the etching parameters, the etching of the reshaped recess can be controlled to produce a desired shape of the reshaped recess (some examples are shown in FIGS. 13-15C). In this manner, the top proximity, middle proximity, or bottom proximity of the reshaped recess may be also controlled. The techniques described herein are described with reference to FinFETs, but may be used in forming other devices, such as planar FETs, semiconductor lasers or other optical devices, or other types of devices.

According to an embodiment, a method includes forming a fin over a substrate, forming an isolation region adjacent the fin, forming a dummy structure over the fin, recessing the fin adjacent the dummy structure to form a first recess using a first etching process, reshaping the first recess to form a reshaped first recess using a second etching process, wherein the bottom of the reshaped first recess is defined by an intersection of a crystalline plane of a first sidewall surface and a crystalline plane of a second sidewall surface, wherein the first sidewall surface faces the second sidewall surface, and epitaxially growing a source/drain region in the reshaped first recess. In an embodiment, the second etching process selectively etches crystalline planes having a first crystalline orientation over second crystalline planes having a second crystalline orientation, wherein the crystalline plane of the first sidewall surface has the first crystalline orientation, and wherein the first sidewall surface includes a second crystalline plane having the second crystalline orientation. In an embodiment, the second crystalline planes have a (111) crystalline orientation. In an embodiment, the second etching process includes a plasma etching process using hydrogen radicals. In an embodiment, the second etching process further includes forming an argon plasma. In an embodiment, a first lateral distance between the bottom of the first recess and an adjacent dummy structure is less than a second lateral distance between the bottom of the reshaped first recess and the neighboring dummy structure. In an embodiment, epitaxially growing a source/drain region in the reshaped first recess includes epitaxially growing a first semiconductor material in the reshaped first recess, wherein the first semiconductor material covers the bottom of the reshaped first recess, and epitaxially growing a second semiconductor material over the first semiconductor material, the second semiconductor material having a different composition than the first semiconductor material, and epitaxially growing a third semiconductor material over the second semiconductor material, the third semiconductor material being different than the second semiconductor material.

According to another embodiment, a method includes patterning a substrate to form a strip, the strip including a first semiconductor material, forming an isolation region along a sidewall of the strip, an upper portion of the strip extending above a top surface of the isolation region, forming a dummy structure along sidewalls and a top surface of the upper portion of the strip, performing a first etching process on an exposed portion of the upper portion of the strip to form a first recess, the exposed portion of the strip being exposed by the dummy structure, after performing the first etching process, reshaping the first recess to have a V-shaped bottom surface using a second etching process, wherein the second etching process is selective to first crystalline planes having a first orientation relative to second crystalline planes having a second orientation, and epitaxially growing a source/drain region in the reshaped first recess. In an embodiment, the second etching process has a slower etch rate than the first etching process. In an embodiment, the V-shaped bottom surface includes intersecting (111) crystalline planes. In an embodiment, the first etching process includes a first plasma etching process using a first etching gas, and the second etching process includes a second plasma etching process using a second etching gas different from the first etching gas. In an embodiment, the second etching gas includes H2. In an embodiment, after performing the second etching process, an uppermost surface of the first recess is along third crystalline planes having the second orientation. In an embodiment, epitaxially growing a source/drain region includes epitaxially growing a first material, epitaxially growing a second material, and epitaxially growing a third material, wherein the first material, the second material, and the third material are all different materials. In an embodiment, the method further includes forming spacers along sidewalls of the dummy structure, wherein after performing the second etching process, portions of the first semiconductor material that adjacent to a bottom surface of the spacers are not removed by the second etching process.

According to another embodiment, device includes a fin over a substrate, wherein a first sidewall surface at the bottom of the fin is along crystalline planes of a first crystalline orientation, an isolation region adjacent the fin, a gate structure along sidewalls of the fin and over the top surface of the fin, a gate spacer laterally adjacent the gate structure, and an epitaxial region adjacent the fin, wherein a bottom portion of the epitaxial region tapers to a point. In an embodiment, the bottom portion of the epitaxial region tapers along crystalline planes of the first crystalline orientation. In an embodiment, the widest portion of the epitaxial region has a curved profile. In an embodiment, the widest portion of the epitaxial region is between a top surface of the epitaxial region and the bottom portion of the epitaxial region. In an embodiment, the epitaxial region includes a first material, a second material over the first material, and a third material over the second material, wherein the first material, the second material, and the third material are all materials having different compositions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a fin over a substrate;
    forming an isolation region adjacent the fin;
    forming a dummy structure over the fin;
    recessing the fin adjacent the dummy structure to form a first recess using a first etching process;
    reshaping the first recess to form a reshaped first recess using a second etching process, wherein the second etching process uses hydrogen radicals to form a bottom of the reshaped first recess defined by an intersection of a first sidewall surface of a first sidewall and a second sidewall surface of the second sidewall, wherein the first sidewall surface is a first crystalline plane and wherein the second sidewall surface is a second crystalline plane, wherein the first sidewall surface faces the second sidewall surface, wherein the first crystalline plane is a different plane than the second crystalline plane; and
    epitaxially growing a source/drain region in the reshaped first recess.

2. The method of claim 1, wherein the second etching process selectively etches crystalline planes having a first crystalline orientation over second crystalline planes having a second crystalline orientation, wherein the crystalline plane of the first sidewall surface has the first crystalline orientation, and wherein the first sidewall surface comprises a second crystalline plane having the second crystalline orientation.

3. The method of claim 2, wherein the second crystalline planes have a (111) crystalline orientation.

4. The method of claim 1, wherein the second etching process further comprises forming an argon plasma.

5. The method of claim 1, wherein a first lateral distance between the bottom of the first recess and an adjacent dummy structure is less than a second lateral distance between the bottom of the reshaped first recess and the adjacent dummy structure.

6. The method of claim 1, wherein epitaxially growing a source/drain region in the reshaped first recess comprises:
    epitaxially growing a first semiconductor material in the reshaped first recess, wherein the first semiconductor material covers the bottom of the reshaped first recess;
    after epitaxially growing the first semiconductor material, epitaxially growing a second semiconductor material over the first semiconductor material, the second semiconductor material having a different composition than the first semiconductor material; and
    after epitaxially growing the second semiconductor material, epitaxially growing a third semiconductor material over the second semiconductor material, the third semiconductor material being different than the second semiconductor material.

7. The method of claim 1, wherein after epitaxially growing the source/drain region, a remaining portion of the fin extends into the epitaxially grown source/drain region.

8. A method comprising:
    patterning a substrate to form a strip, the strip comprising a first semiconductor material;
    forming an isolation region along a sidewall of the strip, an upper portion of the strip extending above a top surface of the isolation region;
    forming a dummy structure along sidewalls and a top surface of the upper portion of the strip;
    performing a first etching process on an exposed portion of the upper portion of the strip to form a first recess, the exposed portion of the strip being exposed by the dummy structure;
    after performing the first etching process, reshaping the first recess to have a V-shaped bottom surface using a second etching process, wherein the second etching process uses hydrogen radicals and is selective to first crystalline planes having a first orientation relative to second crystalline planes having a second orientation, wherein the V-shaped bottom surface comprises intersecting sidewall surfaces, each of the sidewall surfaces being in (111) crystalline planes; and
    epitaxially growing a source/drain region in the reshaped first recess.

9. The method of claim 8, wherein the second etching process has a slower etch rate than the first etching process.

10. The method of claim 8, wherein the first etching process comprises a first plasma etching process using a first etching gas, and wherein the second etching process comprises a second plasma etching process using a second etching gas different from the first etching gas.

11. The method of claim 10, wherein the second etching gas comprises $H_2$.

12. The method of claim 10, wherein the second plasma etching process forms a plasma comprising hydrogen radicals.

13. The method of claim 8, wherein after performing the second etching process, an uppermost surface of the first recess is along third crystalline planes having the second orientation.

14. The method of claim 8, further comprising forming spacers along sidewalls of the dummy structure, wherein after performing the second etching process, the first semiconductor material adjacent to a bottom surface of the spacers are not removed by the second etching process.

15. The method of claim 8, wherein an entirety of upper portions from of each of the sidewall surfaces are curved, wherein the upper portions extend from a widest point of the reshaped first recess to an upper surface of the reshaped first recess.

16. A method comprising:
forming an isolation region along a sidewall of a semiconductor strip, an upper portion of the semiconductor strip extending above a top surface of the isolation region;

forming a dummy structure along sidewalls and a top surface of the upper portion of the semiconductor strip;

performing a first etching process on an exposed portion of the upper portion of the semiconductor strip to form a first recess;

after performing the first etching process, performing a second etching process using hydrogen radicals to remove a semiconductor from a semiconductor layer, the second etching process reshaping the first recess to form a reshaped first recess forming a V between opposing sidewalls; and epitaxially growing a source/drain region in the reshaped first recess.

17. The method of claim 16, wherein surfaces of the opposing sidewalls comprise a (111) crystalline orientation.

18. The method of claim 16, wherein a width of the first recess is less than a width of the reshaped first recess.

19. The method of claim 16, wherein the reshaped first recess extends under the dummy structure.

20. The method of claim 19, wherein the first recess is laterally spaced apart from the dummy structure.

* * * * *